(12) United States Patent
Hung et al.

(10) Patent No.: US 11,742,004 B2
(45) Date of Patent: Aug. 29, 2023

(54) MEMORY SUPPORTING MULTIPLE TYPES OF OPERATIONS

(71) Applicant: MACRONIX INTERNATIONAL CO., LTD., Hsinchu (TW)

(72) Inventors: Shuo-Nan Hung, Zhubei (TW); Nai-Ping Kuo, Hsinchu (TW); Chien-Hsin Liu, Tainan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/535,021

(22) Filed: Nov. 24, 2021

(65) Prior Publication Data

US 2023/0162763 A1    May 25, 2023

(51) Int. Cl.
*G11C 7/10*    (2006.01)

(52) U.S. Cl.
CPC ............ *G11C 7/1063* (2013.01); *G11C 7/109* (2013.01); *G11C 7/1069* (2013.01); *G11C 7/1096* (2013.01)

(58) Field of Classification Search
CPC ..... G11C 7/1063; G11C 7/1069; G11C 7/109; G11C 7/06
See application file for complete search history.

(56) References Cited

U.S. PATENT DOCUMENTS

| 2010/0199025 A1* | 8/2010 | Nanjou | G06F 12/0246 |
| | | | 711/158 |
| 2013/0128675 A1* | 5/2013 | Kim | G11C 7/1063 |
| | | | 365/189.011 |
| 2021/0294529 A1* | 9/2021 | Minato | G06F 3/0629 |
| 2021/0305268 A1* | 9/2021 | Sato | G11C 16/0483 |

* cited by examiner

*Primary Examiner* — Han Yang
(74) *Attorney, Agent, or Firm* — Korbin S Van Dyke; Haynes Beffel & Wolfeld LLP

(57) ABSTRACT

A method of operating a memory comprising a plurality of memory planes is disclosed. Each memory plane includes at least one corresponding memory array. The method includes, for each memory plane of the plurality of memory planes, generating (i) a corresponding plane ready (PRDY) signal indicating a busy or a ready state of the corresponding memory plane, and (ii) a corresponding plane array ready (PARDY) signal indicating a busy or a ready state of the corresponding memory array of the corresponding memory plane, such that a plurality of PRDY signals and a plurality of PARDY signals are generated corresponding to the plurality of memory planes. Execution of a memory command for a memory plane of the plurality of memory planes is selectively allowed or denied, based on status of one or more of the plurality of PRDY signals and the plurality of PARDY signals.

20 Claims, 39 Drawing Sheets

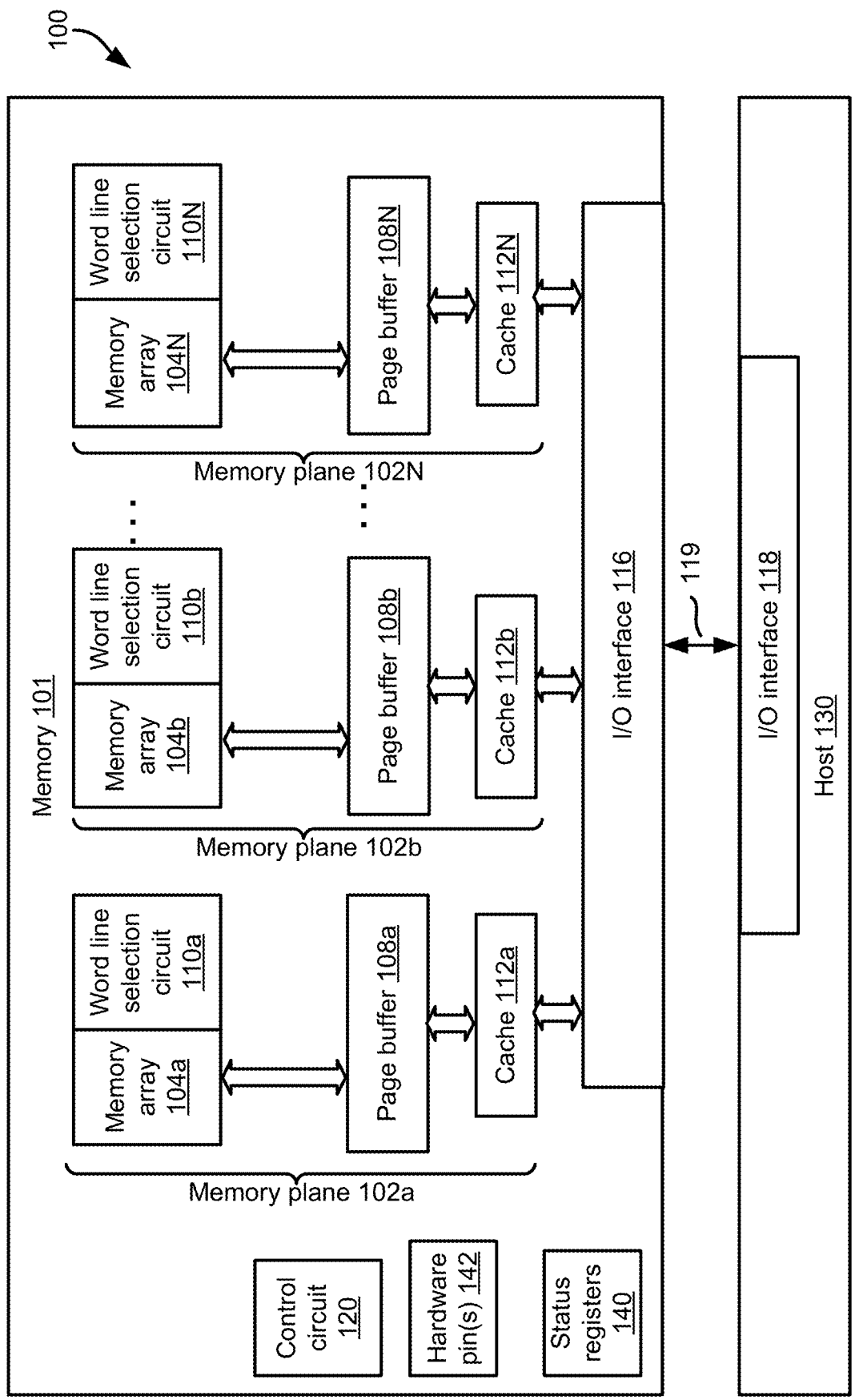

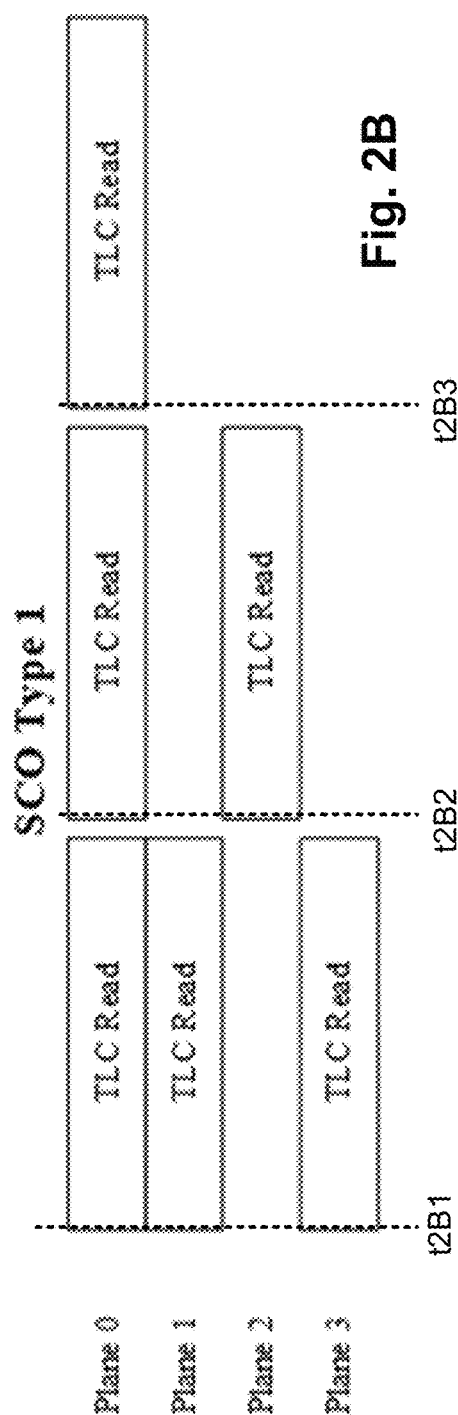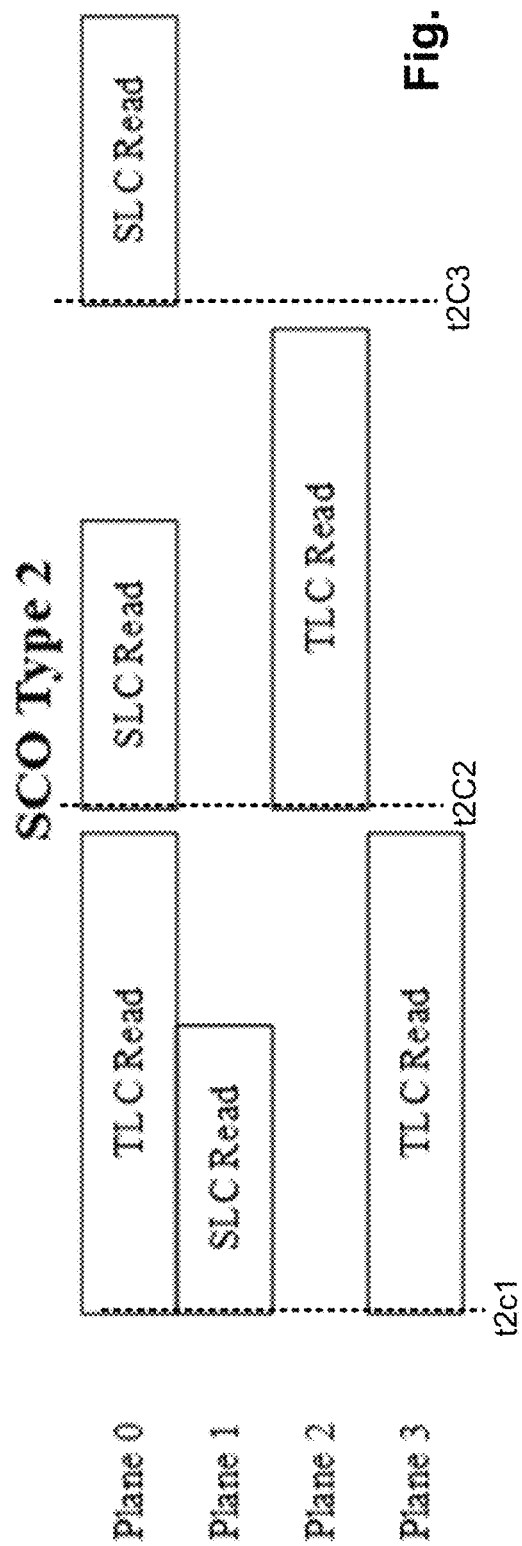

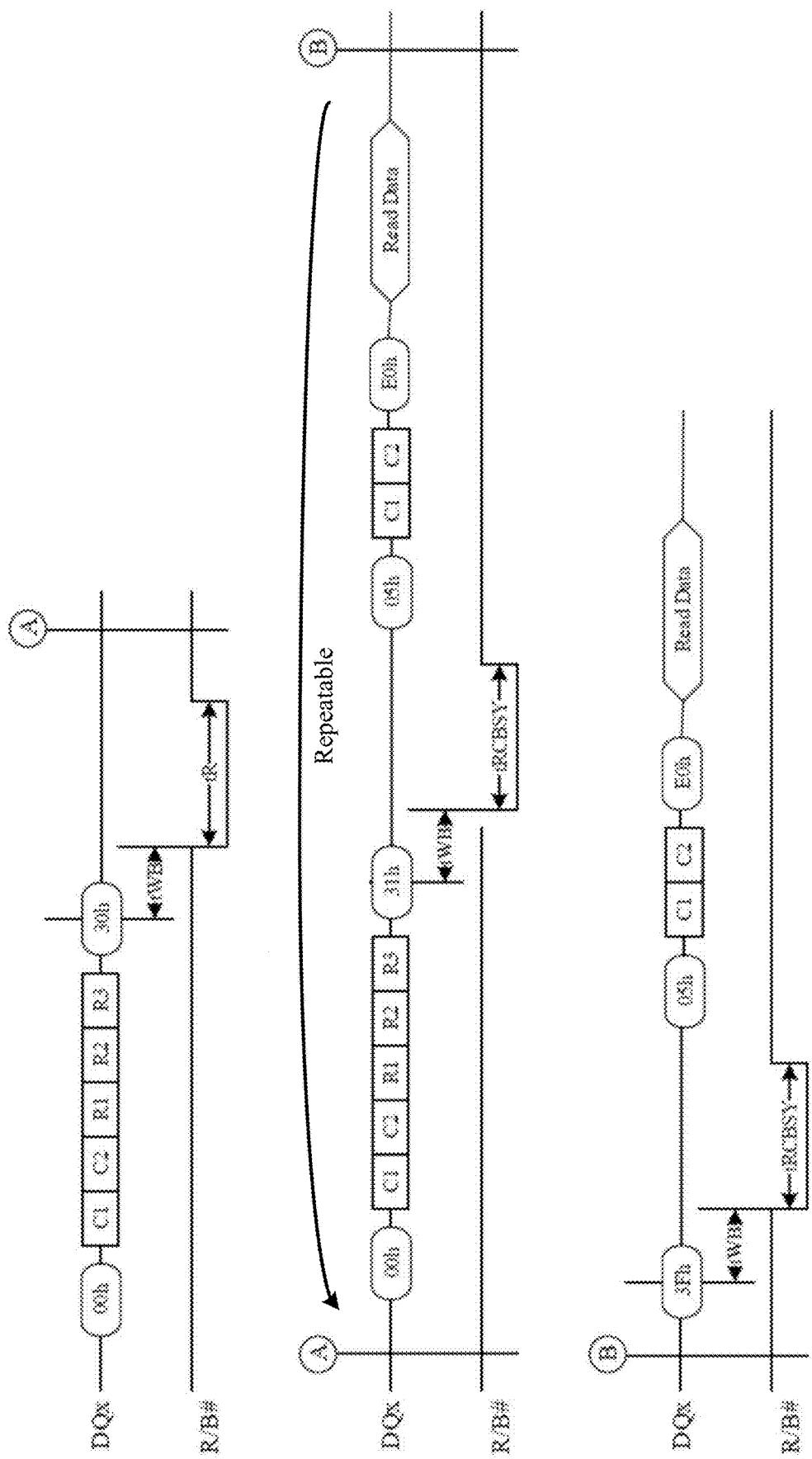
Fig. 3C1

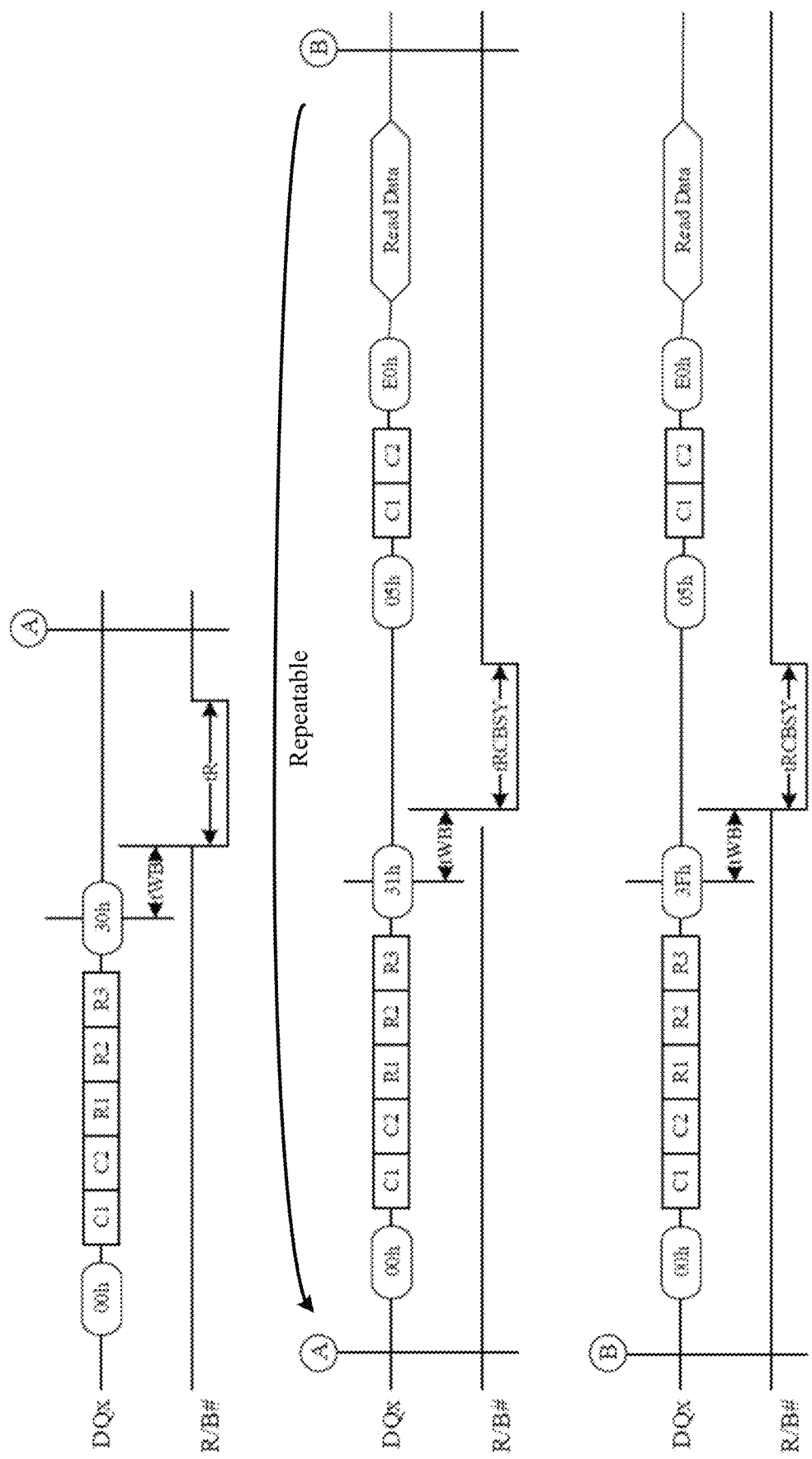
Fig. 3C2

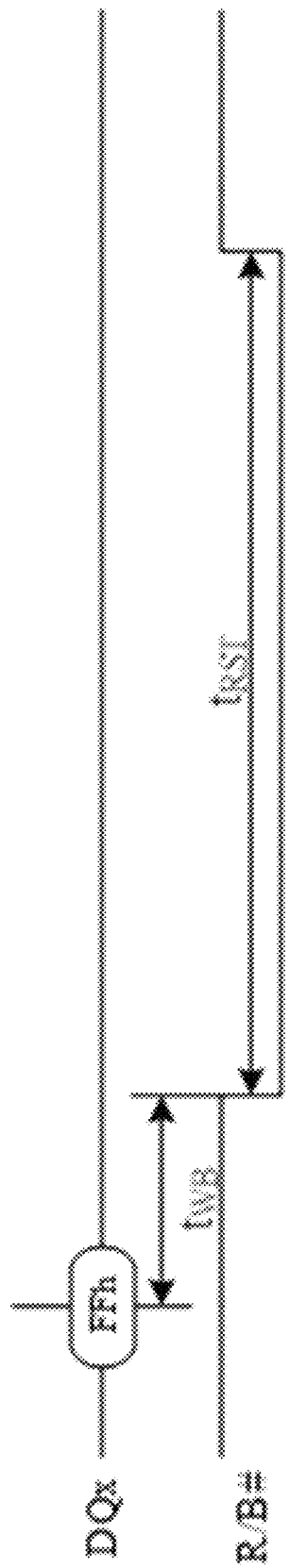
Fig. 3D1
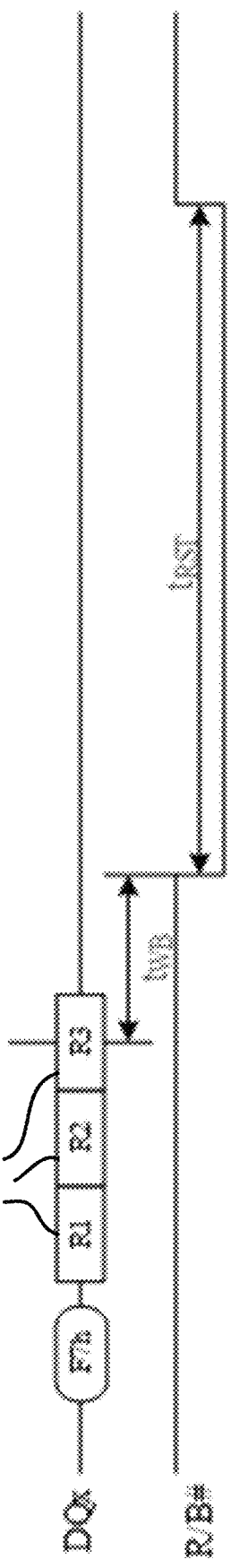
Fig. 3D2

Table 1190

| ON-GOING OPERATION IN MEMORY 101 | SELECTED PLANE STATUS | | COMMAND CAN BE ISSUED TO THE SELECTED PLANE | | |
|---|---|---|---|---|---|
| | PxRDY | PxARDY | SCO | AIPO | SYSTEM MGMT |
| NO | 1 | 1 | YES | YES | YES |
| AIPO | 1 | 1 | NO | YES | YES |
| | 0 | 0 | NO | NO | YES |
| | 1 | 0 | NO | SELECTED | YES |
| SCO | 1 | 1 | NO SUCH CASE | | |
| | 0 | 0 | NO | NO | YES |
| | 1 | 0 | SELECTED | SELECTED | YES |

Fig. 11D

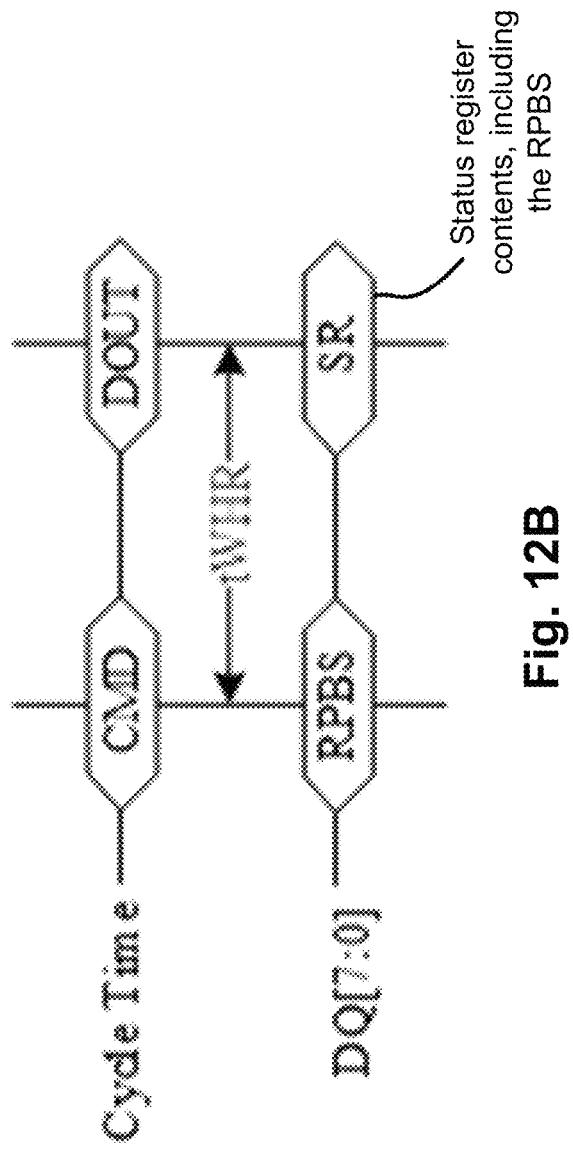

Read status enhanced (RSE) command

| Bit | 7 | 6 | 5 | 4 | 3 | 2 | 1 | 0 |
|---|---|---|---|---|---|---|---|---|
| Status register | WP# | PxRDY | PxARDY | R | R | R | PxFAILC | PxFAIL |

Legend

PxFAIL: Plane x PASS/FAIL status for last command

PxFAILC: Plane x PASS/FAIL status for the command issued prior to last command

WP#: chip protection status bit (not plane related)

R: reserved

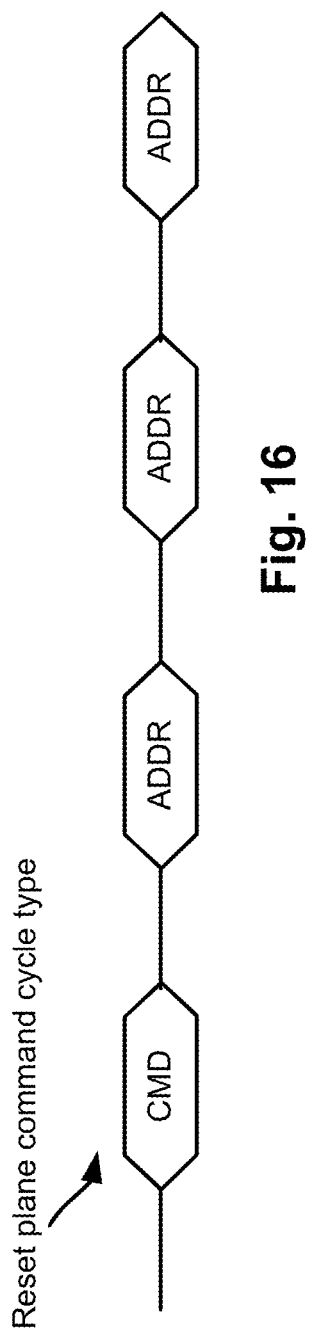

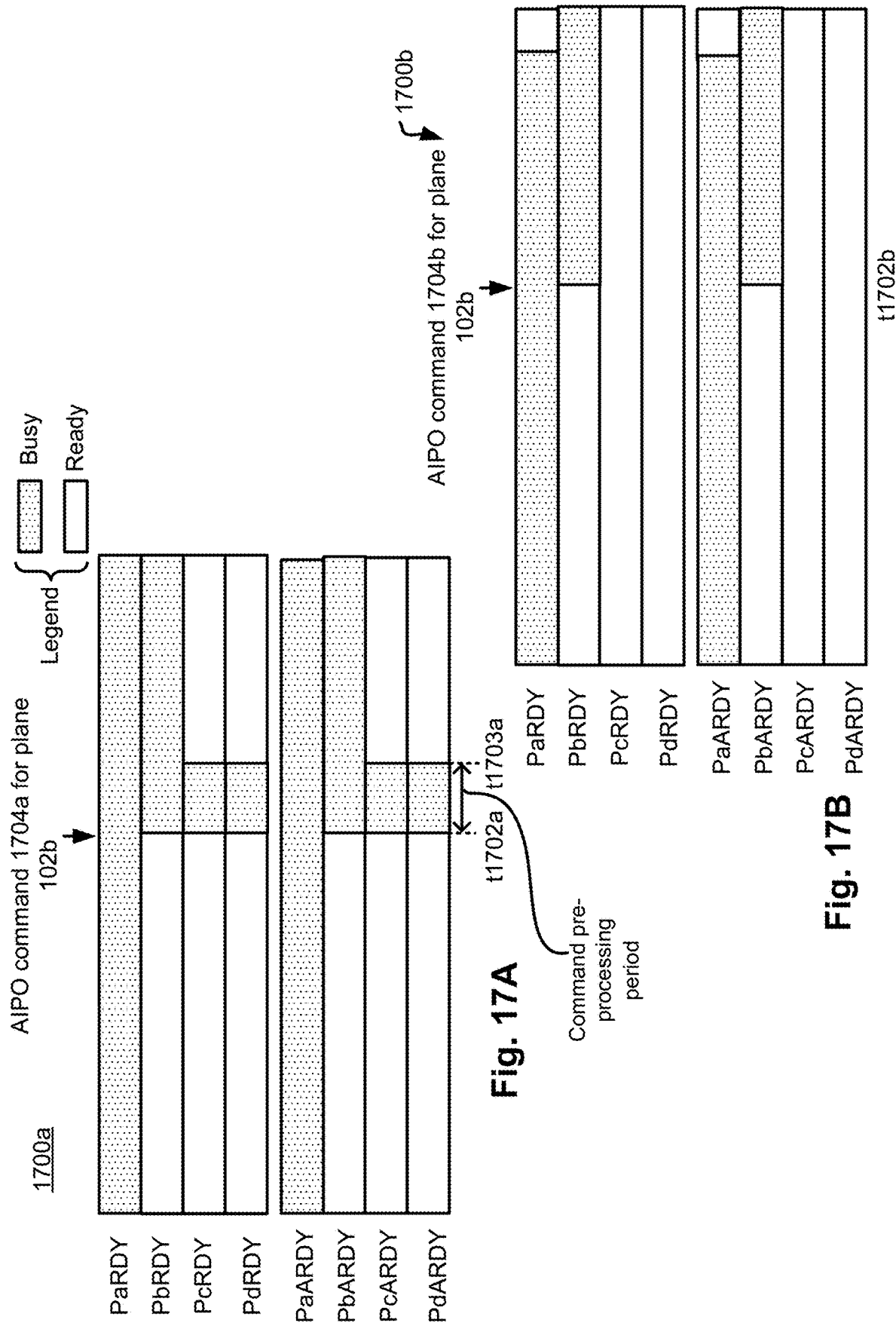

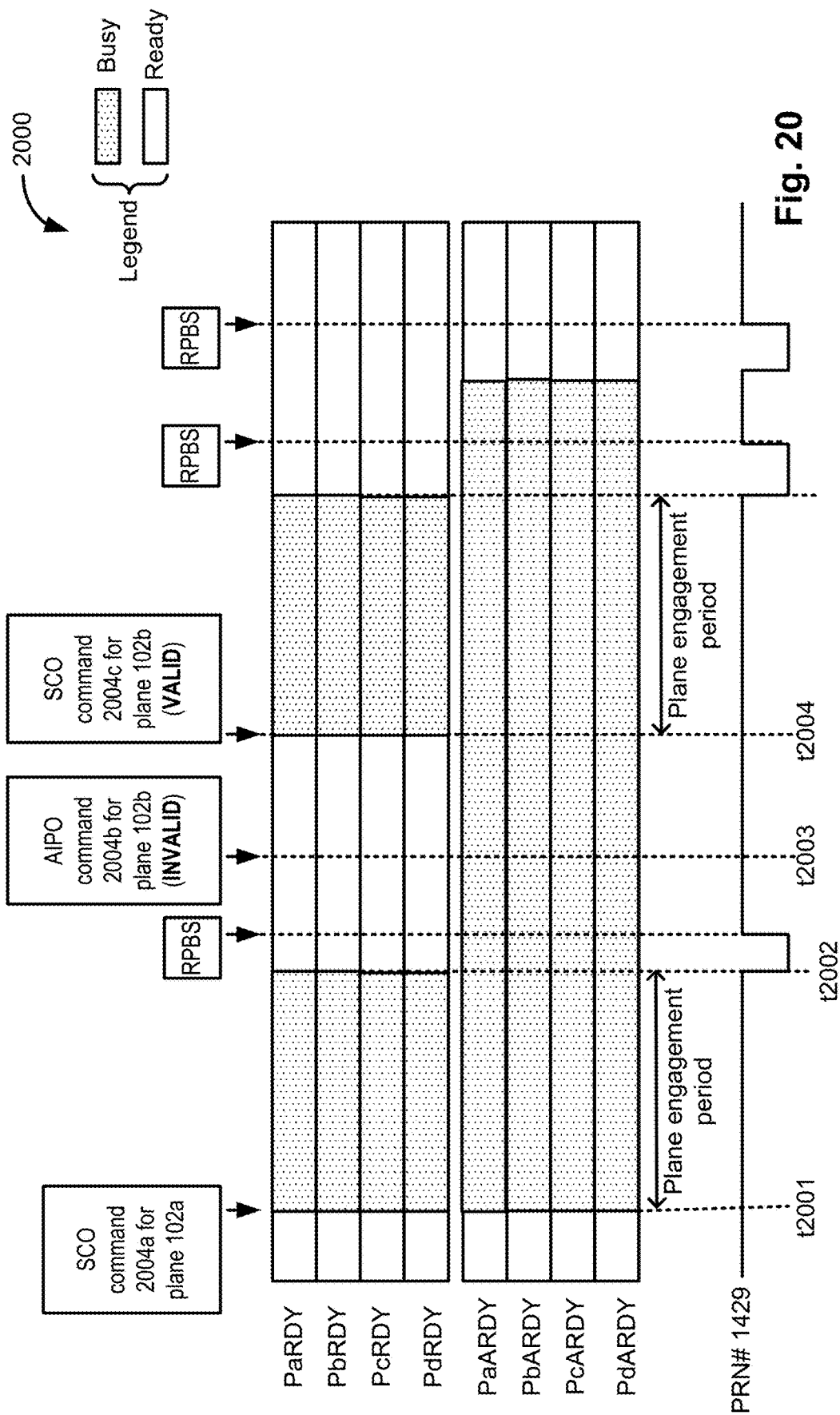

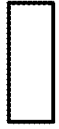
Fig. 22C
Fig. 22D

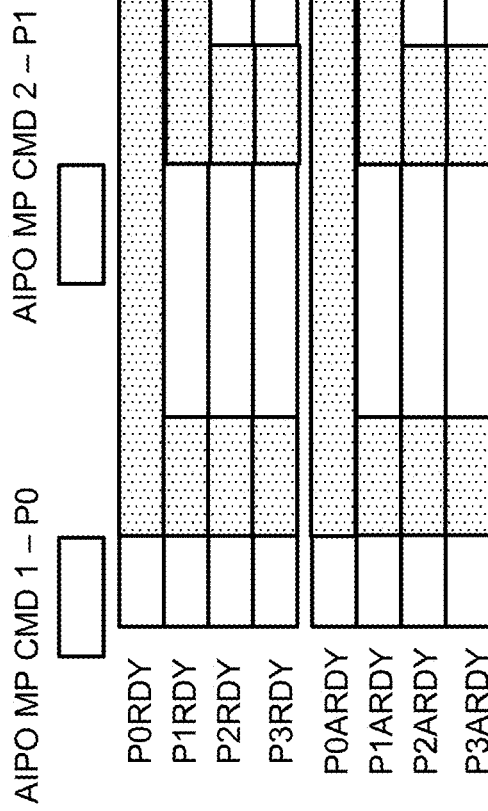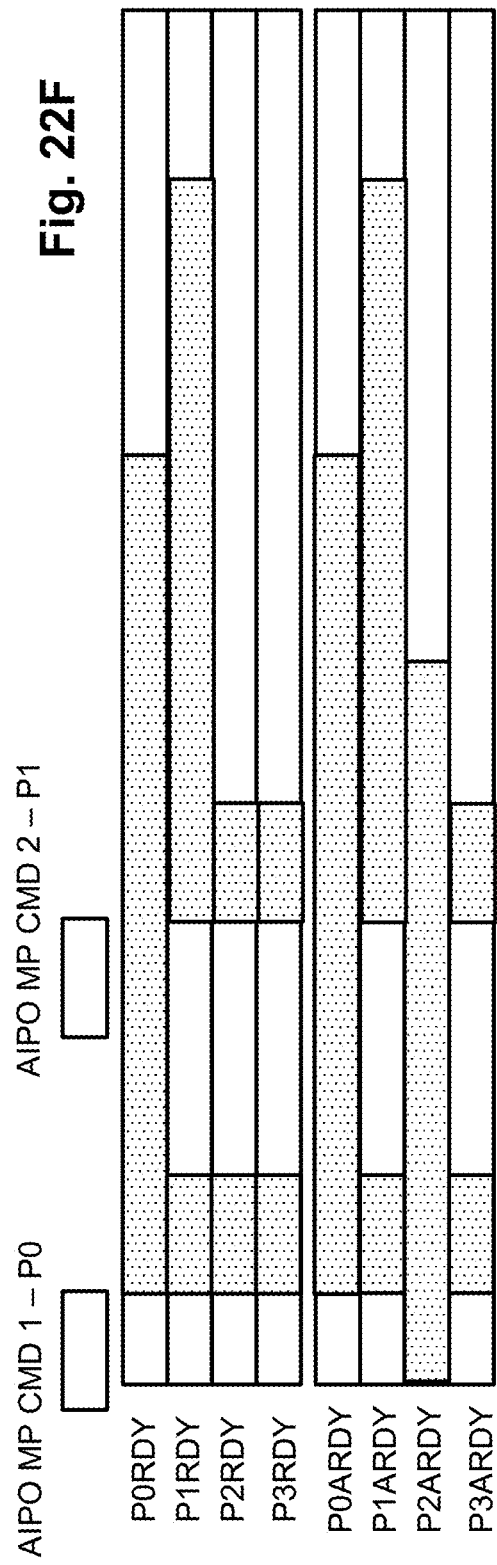

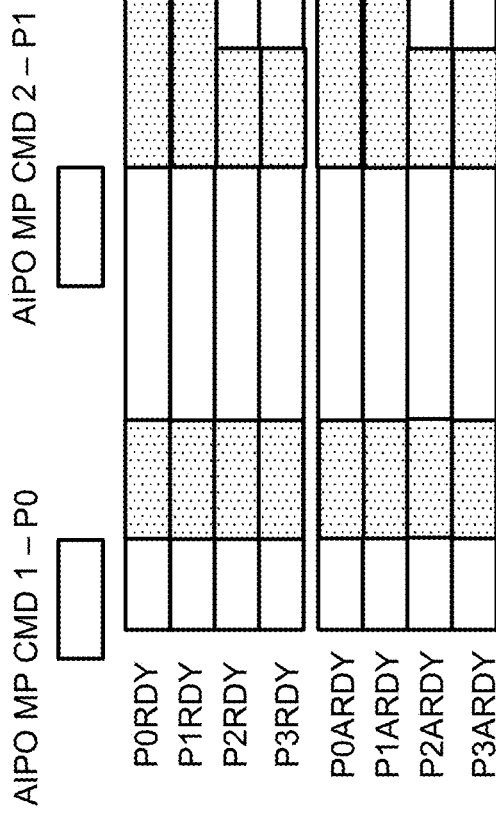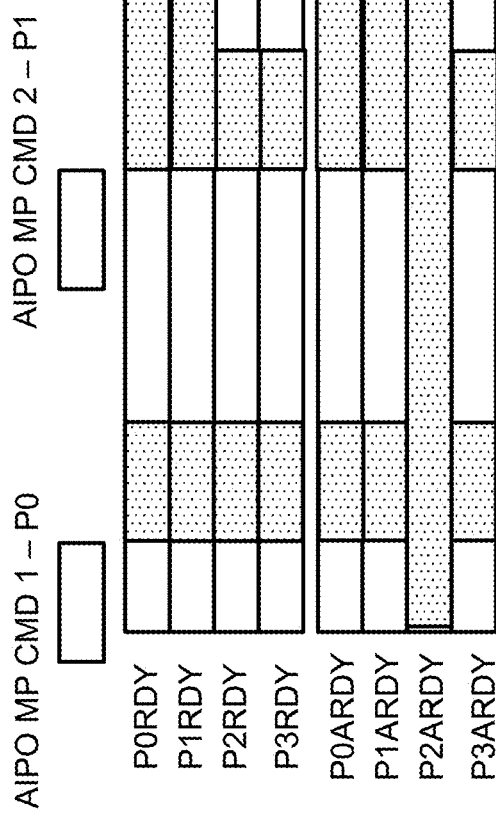

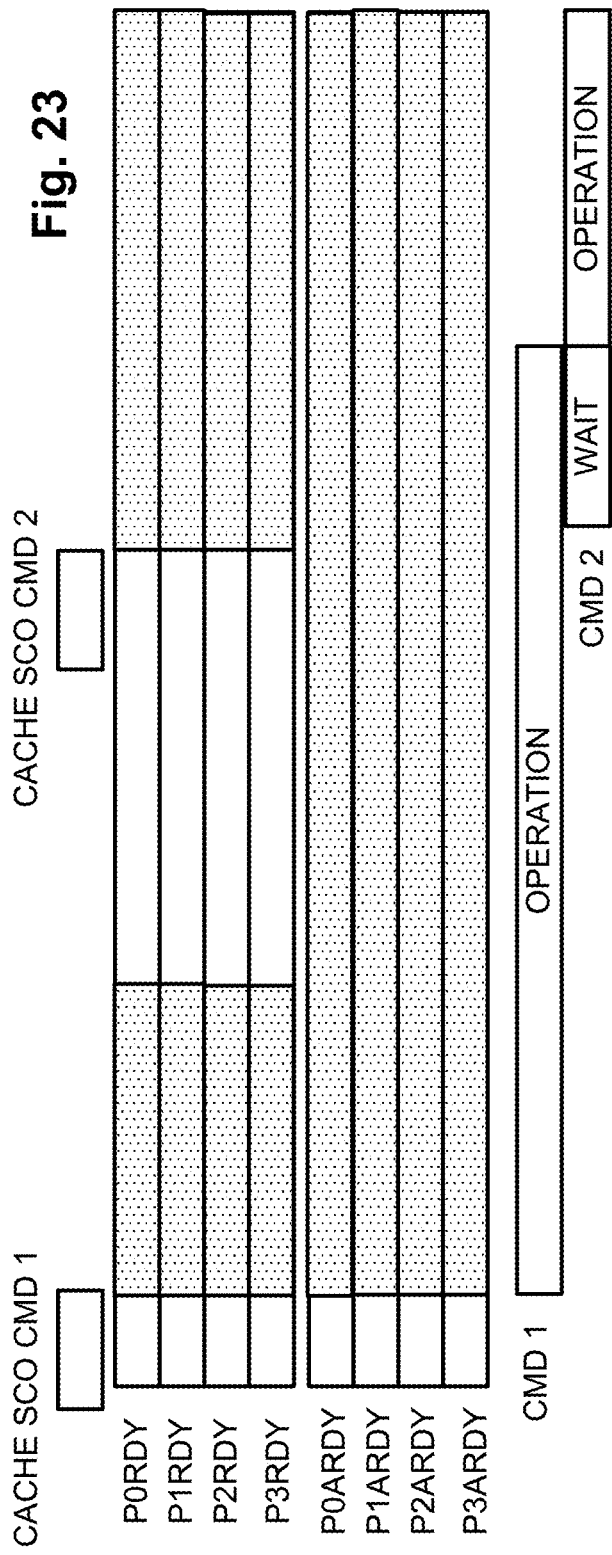

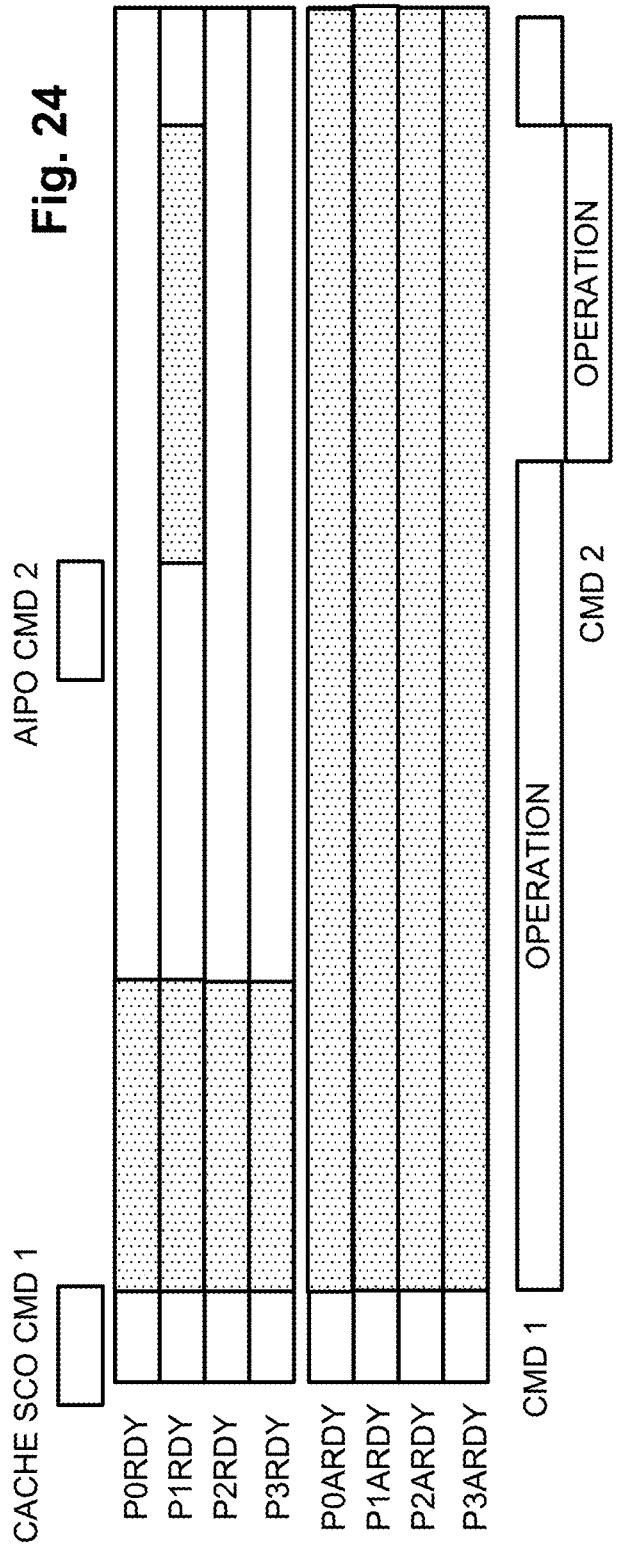

MEMORY SUPPORTING MULTIPLE TYPES OF OPERATIONS

BACKGROUND

Field

This disclosure relates to memory systems in general, and specifically to memory supporting various types of memory operations.

Description of Related Art

In recent years, memory arrays (such as non-volatile memory arrays) are becoming increasingly dense and can store relatively more data. Often, a memory (e.g., a relatively high-density memory) is divided into multiple physical segments, which can be referred to as memory planes. Thus, such a memory has multiple memory planes. Data stored in different planes may not be (or may be) related.

A challenge in such a multi-plane memory is to provide, to a host, overlapping access to the different planes. However, traditional memory operation command protocols generally prohibit issuance of new embedded operation commands to a non-operating plane, e.g., until a current embedded operation is either finished or operated in the background in an operating plane.

SUMMARY

The present disclosure provides a memory comprising a plurality of memory planes. In an example, each memory plane includes (i) at least one corresponding memory array and (ii) one or more peripheral circuit dedicated to read and write operations associated with the at least one corresponding memory array and the corresponding memory plane. The memory also includes an input/output (I/O) interface to receive memory commands and data from a host, and to output data to the host. The memory further includes one or more storage units configured to store, for each memory plane of the plurality of memory planes, (i) a corresponding plane ready (PRDY) signal indicating a busy or a ready state of the corresponding memory plane, and (ii) a corresponding plane array ready (PARDY) signal indicating a busy or a ready state of the corresponding memory array of the corresponding memory plane, such that a plurality of PRDY signals and a plurality of PARDY signals are stored corresponding to the plurality of memory planes.

The present disclosure also provides a method of operating a memory comprising a plurality of memory planes, each memory plane comprising at least one corresponding memory array and one or more peripheral circuits configured to support operations of the corresponding memory array and the corresponding memory plane. In an example, the method includes generating, for each memory plane of the plurality of memory planes, (i) a corresponding PRDY signal indicating a busy or a ready state of the corresponding memory plane, and (ii) a corresponding PARDY signal indicating a busy or a ready state of the corresponding memory array of the corresponding memory plane, such that a plurality of PRDY signals and a plurality of PARDY signals are generated corresponding to the plurality of memory planes. In dependence on the plane ready and array ready signals, an acceptable memory command addressed to an array in a particular plane can be determined by a host. In an example, the method further includes selectively allowing or denying execution of a memory command for a memory plane of the plurality of memory planes, based on status of one or more of the plurality of PRDY signals and the plurality of PARDY signals.

The present disclosure also provides a method of operating a memory comprising a plurality of memory planes, each memory plane comprising (i) at least one corresponding memory array and (ii) one or more peripheral circuit dedicated to read and write operations associated with the at least one corresponding memory array and the corresponding memory plane. In an example, the method includes generating, for each memory plane of the plurality of memory planes, (i) a corresponding plane ready (PRDY) signal, and (ii) a corresponding plane array ready (PARDY) signal; and executing, in the memory, (i) a synchronous chip operation (SCO) memory command that sets a plurality of PARDY signals associated with the plurality of memory planes to indicate a busy status, during an SCO background operation phase of execution of the SCO memory command, and (ii) an asynchronous independent plane operation (AIPO) memory command that sets at most one PARDY signal associated with a corresponding memory plane of the plurality of memory planes to a busy status, during an AIPO background operation phase of execution of the AIPO memory command.

Other aspects and advantages of the present invention can be seen on review of the drawings, the detailed description and the claims, which follow.

BRIEF DESCRIPTION OF THE DRAWINGS

FIG. 1 is a simplified diagram of a memory system comprising a memory including multiple memory planes, where the memory supports (i) asynchronous independent plane operation (AIPO) (also referred to as overlapping independent plane operation) and (ii) synchronous chip operation (SCO) (also referred to herein as concurrent multiple plane operation).

FIG. 2B illustrates an example first type of SCO operation, and FIG. 2C illustrates an example second type of SCO operation.

FIG. 3C1 illustrates timing diagram associated with a "cache read end" command supported by a traditional memory system, and FIG. 3C2 illustrates timing diagram associated with a "cache read end random" command supported by the memory system of FIG. 1.

FIG. 3D1 illustrates timing diagram associated with a reset command supported by a traditional memory system in which operations of all planes are terminated; and FIG. 3D2 illustrates timing diagram associated with a reset command supported by the memory system discussed herein, in which ongoing operation of only a selected plane is terminated.

FIG. 11D illustrates a table that summarizes usage of the PxRDY and PxARDY for various memory operations.

FIG. 12A illustrates bits of a read plane busy status (RPBS) register for a four-plane memory.

FIG. 12B illustrates issuance of the RPBS command and the RPBS output including contents of a corresponding status register SR.

FIG. 16 illustrates a configuration (e.g., a cycle type) of a reset plane command.

FIGS. 17A and 17B illustrate timing diagrams depicting scenarios where a AIPO memory command is issued to a memory plane that does not have an ongoing background operation, while one or more other memory planes can have ongoing AIPO background array operations.

FIG. 20 illustrates a timing diagram that depicts further examples of SCO commands, and also illustrates that some AIPO memory commands may not be issued when the planes execute SCO background array operations.

FIGS. 22A to 22H illustrate example timing diagrams of plane ready signals PxRDY for planes P0 to P3, and array ready signal PxARDY for planes P0 to P3, in response to receiving respective categories of commands.

FIG. 23 illustrates an example in which a second SCO command is issued during operation of a first SCO command.

FIG. 24 illustrates an example in which an AIPO command can be issued that suspends an operation of a previous SCO command.

DETAILED DESCRIPTION

Figure 2A:
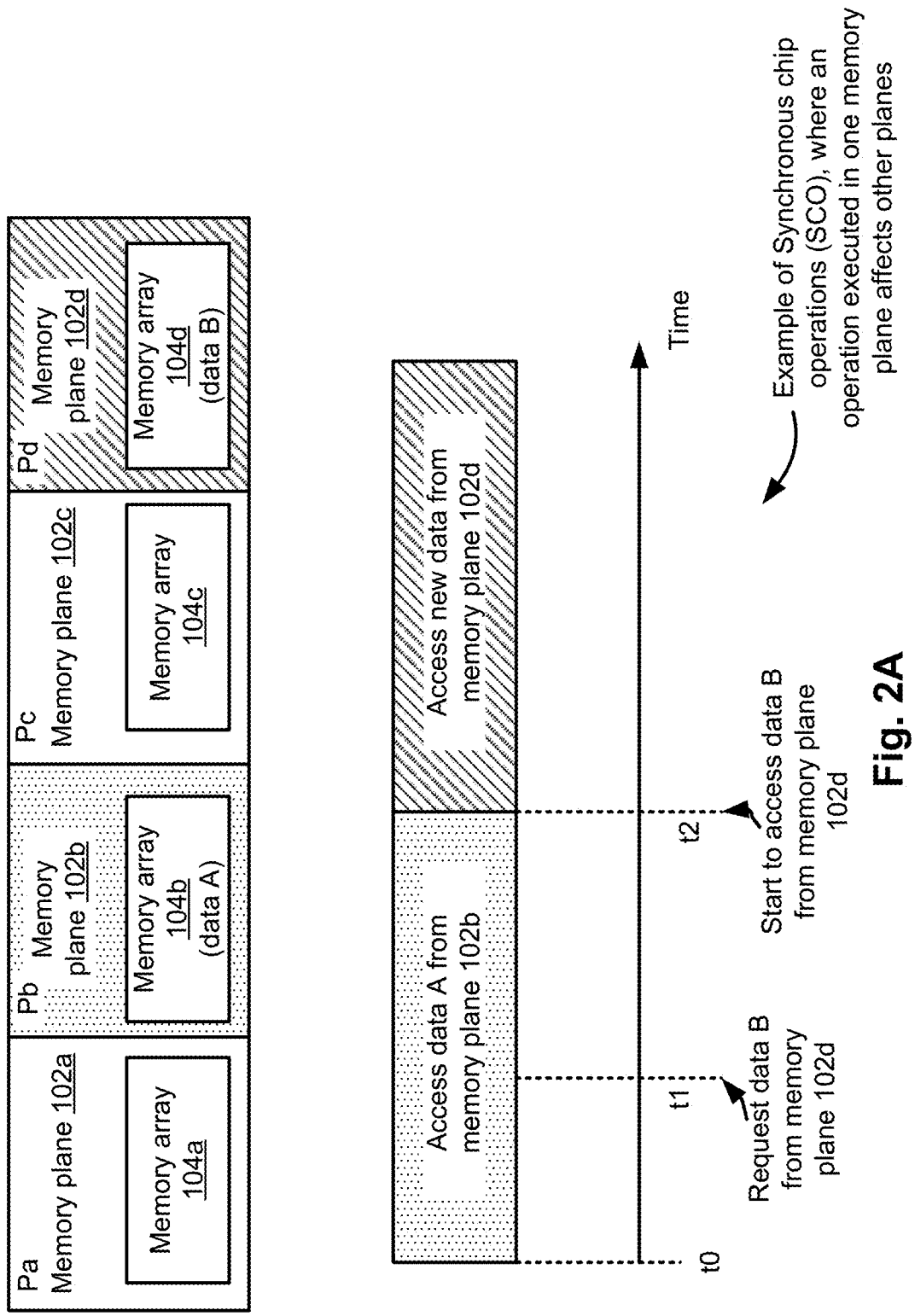
FIG. 2A illustrates an example SCO operation, to access data from memory arrays of two memory planes.

A detailed description of embodiments of the present invention is provided with reference to the figures.

Memory Architecture

FIG. 1 is a simplified diagram of a memory system 100 comprising a memory 101 including multiple memory planes 102a, 102b, . . . , 102N, where the memory 101 supports (i) asynchronous independent plane operation (AIPO) (also referred to as overlapping independent plane operation) and (ii) synchronous chip operation (SCO) (also referred to herein as concurrent multiple plane operation). Note that these memory operations are discussed herein later with respect to various other figures of this disclosure.

Elements referred to herein with a common reference label followed by numbers or letters may be collectively referred to by the reference label alone. For example, memory planes 102a, 102b, . . . , 102N may be collectively and generally referred to as memory planes 102 (or as memory planes 102(a-N)) in plural, and as memory plane 102 in singular.

In an example, the memory 101 is within a single integrated circuit (IC) chip. The IC chip of the memory 101 may be different from another IC chip that includes a host 130. In another embodiment, the host 103 and the memory 101 are on the same single IC chip.

As illustrated, a section of the memory 101 is physically and/or logically divided into the memory planes 102a, . . . , 102N, where N is an appropriate positive integer, such as 2, 3, 4, or higher. A memory plane 102 herein is also referred to simply as a "plane." Note that some of the examples discussed herein later assume that the memory 101 includes four memory planes—memory planes 102a, 102b, 102c, and 102d. However, as discussed, the memory 101 can include any other appropriate number of memory planes, such as 2, 3, 5, or higher.

The memory 101 can be of any appropriate type, such as, for example, a non-volatile NAND memory, a non-volatile NOR memory, or the like. In an example, the memory 101 is a three-dimensional (3D) memory comprising vertically stacked memory cells in individual planes. As an example, the memory 101 can be a NAND flash memory.

Each memory plane 102 includes (i) corresponding memory array 104 comprising a corresponding plurality of memory cells configured to store data, and (ii) corresponding peripheral circuits dedicated for memory operations for that memory plane. For example, memory plane 102a comprises memory array 104a, memory plane 102b comprises memory array 104b, memory plane 102N comprises memory array 104N, and so on. The memory cells of individual memory arrays 104 can be arranged, for example, in a NAND configuration or a NOR configuration (or another appropriate configuration), e.g., based on the type of the memory 101.

For each memory plane 102, the memory 101 further comprises peripheral circuits dedicated for memory operations for that memory plane, such as a corresponding page buffer 108 and a corresponding cache 112. For example, the memory plane 102a has a corresponding page buffer 108a and a corresponding cache 112a; the memory plane 102b has a corresponding page buffer 108b and a corresponding cache 112b, and so on.

In an example and as illustrated in FIG. 1, a page buffer 108 includes sensing circuit and related data buffers to store write and/or read data, and thus, the sensing circuit and the data buffers are combined in the page buffer 108. However, in another example and although not illustrated in FIG. 1, the sensing circuit and the data buffer can be separate components.

A page buffer 108 of a memory plane 102 comprises a plurality of corresponding sense amplifiers and data buffers. During a memory read operation, a page buffer 108 of a memory plane 102 reads data from the corresponding memory array 104 of the memory plane 102, and writes the data to the corresponding data buffers of the page buffer 108. The data from the data buffers of the page buffer 108 is then written to the corresponding cache 112. Thus, for example, during the read operation, a whole page data is read from a memory array 104 to a corresponding page buffer 108, and then from the page buffer 108 to the corresponding cache 112. Similarly, during a write operation, data (e.g., whole page data) is written from a corresponding cache 112 to a corresponding page buffer 108, and then from the page buffer 108 to the corresponding memory array 104 of the corresponding memory plane 102.

The memory 101 also comprises word line selection circuits 110a, 110b, 110N, to select word lines during read and/or write operations. In an example, individual memory planes can have corresponding separate and dedicated word line selection circuits (e.g., memory plane 102a including word line selection circuit 110a, memory plane 102b including word line selection circuit 110b, and so on). In other examples, and contrary to the illustration of FIG. 1, some or all memory planes 102a, . . . , 102N can share a same word line selection circuit 110.

The memory 101 further comprises one or more status registers 140, e.g., to store values of one or more status signals for each plane (Plane x, which x can go from 0 to N–1 for a memory having N planes), such as Plane ready (PxRDY), Plane array ready (PxARDY), etc., as will be discussed herein later.

The memory 101 further comprises one or more hardware pins 142, which dedicatedly outputs status of one or more signals. One example of such a hardware pin 142 is discussed with respect to FIG. 14A (e.g., pad 1430 of FIG. 14A outputting PRN #1430).

The memory 101 further comprises input/output (I/O) interface 116 coupled to the caches 112a, . . . , 112N. Individual cache 112 receives data from the I/O interface 116 and writes data to the corresponding page buffer 108, and receives data from the corresponding page buffer 108 and writes data to the I/O interface 116.

In an example, the host 130 generates and transmits memory commands to the memory 101, stores data to the memory 101, and receives data form the memory 101. In an example, the host 130 also receives one or more status signals (e.g., PxRDY, PxARDY, etc.) from the memory 130 (e.g., from the status registers), as will be discussed herein later. In an example, the host 130 also can be connected to the hardware pin(s) 142. A host can be a memory controller implementing a flash translation layer for example.

In an example, the memory 101 communicates with the host 130, e.g., via a communication link 119. The communication link 119 can be any appropriate communication link, such as a link over a wire connection. The host 130 includes an I/O interface 118, which is coupled to the I/O interface 116 of the memory 101 via the communication link 119. Thus, the host 130 stores data to a memory array of a memory plane and reads data from the memory array of the memory plane through the I/O interface 118, the communication link 119, the I/O interface 116, a corresponding cache 112, and a corresponding page buffer 108 associated with the memory plane.

In an embodiment, the memory 101 also comprises a control circuit 120, which controls various aspects of operations of the memory 101. In an embodiment, the control circuit 120 issues various memory status commands, as will be discussed herein in turn. The memory 101 has many other components that are not illustrated in FIG. 1 for purposes of illustrative clarity and in order to not obfuscate the teachings of this disclosure.

A memory as described herein can be configured to execute operations that engage multiple memory planes of the memory during at least a part of execution, examples of which include a Synchronous chip operation (SCO) as described herein, and to execute operations that engage one memory plane, and not all of the plurality of memory planes, during at least a part of execution, examples of which include an asynchronous independent plane operation (AIPO) as described herein.

Synchronous Chip Operation (SCO) or Concurrent Multiple Plane Operation

FIG. 2A illustrates an example synchronous chip operation (SCO), to access data from memory arrays 104b, 104d of two example memory planes 102b and 102d, respectively. In an example, an SCO operation is not confined to a specific memory plane or a memory array, and may engage multiple (such as all) the memory planes and/or the memory arrays.

In the example of FIG. 2A, four memory planes 102a, . . . , 102d (Pa to Pd) are assumed to be present in the memory 101, where the memory array 104b of the memory plane 102b stores data A, and the memory array 104d of the memory plane 102d stores data B. Data A and data B can be any appropriate type of data.

From time t0, data A is being accessed from memory plane 102b. At time t1, a request to access data B from memory plane 102d is issued. However, FIG. 2A illustrates a SCO, in which an operation executed in one memory plane is dependent on status of other memory planes, e.g., due to one or more shared resources in the memory 101. For example, if a SCO is being executed in one memory plane, operations on one or more other planes cannot be executed. For some SCO operations in all selected planes inside the memory chip start simultaneously or operate simultaneously in the sense that they are executed during the same interval of time (e.g., concurrent operation), and the operations may not be the same for all selected planes. After the SCO command is issued, the memory chip becomes busy, and no new embedded operation command can be accepted during the busy period. Depending on the command, the memory chip will return to ready state after the current embedded operations are either finished or the cache is ready for the data input/output for all planes. The host 130 can issue the new embedded operation command which can be executed by the memory chip only when the chip is ready (i.e., all planes are ready) after completion of the SCO, or in case of a cache SCO, the cache is ready. For determining whether to issue a command invoking an SCO, the host 130 needs to check the chip busy status PRDY and PARDY for operation. Because SCO concurrently engages multiple planes, SCO is also referred to as concurrent multiple plane operation.

Accordingly, although the data B is requested at time t1, the request cannot be executed immediately, e.g., as a SCO (e.g., accessing data A) is currently being executed in memory plane 102b. Once accessing data A from memory plane 102b is completed at time t2, access of data B from memory plane 102d starts from time t2.

FIG. 2B illustrates an example first type of SCO, and FIG. 2C illustrates an example second type of SCO. In an example, SCO operations for each plane start at a same time, i.e., are synchronous.

For example, in the type 1 SCO illustrated in FIG. 2B, only same type of operations is allowed in various memory planes. For example, memory planes 0, 1, 2, and 3 execute corresponding Triple Level Cell (TLC) read operations. Thus, in the example of type 1 SCO of FIG. 2B, it is not possible for a memory plane 0 to execute TLC read concurrently with another memory plane 1 to execute Single Level Cell (SLC) read operations. Also, SCO operations for each plane start at a same time, i.e., are synchronous. For example, TLC read operations for planes 0, 1, and 3 start at time t2B1, TLC read operations for planes 1 and 2 start at time t2B2, and TLC read operation for plane 1 starts at time t2B3.

In contrast, in the type 2 SCO illustrated in FIG. 2C, different types of operations are allowed in different memory planes. For example, example memory planes 0, 1, 2, and 3 execute both TLC and SLC read operations. Also, SCO operations for each plane start at a same time, i.e., are synchronous. For example, TLC/SLC read operations for planes 0, 1, and 3 start at time t2C1, TLC/SLC read operations for planes 0 and 2 start at time t2C2, and SLC read operation for plane 0 starts at time t2C3.

Figure 3A:
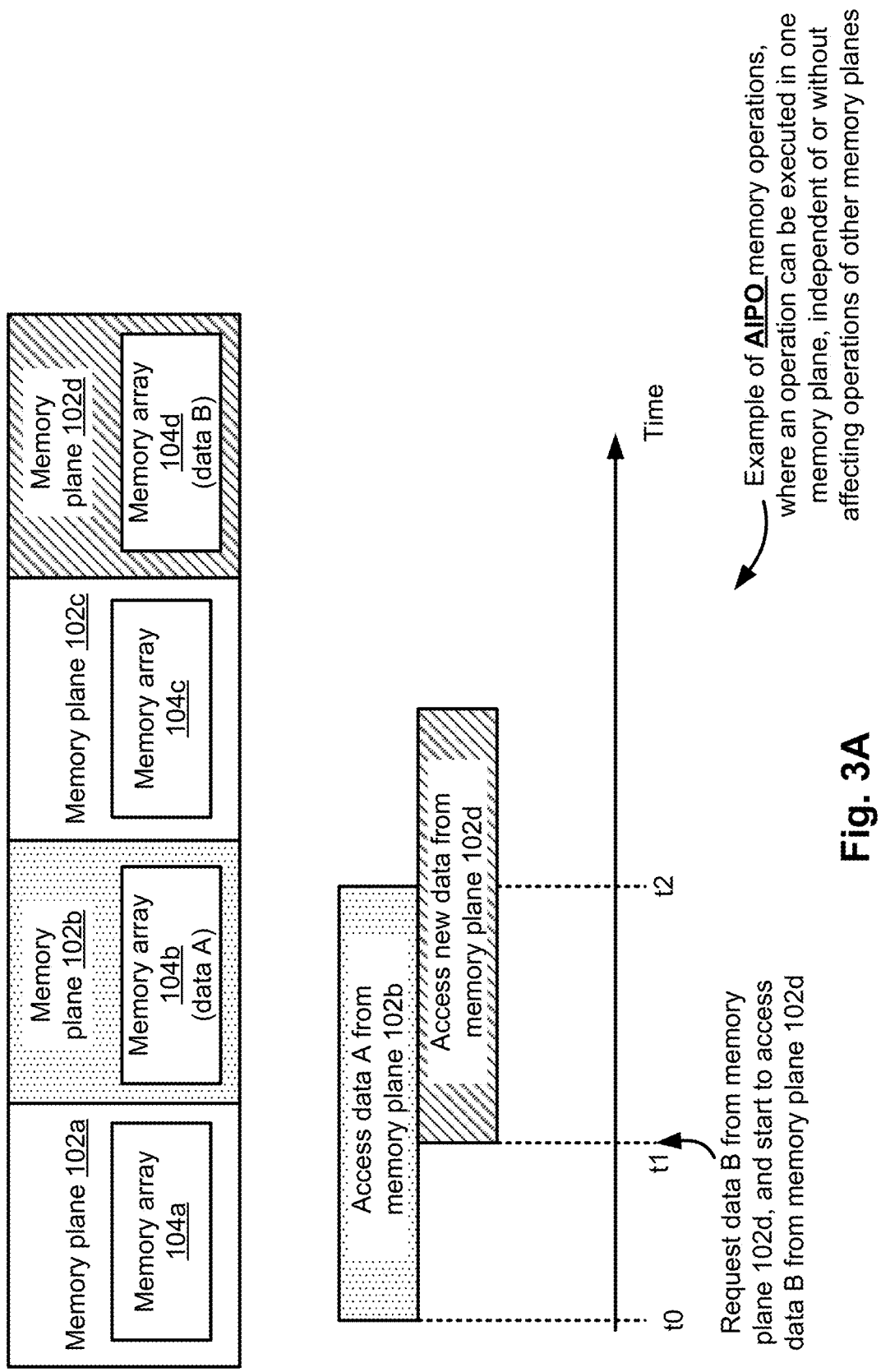
FIG. 3A illustrates an example AIPO operation, to access data from memory arrays of two memory planes.

Asynchronous Independent Plane Operation (AIPO) or Overlapping Independent Plane Operation FIG. 3A illustrates an example asynchronous independent plane operation (AIPO), to access data from memory arrays 104b, 104d of two example memory planes 102b and 102d, respectively. Similar to FIG. 2A, in the example of FIG. 3A, four memory planes 102a, . . . , 102d are assumed to be present in the memory 101, where memory array 104b of the memory plane 102b stores data A, and memory array 104d of the memory plane 102d stores data B. Data A and data B can be any appropriate type of data.

From time t0, data A is being accessed from memory plane 102b. At time t1, a request to access data B from the memory array 104d of the memory plane 102d is issued. FIG. 3A illustrates an asynchronous independent plane operation (AIPO) (also referred to herein as a "overlapping independent plane operation" operation), in which an operation can be executed in one memory plane, independent of or without affecting status of other memory planes. In AIPO, each plane can start any operation in any time, as long as the selected plane is ready for the embedded operation command. Thus, AIPO can be executed in a plane, regardless of the status of the other planes. That is, the host 130 can issue the embedded operation command to a specific memory plane that can be executed by the memory, as long as the specific plane is ready (and regardless of readiness of other planes). For AIPO, the host 130 can treat each plane as an independent memory unit, and the host 130 checks the plane busy status PRDY and PARDY for the progress of the operation in each plane. For example, if an AIPO operation is being executed in one memory plane, another AIPO operation on another memory plane can be executed in an overlapping manner. Thus, AIPO memory operations allow overlapping or at least in part simultaneous execution of operations in more than one memory plane.

Accordingly, as the data B is requested at time t1, the request is executed immediately, e.g., as a AIPO (e.g., accessing data A) is currently being executed in memory plane 102b. Thus, access of data B from memory plane 102d starts from time t1, as illustrated in FIG. 3A. Thus, the host 130 can access the non-busy plane (e.g., plane 102d) for new data, while another memory operation is still being executed in another busy plane (e.g., plane 102b).

Figure 3B:
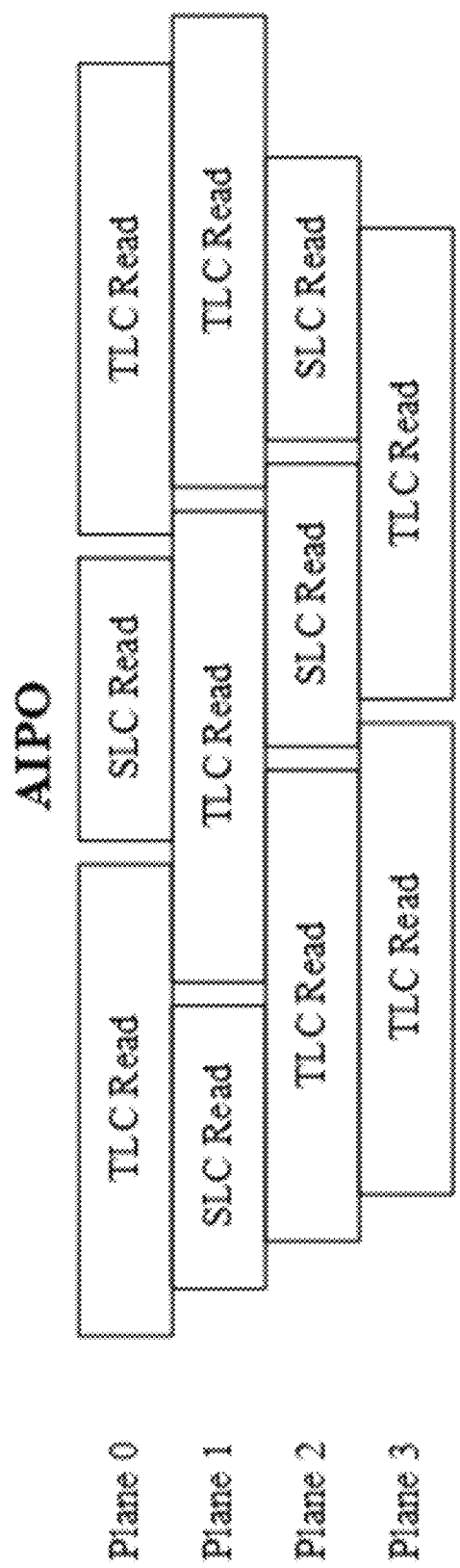
FIG. 3B illustrates example AIPO operations.

FIG. 3B illustrates example AIPO operations. In an example, AIPO operations for different planes can start at different times. For example, the TLC read and the SLC read operations for different planes start at different times, i.e., AIPO operations are asynchronous in nature.

Memory Embedded Operation Protocol Supporting Both SCO and AIPO Operations

As will be discussed in further detail herein in turn, in an embodiment, the memory system 100 supports both SCO and AIPO operations.

Background and Foreground Memory Operation

Figure 4:
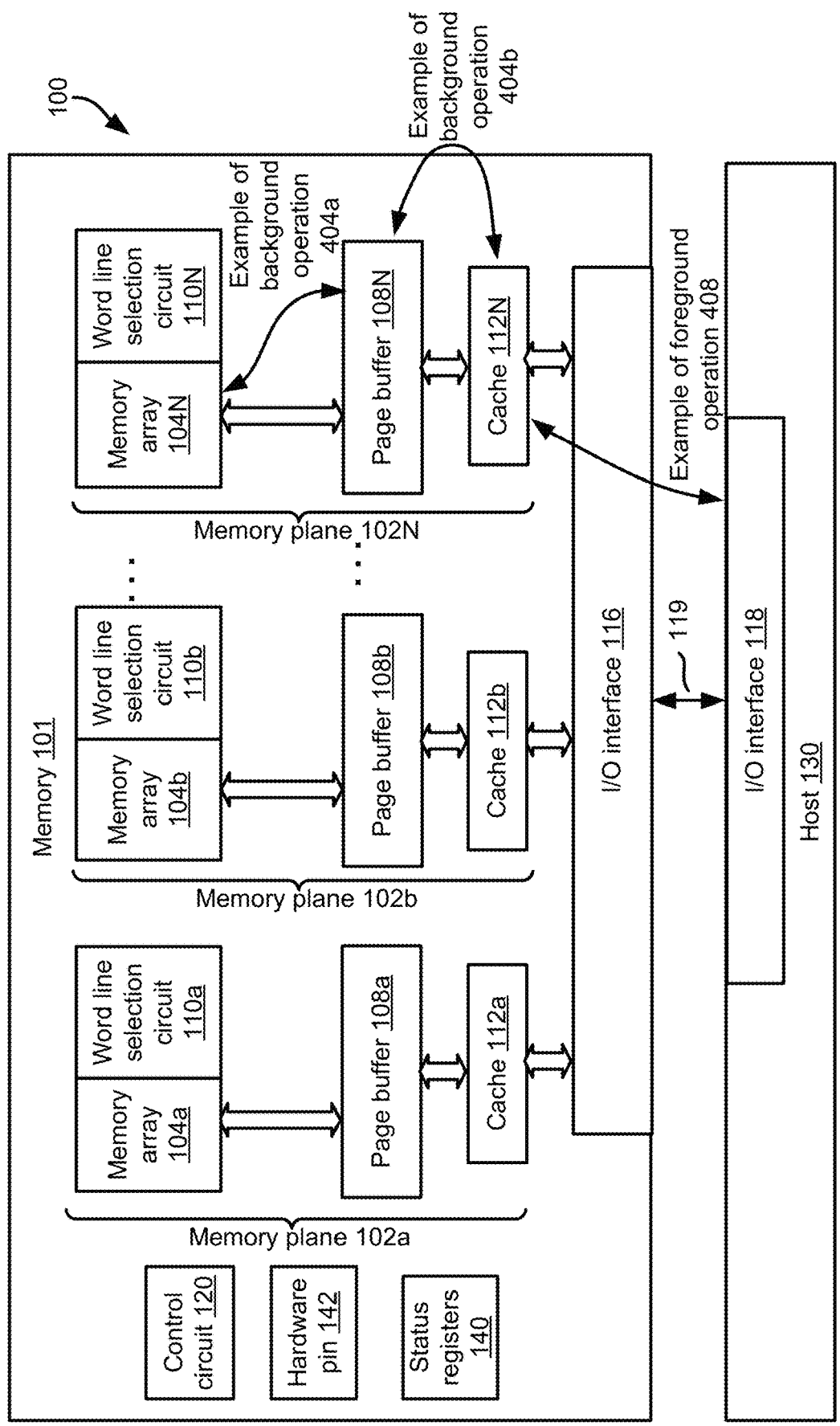
FIG. 4 illustrates example background memory operations and foreground memory operations performed by the memory system of FIG. 1.

FIG. 4 illustrates example background memory operations and foreground memory operations performed by the memory system 100 of FIG. 1.

Background memory operations are those memory operations executed by a controller (e.g., within the control circuit 120), such as a state machine, on the memory system which can provide address and control signals for access to a memory array. In a background memory operation, the I/O interface 118 may be available for use by the host 130 for other concurrent operations. For example, background memory operations are performed internally within the memory 101.

FIG. 4 illustrates some example background memory operations (also referred to simply as background operations). For example, data transfer between a memory array of a memory plane (e.g., memory array 104N in the example of FIG. 4) and a corresponding page buffer (e.g., page buffer 108N in the example of FIG. 4) can be executed by a controller on the memory system and does not involve the host 130, and is an example of a background array operation 404a. In the background array operation 404a, data may be transferred from the memory array 104N to the page buffer 108N, and/or from the page buffer 108N to the memory array 104N. Note that is some embodiments, a "background operation" can be indicated by when PxARDY=0, and PxRDY can be 1 or 0, and a "background array operation" can be indicated PxRDY=1 and PxARDY=0.

Another example of a background operation 404b is data transfer between a page buffer (e.g., page buffer 108N) and a corresponding cache (e.g., cache 112N), as such data transfer does not involve the host 130. In the background operation 404b, data may be transferred from the cache 112N to the page buffer 108N, and/or from the page buffer 108N to the cache 112N.

As will be discussed herein later (e.g., with respect to FIGS. 6A, 6B, 7, and 8), when a background operation is ongoing in a plane, a memory array ready status signal (PxARDY) for that specific plane is in a busy state, indicating that the corresponding memory array of the plane is busy.

In contrast to the background memory operations, foreground memory operations may directly involve the host 130 utilizing the I/O interface 118 for one or more of command, address and data communications. For example, the host 130, including the I/O interface 118, communicates with the caches 112a, ..., 112N of the memory 101 during foreground memory operations. FIG. 4 illustrates an example foreground memory operation 408, in which data is transmitted between the host 130 (e.g., the I/O interface 118) and a cache (e.g., cache 112N). For example, during the foreground memory operation 408, data may be transmitted from the cache 112N to the host 130 and/or from the host 130 to the cache 112N.

Memory Commands Comprising Both Foreground and Background Operations

A memory command may be executed by executing a number of memory operations, such as one or more foreground memory operations and/or one or more background memory operations. Thus, to execute a memory command, a number of corresponding foreground memory operations and/or background memory operations have to be executed.

For example, a read command involves the following memory operations: (i) data is read from a memory array and written to a corresponding page buffer, (ii) data is read from the corresponding page buffer to the corresponding cache, and (iii) data is read from the corresponding cache to the host 130. Note that transfer of data from the memory array to the page buffer, and from the page buffer to the cache are examples of background memory operations; whereas transfer of data from the cache to the host 130 is an example of a foreground memory operation. Thus, the above discussed example read command comprises both background memory operations and foreground memory operations.

Execution of Background Memory Operation, when a Memory Command is being Executed In an embodiment, when a memory command is being executed for a specific memory plane, one or more other memory operations can be executed for one or more other memory planes in an overlapping manner. For example, when a cache read operation is ongoing for one memory plane (e.g., memory plane 102N), a background memory operation (e.g., transfer of data between memory array 104a and page buffer 108a) can also be executed in an overlapping manner.

However, not every memory command may allow overlapping execution of background memory operations, when the memory command is being executed. For example, a "block erase" memory command erases data from one or more blocks of one or more memory arrays of one or more memory planes. In an example, due to a design of the circuit inside the memory 101, when executing a block erase memory command, no other background memory operations may be executed, as discussed herein later.

Traditional Memory Operations

Table 1 herein below illustrates various example SCO commands that can be executed using a traditional command protocol. Commands labeled "not supported" may be supported using the technology described herein.

TABLE 1

| Serial No. | Memory operation command | Operation type | Cache operation | Category |
|---|---|---|---|---|
| 1 | Set feature | SCO | No | 1 |
| 2 | Get feature | SCO | No | 1 |
| 3 | Read parameter page | SCO | No | 1 |

TABLE 1-continued

| Serial No. | Memory operation command | Operation type | Cache operation | Category |
|---|---|---|---|---|
| 4 | Reset | System management | No | 3 |
| 5 | Reset plane | (not supported) | — | — |
| 6 | Page read | SCO | No | 1 |
| 7 | Cache read sequential | SCO | Yes | 2 |
| 8 | Cache read random | SCO | Yes | 2 |
| 9 | Cache read end | SCO | Yes | 2 |
| 10 | Cache read end random | (not supported) | — | — |
| 11 | Page program | SCO | No | 1 |
| 12 | Cache program | SCO | Yes | 2 |
| 13 | Block erase | SCO | No | 1 |
| 14 | Multiple plane page program | SCO | No | 1 |
| 15 | Multiple plane cache program | SCO | Yes | 2 |
| 16 | Multiple plane block erase | SCO | No | 1 |

Various entries of Table 1 will be apparent to those skilled in the art, based on the discussion with respect to Table 2.

Categories of Memory Commands and Memory Operations

Table 2 herein below illustrates various example memory commands, and their corresponding types and categories, that can be implemented by the memory system 100 discussed throughout this disclosure. Commands labeled "not supported" may not be needed in a memory utilizing technology described herein. In some embodiments, these commands labeled "not supported" in Table 2 could also be supported.

TABLE 2

| Serial No. | Memory operation command | Operation type | Cache operation | Category |
|---|---|---|---|---|
| 1 | Set feature | SCO | No | 1 |
| 2 | Get feature | SCO | No | 1 |
| 3 | Read parameter page | SCO | No | 1 |
| 4 | Reset | System management | No | 3 |
| 5 | Reset plane | System management | No | 3 |
| 6 | Page read | AIPO | No | 4 |
| 7 | Cache read sequential | (not supported) | — | — |
| 8 | Cache read random | AIPO | Yes | 5 |
| 9 | Cache read end | (not supported) | — | — |
| 10 | Cache read end random | AIPO | Yes | 5 |
| 11 | Page program | SCO | No | 1 |
| 12 | Cache program | SCO | Yes | 2 |
| 13 | Block erase | SCO | No | 1 |
| 14 | Multiple plane page program | SCO | No | 1 |
| 15 | Multiple plane cache program | SCO | Yes | 2 |
| 16 | Multiple plane block erase | SCO | No | 1 |

Category 1: SCO command without cache operation
Category 2: SCO command with cache operation
Category 3: System management command
Category 4: AIPO command without cache operation
Category 5: AIPO command with cache operation A first column of Table 2 lists a serial number corresponding to various memory commands. A second column of Table 2 lists the memory commands. A third column of Table 2 indicates whether a memory command is AIPO or SCO. For example, "set feature" memory command (e.g., which may be used to set features of one or more configurable elements of the memory 101) is a SCO memory command, e.g., as the set feature writes to a register file shared by multiple planes. In another example, "cache read random"

memory command (e.g., which may be used to read data from cache) is an AIPO memory command.

A fourth column of Table 2 indicates whether a memory command allows execution of overlapping or at least in part concurrent cache operation. For example, the set feature command is a SCO memory command, which does not allow any cache operation to be executed in an overlapping manner, e.g., while the set feature command is being executed. Put differently, when cache operations are being executed, the set feature command cannot be executed in an overlapping manner with the cache operations in any plane.

In another example, the cache read random is a AIPO memory command, which allows cache operation (in another memory plane) to be executed in an overlapping manner, e.g., while the cache read random command is being executed.

A fifth column of Table 2 categorizes each memory command in a corresponding one of five possible categories. The last row of Table 2 identifies the possible categories. For example, category 1 refers to SCO memory commands that do not allow any overlapping cache operation, category 2 refers to SCO memory commands that allow overlapping cache operation, category 3 refers to system management commands, category 4 refers to AIPO memory commands that do not allow overlapping cache operation, and category 5 refers to AIPO memory commands that allow overlapping cache operation.

Note that Table 1 herein above is for a system that supports only SCO commands, whereas Table 2 herein above is for the memory system discussed herein that supports both SCO and AIPO commands.

Note that operations associated with SCO commands in the memory system 100 discussed herein are same as the SCO command of the traditional system discussed with respect to Table 1.

In an example, some AIPO commands come from existing SCO commands. The host 130 expects same or similar operation scheme for AIPO command, and in this way, the host 130 can just do small adjustment to adopt the AIPO relative to the SCO. AIPO commands are single plane operation commands.

It may be noted that as discussed herein, the AIPO does not need to support multiple plane operation, e.g., because the host 130 treats each plane as an independent operation unit when executing the AIPO commands. For example, a AIPO command is issued to a one selected plane, and other planes are referred to as non-selected from the perspective of the AIPO command. In contrast, SCO command engages all planes of the memory 101.

For a selected plane of an AIPO command (i.e., a plane to which the AIPO command is issued), the operation may be the same as the traditional SCO operation.

For a non-selected plane (i.e., a plane to which the AIPO command is not issued, and the AIPO command is issued to a different plane), AIPO command can be implemented in more than one type. For example, during a first type of AIPO command, the non-selected planes are in a ready state after the AIPO command is issued (e.g., see FIG. 6B). During a second type of AIPO command, the non-selected planes are busy only for short period of time after the AIPO command is issued, the short period of time may be for command processing (e.g., see FIG. 6A). These two types of AIPO command behavior for the non-selected planes are discussed in further detail with respect to FIGS. 6A, 6B and elsewhere in this disclosure.

Some SCO commands (e.g., cache read sequential command, cache read end command, etc.) do not include the row address, and hence, cannot be used as AIPO command. These commands are indicated by "not supported" in Table 2.

It may be noted that whether a memory command is a AIPO or a SCO memory command is based on a type of command, as well as a choice of circuit design of the memory 101. For example, program commands (e.g., page program and/or cache program) and/or erase commands (e.g., block erase and/or multiple plane block erase) are categorized as SCO in the above Table 2 for specific circuit design implementation of the memory 101. However, for another circuit design implementation of the memory 101, one or more of the commands can be AIPO memory commands. Thus, the features and categorization of the various commands illustrated in Table 2 are merely examples, and are implementation specific. For example, the features and categorization of the various commands illustrated in Table 2 can change for a different implementation or design choice of the circuits of the memory 101.

FIG. 3C1 illustrates timing diagram associated with a "cache read end" command supported by a traditional memory system, and FIG. 3C2 illustrates timing diagram associated with a "cache read end random" command supported by the memory system 100 discussed in this disclosure. For example, as seen in Table 1, the "cache read end" command is supported by the traditional memory system, but the "cache read end random" command is not supported by the traditional memory system. However, as seen in Table 2, the memory system 100 disclosed herein supports the "cache read end random" command, but doesn't support the "cache read end" command. For example, the "cache read end random" command in the memory system 100 can replace "cache read end" command of the traditional memory system. For example, as discussed herein above, a new AIPO command (such as cache read end random) may replace an original SCO command (such as cache read end), if the original SCO command doesn't support the row address selection.

FIG. 3D1 illustrates timing diagram associated with a reset command supported by a traditional memory system in which operations of all planes are terminated, and FIG. 3D2 illustrates timing diagram associated with a reset command supported by the memory system 100 in which ongoing operation of only a selected plane is terminated. For example, the reset command of FIG. 3D2 has an address of a plane that is to be reset, and accordingly, only the selected plane is reset (e.g., instead of resetting all planes, as done in the reset command of FIG. 3D2).

Memory Plane Ready Status Signal (PxRDY) and Memory Array Ready Status Signal (PxARDY)

In an embodiment, various planes of the memory 101 (or the control circuit 120) issue various status signals, e.g., to indicate whether a corresponding memory plane 102 or a corresponding memory array 104 is ready to execute new memory operations, or is busy executing current memory operation and cannot accept new memory operations.

For example, one such ready signal is a memory plane ready status signal (PxRDY) that is issued for various memory planes Px, where the "x" in Px is an index of a corresponding memory plane. For example, for the memory plane 102a, the memory plane ready status signal is PaRDY; for the memory plane 102b, the memory plane ready status signal is PbRDY; for the memory plane 102N, the memory plane ready status signal is PNRDY, and so on. In general, the signal PxRDY indicates whether a memory plane 102x is in a busy state or a ready state, as will be discussed in further detail herein later.

Another such ready signal is a memory array ready status signal (PxARDY) that is issued for various memory arrays, where the "x" in PxARDY is an index of a corresponding memory array of a corresponding memory plane. For example, for the memory plane 102a, the memory array ready status signal is PaARDY; for the memory plane 102b, the memory array ready status signal is PbARDY; for the memory plane 102N, the memory array ready status signal is PNARDY, and so on. In general, the signal PxARDY indicates whether a memory array 104x of a memory plane 102x is in a busy state or a ready state.

Whether a specific memory plane can receive and execute a new memory command, at any given time, is based on the PxRDY and/or the PxARDY for the specific memory plane, as well as the PxRDY and/or the PxARDY for the various other memory planes.

Figure 5:
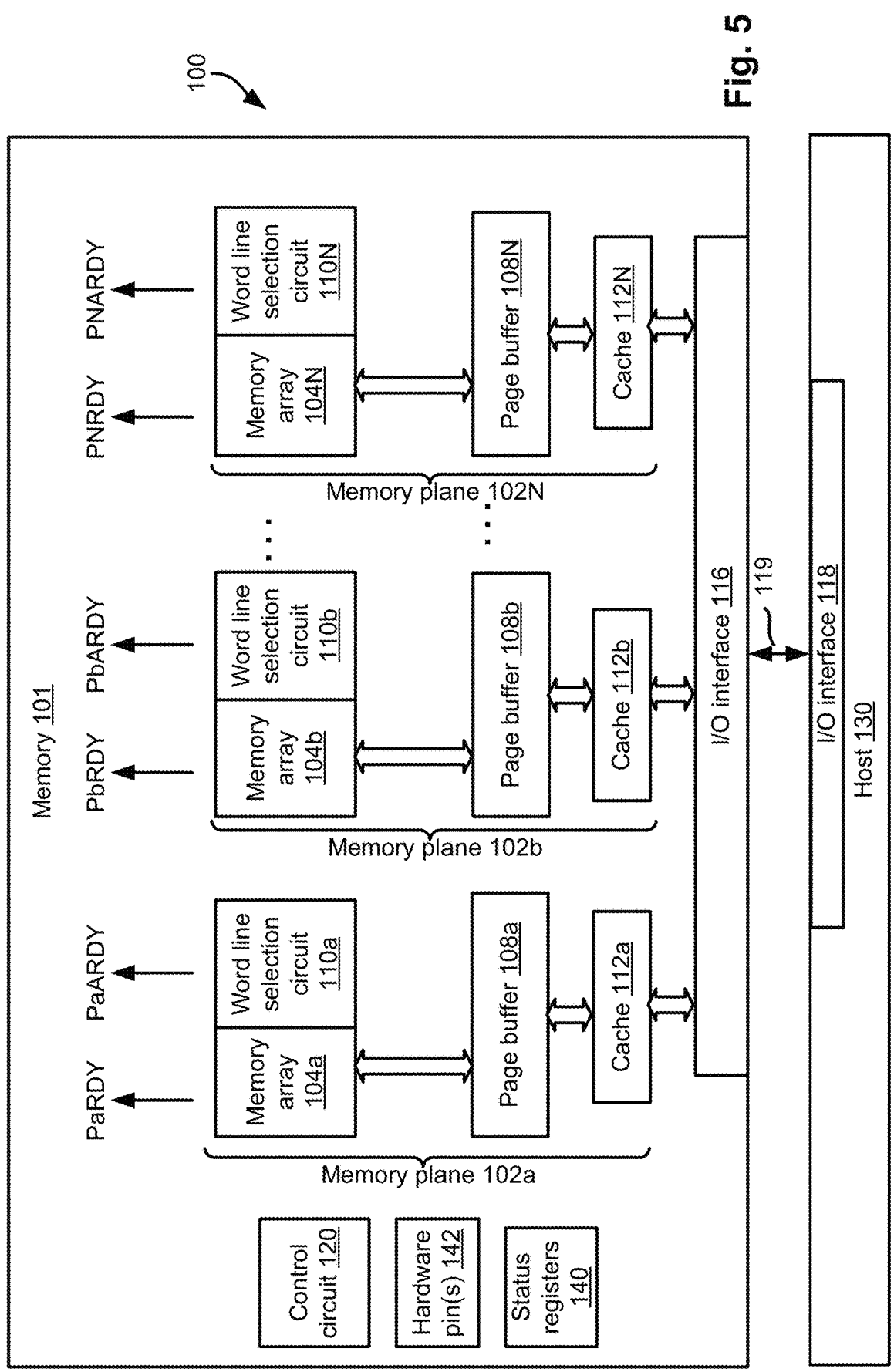
FIG. 5 symbolically illustrates the memory plane ready status signal (PxRDY) and memory array ready status signal (PxARDY) for various memory planes and for the various memory arrays of the memory of the system of FIG. 1.
Figure 6:
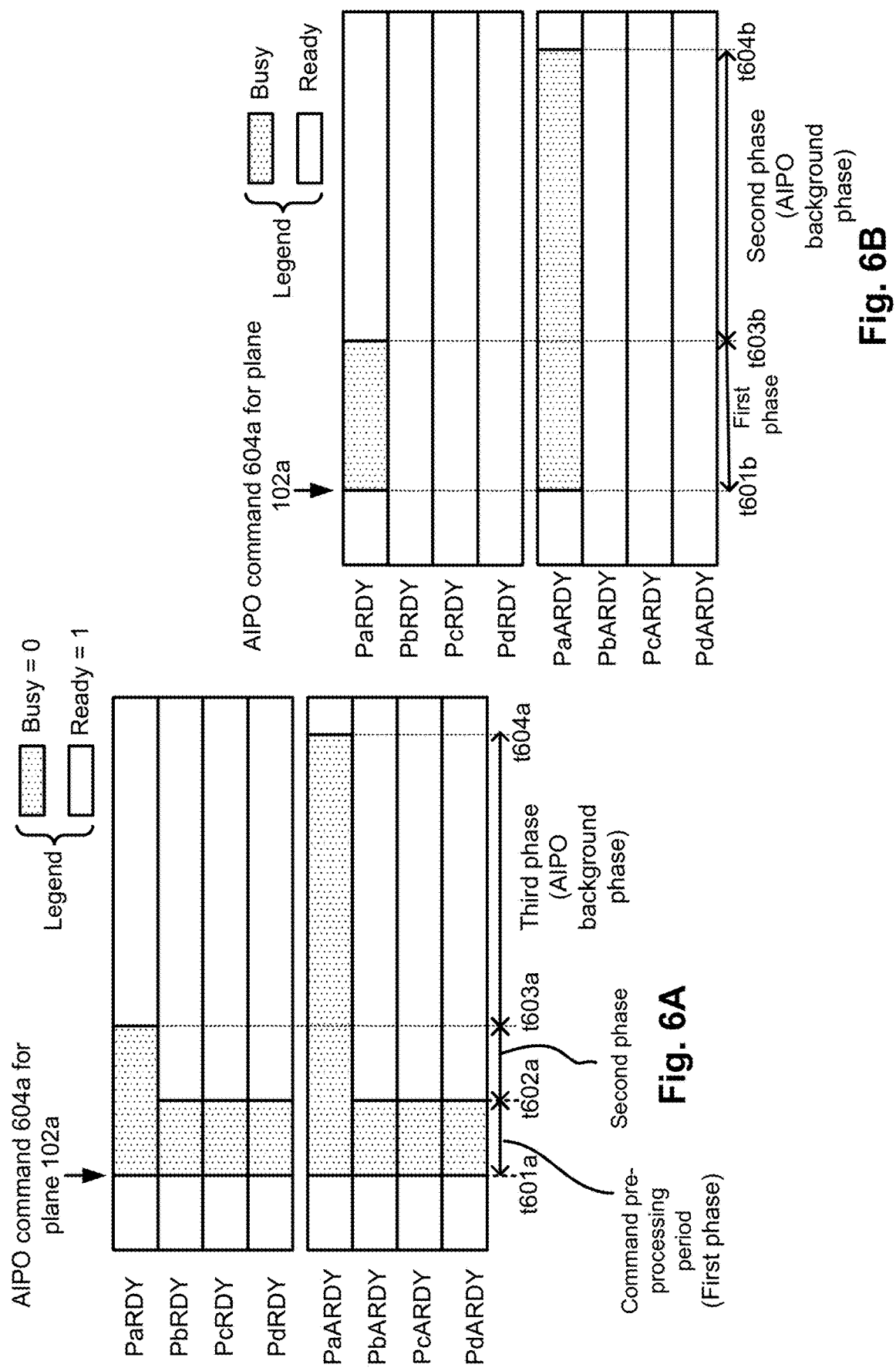
FIG. 6A illustrates an example timing diagram of a plane ready signal and an array ready signal, in response to receiving a AIPO command, where execution of the AIPO command includes a command pre-processing period during which all planes are in a busy state.
FIG. 6B illustrates an example timing diagram of a plane ready signal and an array ready signal, in response to receiving a AIPO command, where execution of the AIPO command lacks any command pre-processing period during which all planes are in a busy state.

FIG. 5 symbolically illustrates the memory plane ready status signal (PxRDY) and memory array ready status signal (PxARDY) for various memory planes 102 and for the various memory arrays 104 of the memory 101 of the system 100. As illustrated, each memory plane/memory array has a corresponding PxRDY signal and a PxARDY signal. Note that in an example, the control circuit 120, or a memory plane 102, or another appropriate component of the memory 101, issues the PxRDY and PxARDY signals for the memory plane 102.

The memory plane ready status signal (PxRDY) is also referred to simply as plane ready signal, and the memory array ready status signal (PxARDY) is also referred to simply as array ready signal.

In an example, the PxRDY and RxARDY bits are stored in the status registers 140 of FIG. 1.

In general, if a background operation in a memory plane 102x is being currently executed (where background operations have been discussed herein earlier, e.g., with respect to FIG. 4), the PxARDY (i.e., array ready status signal) is in a busy state, which is indicated by, for example, PxARDY being 0. This is because background operations in a memory plane 102x implies that the corresponding memory array 104x is participating in the background operations. Otherwise, if the memory plane 102x, including the memory array 104x, is not undergoing any operation (e.g., any background operation), the corresponding PxARDY (i.e., array busy status signal) is in a ready state, which is indicated by, for example, PxARDY being 1.

Thus, for a memory plane 102x:

PxARDY=0→indicates memory array 104x of memory plane 102x is in a busy state; and PxARDY=1→indicates memory array 104x of memory plane 102x is a ready state.

For a memory plane 102x:

PxRDY=0→indicates memory plane 102x is in a busy state and cannot accept a new command; and PxRDY=1→indicates memory plane 102x is in a ready state and can accept a new command.

If no background operations are ongoing in a memory array 104x of a memory plane 102x, then PxARDY is 1. In an example, when PxARDY is 1, the plane ready signal PxRDY can also be 1, i.e., PxRDY=PxARDY.

When No Background Operation is Ongoing (i.e., PxRDY=PxARDY=Ready for a Specific Plane), and an AIPO Command can be Issued to the Specific Plane.

When no background operation is ongoing in a specific plane (i.e., PxRDY=PxARDY=1 or ready for the specific plane), the host 130 can issue a AIPO command to the non-busy specific plane that can be executed. That is, when PxRDY=PxARDY=1, the host 130 can issue a AIPO command to, and the AIPO command can be accepted by, the memory plane 102x.

After the AIPO command is issued to a specific plane (e.g., plane 102a), there are one or more possible options in which the AIPO command in being executed: e.g., option A illustrated in FIG. 6A, and option B illustrated in FIG. 6B. The choice of option A of FIG. 6A or option B of FIG. 6B is implementation specific, and can be based on the circuit design choice of the memory 101.

Option A illustrated in FIG. 6A: The plane ready status of all planes transitions to a busy state for a "short period of time" (PxRDY=0, for x=a, . . . , N) to process the command. The "short period of time" is also referred to herein as "command pre-processing period," which is a first phase of execution of the AIPO command. After this first phase, the plane ready status for the non-operating or non-selected planes (e.g., planes to which the AIPO command is not issued) returns to ready status. Thus, after time t602a at the end of the command pre-processing period, PaRDY=0 for the selected or busy plane Pa to which the AIPO command is issued, and PbRDY, PcRDY and PdRDY=1 for all other non-selected and non-busy memory planes. A length of the command pre-processing period is implementation specific, e.g., is based on a design of the circuits of the memory and other implementation details.

FIG. 6A illustrates an example timing diagram of plane ready signal and array ready signal, in response to receiving a AIPO command 604a, where execution of the AIPO command 604a includes a command pre-processing period during which all planes are in a busy state. Note that in the timing diagram of FIG. 6A and various other figures, a dotted rectangle corresponds to an associated signal being busy, and a non-shaded rectangle corresponds to an associated signal being ready (i.e., not busy), as illustrated in the "Legend" section of FIG. 6A. In FIG. 6A, four memory planes 102a, 102b, 102c, 102d are assumed, although there may be any different number of memory planes. Accordingly, four plane ready signals PaRDY, PbRDY, PcRDY, and PdRDY are illustrated, and four array ready signals PaARDY, PbARDY, PcARDY, and PdARDY are illustrated. In FIG. 6A, prior to time t601a, all signals PaRDY, PbRDY, PcRDY, PdRDY, PaARDY, PbARDY, PcARDY, and PdARDY are in a ready or non-busy state.

At t601a, a AIPO command 604a for plane 102a is received. In the example of FIG. 6A, immediately after receiving the AIPO command 604a for plane 102a, all the plane ready signals and the array ready signals become busy from time t601a to time t602a, which is referred to as the command pre-processing period or a first phase of the execution cycle of the AIPO command 604a.

Subsequently, the plane ready signals and the array ready signals for planes 102b, 102c, and 102d become ready or non-busy at time t602a (e.g., as the AIPO command 604a is issued for memory plane 102a). The PaRDY and PaARDY continue to be busy after time t602a. Thus, the memory plane 102a, including the corresponding memory array 104a, are executing the AIPO command 604a. At time t603a, the memory plane 102a becomes ready to accept new commands, and the PaRDY becomes ready. The time period between time t602a and t603a is also referred to as a second phase of the execution cycle of the AIPO command 604a. Note that background array operations for the AIPO command 604a may still be ongoing in the memory plane 102a, and accordingly, PaARDY is still busy. Finally, the background array operations for the AIPO command 604a end at time t604a, and the array ready signal PaARDY now transitions from busy to ready. The time period between time t603a and t604a, when only background array operations of the AIPO command 604a are being executed, is also referred to as a AIPO background array operation phase or a third phase of the execution cycle of the AIPO command 604a.

Option B illustrated in FIG. 6B: In this option, the plane ready status and the array ready of the selected plane (e.g., for which the AIPO command is issued) becomes busy (PxRDY changes from 1 to 0), and the plane ready status of other non-selected planes is not impacted. Thus, unlike option A discussed above with respect to FIG. 6A, option B lacks the command pre-processing period. FIG. 6B illustrates another example timing diagram of a plane ready signal and an array ready signal, in response to receiving a AIPO command 604b, where execution of the AIPO command 604a lacks any command pre-processing period during which all planes are in a busy state. Contrary to the example of FIG. 6A, in the example of FIG. 6B, only the selected plane (for which the AIPO command 604b is issued) has its plane ready signal and array ready signal (i.e., PaRDY and PaARDY) transition to busy, and signals of all other planes remain ready. Accordingly, PaRDY is busy from t601b to t603b, which is a first phase of the execution cycle of the AIPO command 604b. PaARDY is busy from t601b to t604b (e.g., as also discussed with respect to FIG. 6A), which is the AIPO background array operation phase or second phase of execution cycle of the AIPO command 604b.

Thus, comparing FIGS. 6A and 6B, in FIG. 6A, all plane ready and array ready signals are busy for a short period of time (i.e., during the command pre-processing period) after the AIPO command is issued; whereas in FIG. 6B only the selected plane ready and array ready signals become busy after the AIPO command is issued. FIG. 6B, thus, achieves higher operational efficiency than FIG. 6A, as the non-selected planes are always available in FIG. 6B. However, implementing the timing diagram of FIG. 6B requires more complex circuit in the memory 101, e.g., compared to the case of FIG. 6A. Thus, whether the timing diagram of FIG. 6A and FIG. 6B is achieved is implementation specific, based on the design of the memory 101.

When No Background Array Operation is Ongoing (i.e., PxARDY Ready for all Planes), and a SCO Command is Issued for a Specific Plane In an example, the host 130 can issue a SCO command to the memory 101 when all the memory arrays of the planes are ready (e.g., PxARDY=1 for all planes). After the SCO command is issued, all planes and corresponding arrays become busy (PxRDY=PxARDY=busy for all planes) and no further commands can be issued until all planes become ready (PxRDY=ready for all planes).

Figure 7:
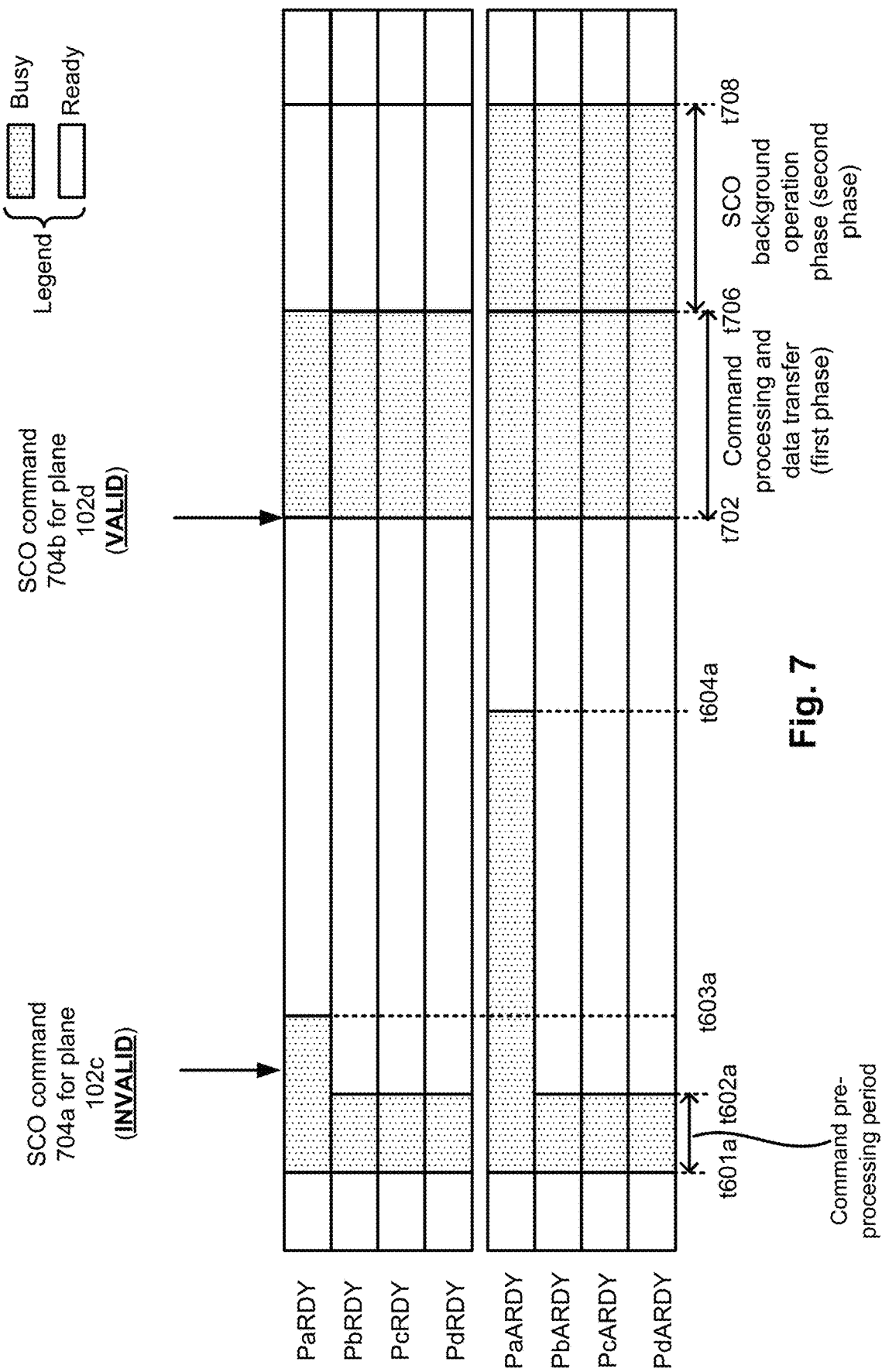
FIG. 7 illustrates an example timing diagram of a plane ready signal and an array ready signal, in response to receiving a SCO command.

FIG. 7 illustrates an example timing diagram of plane ready signal and array ready signal, in response to receiving a SCO command. In this example, similar to FIG. 6A, assume that in response to a AIPO command for plane 102a at time t601a, the PaRDY is busy from t601a to t603a, the PaARDY is busy from t601a to t604a, and the plane and array ready signals for other planes are busy from t601a to t602a, e.g., for reasons discussed with respect to FIG. 6A.

Assume that a SCO command 704a for plane 102c is issued between t602a and t603a. Because at least one plane is not ready at this time (e.g., PaRDY is busy), the SCO command 704a for plane 102c is declared invalid, as the host 130 can issue a SCO command to the memory 101 only when all the planes are ready for the new command and there is no AIPO background array operation.

Assume that a SCO command 704b for plane 102d is issued after time t604a, e.g., at time t702. Because all planes are now ready and there is no ongoing background array operation, the SCO command 704b for plane 102d is executed. All plane and array ready signals transition to busy status from time t702. The plane ready status remains busy from time t702 to t706, where the time period between time t702 and t706 is also referred to as "plane engagement period" or a first phase of the execution cycle of a SCO memory command.

In an example, during the plane engagement period, the SCO engages resources of all the memory planes (or engages common resource of the memory planes), so that no other operation can be executed—hence, the PxRDY for all planes are busy during this period. In an example, during the plane engagement period, the PxRDY for all planes are busy and all the planes are shown to be engaged, to avoid any command input until the memory 101 is ready for next command. Note that any AIPO (or SCO) command issued during the plane engagement period is declared invalid (as also discussed with respect to FIG. 19A herein later).

At time t706, the cache operations associated with the SCO command 704b for plane 102d may be completed, and accordingly, the plane ready signal may be ready for all planes from time t706 (e.g., PxRDY=ready, for x=a, . . . , d). However, as background array operations may be ongoing in the selected plane 102d, all the array ready signals for all planes are still busy (e.g., PxARDY=busy, for x=a, . . . , d). At time t708, the SCO command 704b for plane 102d may be completed, and accordingly, all the array ready signals for all planes become ready (e.g., PxARDY=ready, for x=a, . . . , d).

Thus, during time period between time t706 and time t708, array ready signals are busy for all planes, while the plane ready signals are ready for all planes. This period is referred to herein as the SCO background array operation phase or a second phase of the execution cycle of a SCO command.

When Background Operation is Ongoing (i.e., PxARDY=Busy) for at Least One Plane, and a AIPO Command is Issued for a Specific Plane that does not have an Ongoing Background Operation Assume that a background operation is ongoing for at least one plane, such as plane 102a, i.e., PaARDY=0 (e.g., busy) for that plane. One or more other planes (such as at least plane 102b) does not have ongoing background operations (e.g., PbRDY=PbARDY=1 or ready). That is, the one or more other planes (such as at least plane 102b) are non-operating or non-busy planes. In such a scenario, the host 130 can issue a AIPO command to the non-operating plane.

FIG. 8A illustrates an example timing diagram depicting issuance of a AIPO memory command to a non-operating plane, while another operating plane has ongoing background operations, where the AIPO memory command of FIG. 8A causes a command pre-processing period. For example, in FIG. 8A, just prior to time t802a, a background array operation was ongoing in plane 102a (i.e., PaARDY=busy), and other planes were ready (e.g., PyRDY=PyARDY=ready, where y=b, c, d). At time t802a, a AIPO command 804 for plane 102b is issued by the host 130. Accordingly, from t802a to t803a, PxRDY and PxARDY (where x=a, . . . , d) all planes become busy for a short period of time (i.e., the command pre-processing period). After the command pre-processing period (discussed with respect to FIG. 6), PaRDY, PcRDY, PdRDY, PcARDY, and PdARDY transitions to ready. PbRDY and PbARDY remain busy, due to execution of the AIPO command 804 for plane 102b. PaARDY remains busy, due to execution of a prior AIPO command for plane 102a.

FIG. 8B illustrates another example timing diagram depicting issuance of a AIPO memory command to a non-operating plane, while another plane has ongoing background operations, where the AIPO memory command of FIG. 8B does not cause any command pre-processing period. FIG. 8B is similar to FIG. 8A—the difference between these two figures is that in FIG. 8B, after issuance of the AIPO command 804 for plane 102b at time t802b, only the signals for the plane 102b becomes busy. Thus, FIG. 8B lacks any the command pre-processing period. Accordingly, signals corresponding to the non-selected planes does not become busy, as also discussed with respect to FIG. 6B.

When AIPO Background Array Operation is Ongoing (i.e., PxRDY=Ready and PxARDY=Busy) in a Specific Plane, and a AIPO Command is Issued for the Specific Plane which has the Ongoing Background Array Operation Assume that a background array operation is ongoing for at least one plane, such as plane 102a, i.e., PaRDY=1 (e.g., ready) and PaARDY=0 (e.g., busy) for that plane. In such a scenario, the host 130 can issue a selected (but not all) AIPO command to the plane having the background array operation.

Figure 9:
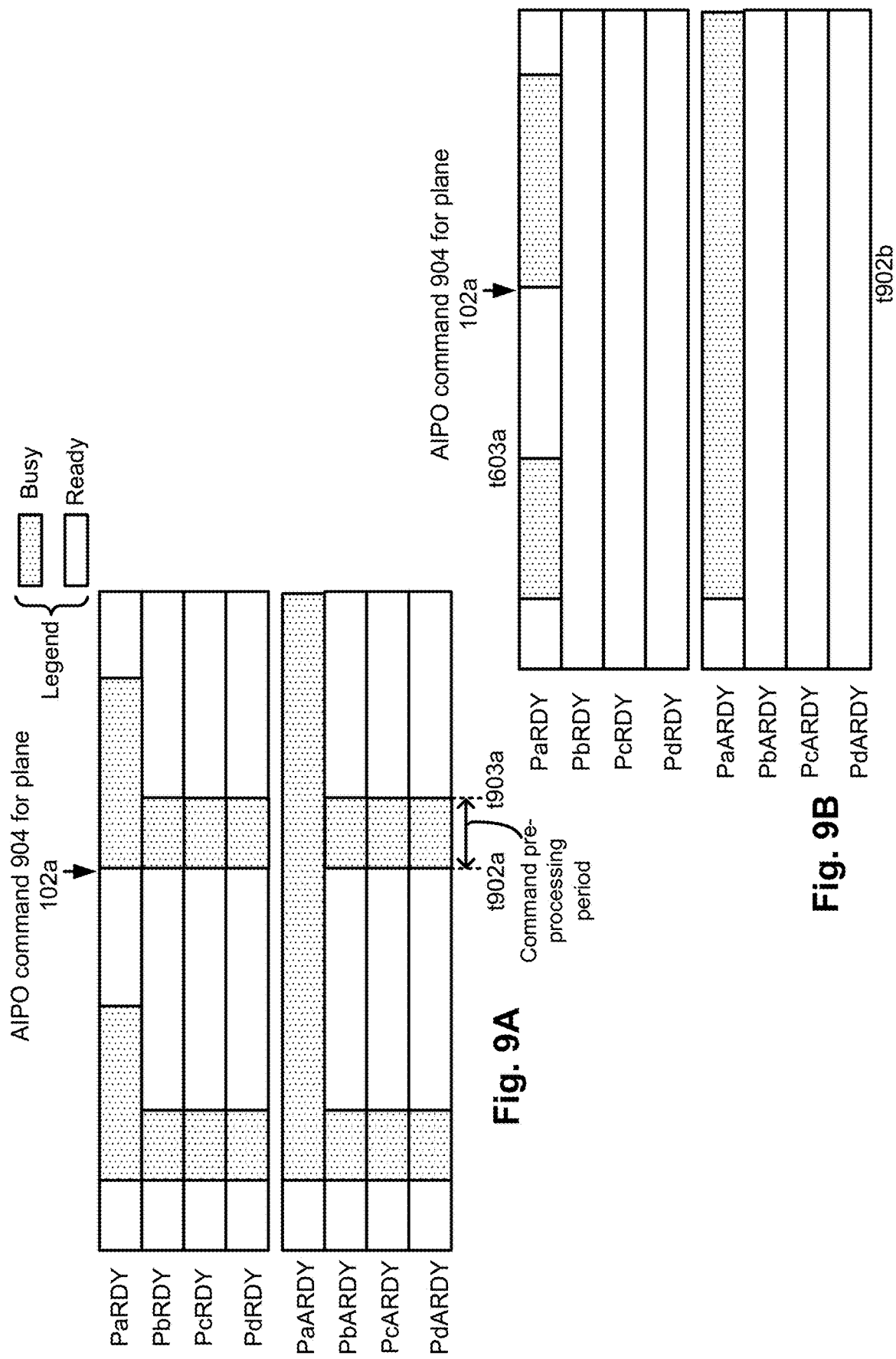
FIGS. 9A and 9B illustrate example timing diagrams depicting issuance of AIPO memory commands to a plane that has ongoing background array operations.

FIG. 9A illustrates an example timing diagram depicting issuance of a AIPO memory command to a plane that has ongoing background array operations. For example, in FIG. 9A, just prior to time 902a, a background array operation was ongoing in plane 102a (i.e., PaRDY=ready, PaARDY=busy), and other planes were ready (e.g., PyRDY=PyARDY=ready, where y=b, c, d). At time 902a, a AIPO command 904 for the plane 102a is issued by the host 130. Accordingly, from time t902a to t903a, PxRDY and PxARDY (where x=a, . . . , d) become busy for a short period of time (i.e., command pre-processing period). After the short period of time (discussed with respect to FIG. 6A), PbRDY, PcRDY, PdRDY, PbARDY, PcARDY, and PdARDY transition to ready. PaRDY and PaARDY remain busy, due to execution of the AIPO command 904 for plane 102a.

FIG. 9B illustrates another example timing diagram depicting issuance of a AIPO memory command to a plane that has ongoing background array operations. FIG. 9B is similar to FIG. 9A—the difference between these two figures is that in FIG. 9B, after issuance of the AIPO command 904 for plane 102a at time t902b, only the signals for the plane 102a become busy (e.g., FIG. 9B lacks the command pre-processing period). Signals corresponding to the non-selected planes do not become busy for the short period of time, as also discussed with respect to FIG. 6B.

Note that in FIGS. 9A and 9B, only some selected types of AIPO memory commands may be allowed, such as those commands that can be co-executed with the previous background array operations that were keeping the plane 102a busy prior to time t902a. Examples of some such selected AIPO memory commands include cache read commands. For example, as seen in Table 2, a cache read command is a AIPO memory command that can co-execute with a background array operation. Accordingly, the operation command 904 of FIGS. 9A and 9B can be, for example, a cache read command.

However, there are some other example AIPO memory commands that cannot be issued to a plane that has ongoing background array operations. For example, as seen in Table 2, a page read command is a AIPO memory command that cannot co-execute with a background array operation. Accordingly, the operation command 904 of FIGS. 9A and 9B cannot be, for example, a page read command.

There are some commands (e.g., system management commands, see Table 2) which can be issued at any time. One example of such commands is a reset command, which can be issued any time t0 terminate ongoing operations in one or more planes.

Figure 10:
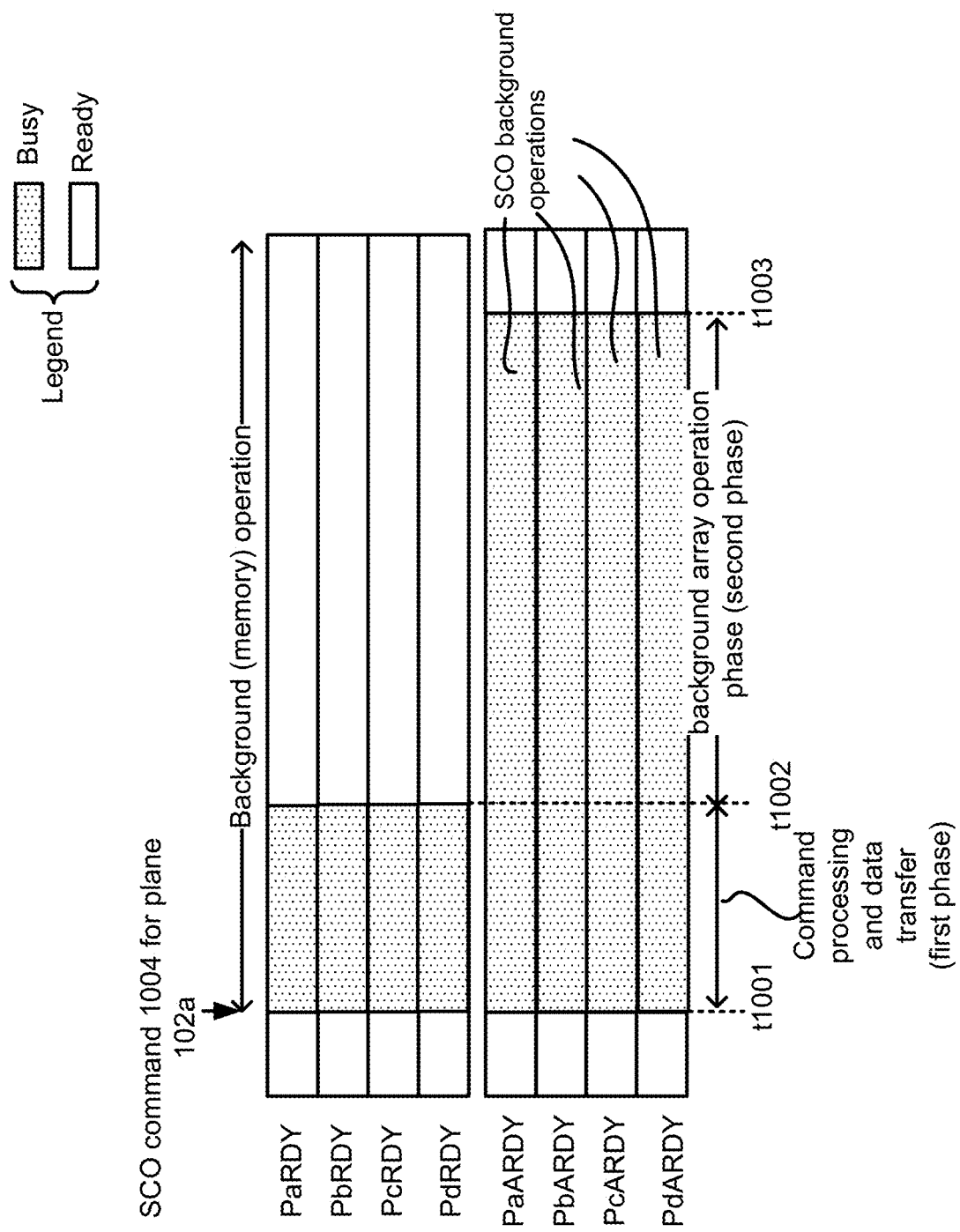
FIG. 10 illustrates a timing diagram depicting issuance of a SCO memory command, and resultant SCO background operations.

Execution of SCO, and AIPO Background Array Operations Versus SCO Background Array Operation FIG. 10 illustrates a timing diagram depicting issuance of a SCO memory command, and resultant SCO background array operations. For example, at time t1001, a SCO command 1004 for plane 102a is issued by the host 130. PxRDY signals for all planes become busy between time period t1001 and t1002, also referred to herein as a plane engagement period or the first phase of the execution cycle of the SCO memory command (see FIG. 7). Phase 1 can include command processing, and data transfer between the page buffer and the cache. In phase 1, PRDY & PARDY=0 (busy) because the cache is busy and the host can't read/write the data in the cache. After Phase 1, the cache is free and the host can read/write the data in the cache, so PRDY returns to 1 and PARDY remains in 0. Thus, subsequent to time t1002, PxRDY signals for all planes transition to ready status. However, the array ready signal PxARDY for all planes remains busy, until the SCO is completed at t1003, e.g., as discussed with respect to FIG. 7. As also discussed with respect to FIG. 7, the time period between time t1002 and t1003 is referred to as the background array operation phase, or phase 2 in which the operation can be a read or a write.

Note that during the SCO background array operation phase of a SCO memory command, the PxARDY for all planes is busy, as illustrated in FIG. 10. In contrast, for a AIPO, a corresponding AIPO background array operation phase (see FIG. 6A) keeps the PxARDY busy for only the selected plane (i.e., for which the AIPO has been issued), as illustrated in FIGS. 6A and 6B.

Thus, SCO background array operations are associated with SCO memory commands, and any such operations would engage all the planes (i.e., PxARDY=busy for all planes), as illustrated in FIG. 10. In contrast, AIPO background array operations are associated with AIPO memory commands, and any such operation would engage a specific plane (i.e., PxARDY=busy for a specific plane), as illustrated in FIGS. 6A and 6B.

Figure 11:
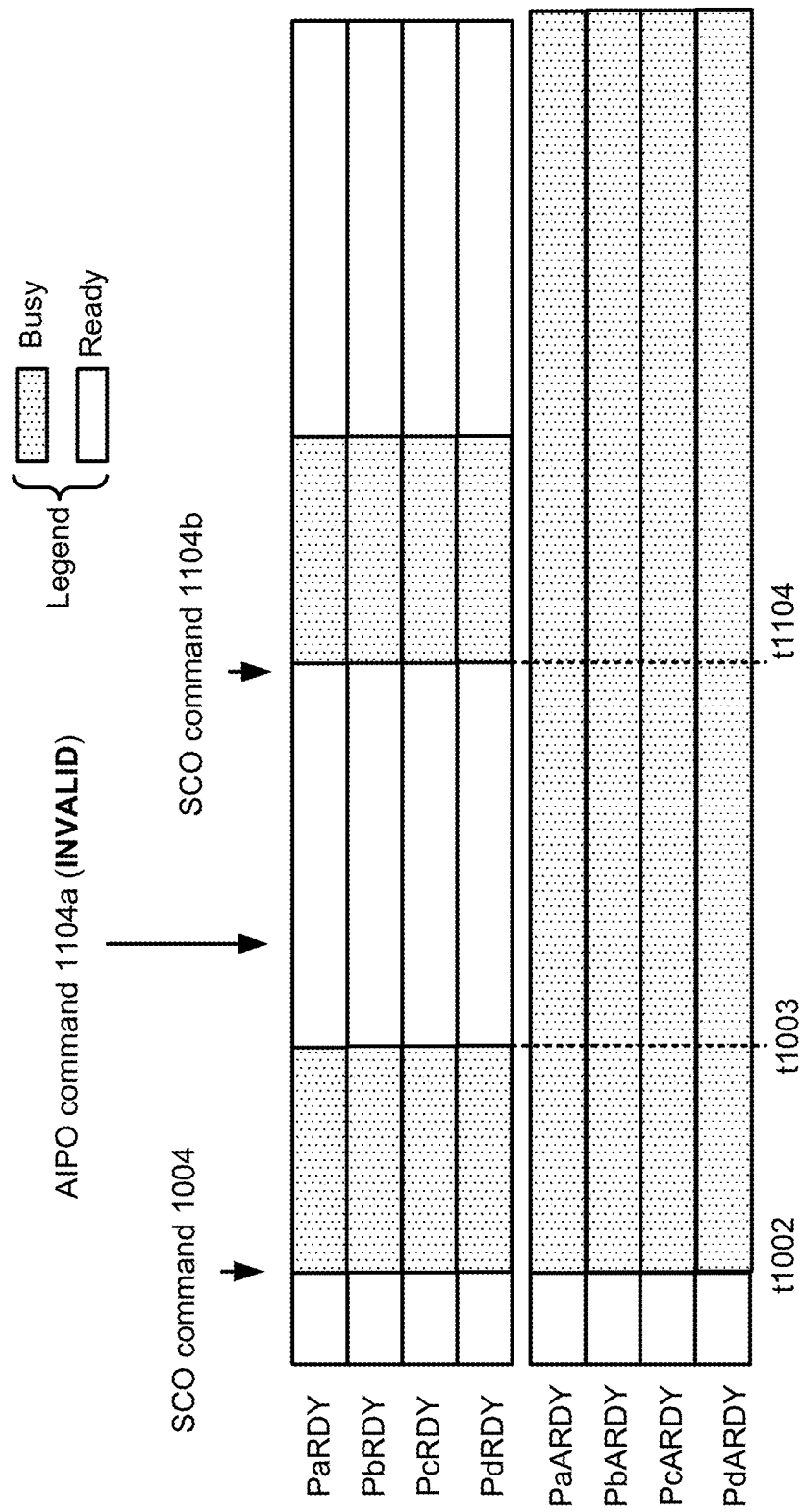
FIG. 11 illustrates an example timing diagram depicting ongoing SCO background array operations, and issuance of a AIPO command and issuance of a SCO command.

When SCO Background Array Operations are Ongoing (i.e., PxRDY=Ready and PxARDY=Busy for all Planes), and (i) a AIPO Command is Issued (which Becomes Invalid) and (ii) a SCO Command is Issued FIG. 11 illustrates an example timing diagram depicting ongoing SCO background array operations (see FIG. 10 for SCO background array operation examples, i.e., PxRDY=ready and PxARDY=busy for all planes), and issuance of a AIPO command 1104a and issuance of a SCO command 1104b.

Note that when SCO background array operations are ongoing (see FIG. 10 for further discussion of SCO background array operations), the host 130 can only issue selected operation commands. For example, when SCO background array operations are ongoing, the host 130 may not issue a AIPO command 1104a, and hence, the AIPO command 1104a of FIG. 11 is declared invalid. This shows an example of a method in which, while the memory is executing a first type memory command to engage multiple planes simultaneously (e.g. an SCO command), receiving, by the memory, a second type of memory command (e.g. an AIPO command); and denying execution of the second type of memory command, in response to receiving the second type of memory command during execution of the first type of memory command. However, when SCO background array operations are ongoing, the host 130 may validly issue the SCO command 1104*b* at t1004, as illustrated in FIG. 11. Status of the various signals after time t1104, as illustrated in FIG. 11, have already been discussed with respect to FIG. 10.

Cache Operations

In an embodiment, the cache 112 are used as a data unit which the host 130 can access directly. In an example, the memory 101 provides the cache read and cache program functions, which perform data transfer between page buffer and cache. After the data transfer operation between page buffer and cache is complete, the host 130 can access a cache 112 while the memory read/write operation may still be ongoing.

Cache Read

Figure 11A:
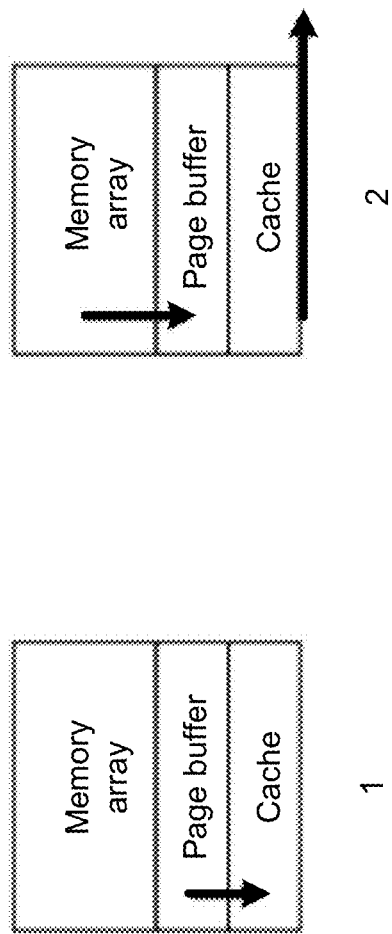
FIG. 11A illustrates various steps associated with a cache read operation.

FIG. 11A illustrates various steps associated with a cache read operation. Note that cache read is a AIPO operation. Accordingly, at step 0 (not illustrated in FIG. 11A), after a cache read command is issued, the memory 101 waits until the last cache operation in the selected plane is finished, to begin the new operation in the selected plane. The selected plane becomes busy after the cache read command is issued (e.g., PxRDY transitions from 1 to 0).

At step 1 illustrated in left side of FIG. 11A, data is transferred from the page buffer to the cache, where the data is read from the memory array to the page buffer during a previous command. During this period, the plane remains busy (e.g., PxRDY=0).

At step 2 illustrated in right side of FIG. 11A, after the data transfer from the page buffer to the cache is complete, the plane is ready and can accept the new command (PxRD transitions from 0 to 1), and the host 130 can access the cache for the current data. Also during this time, new data is read from memory array to the page buffer in the background (PxARDY=0). Thus, during step 2, new data is transferred from memory array to page buffer, concurrently with current data being transferred from the cache to the host 130. The host 130 can issue another cache read command to the plane after the current data in the cache is read out, even though the current background array operation is not finished.

Cache Program

Figure 11B:
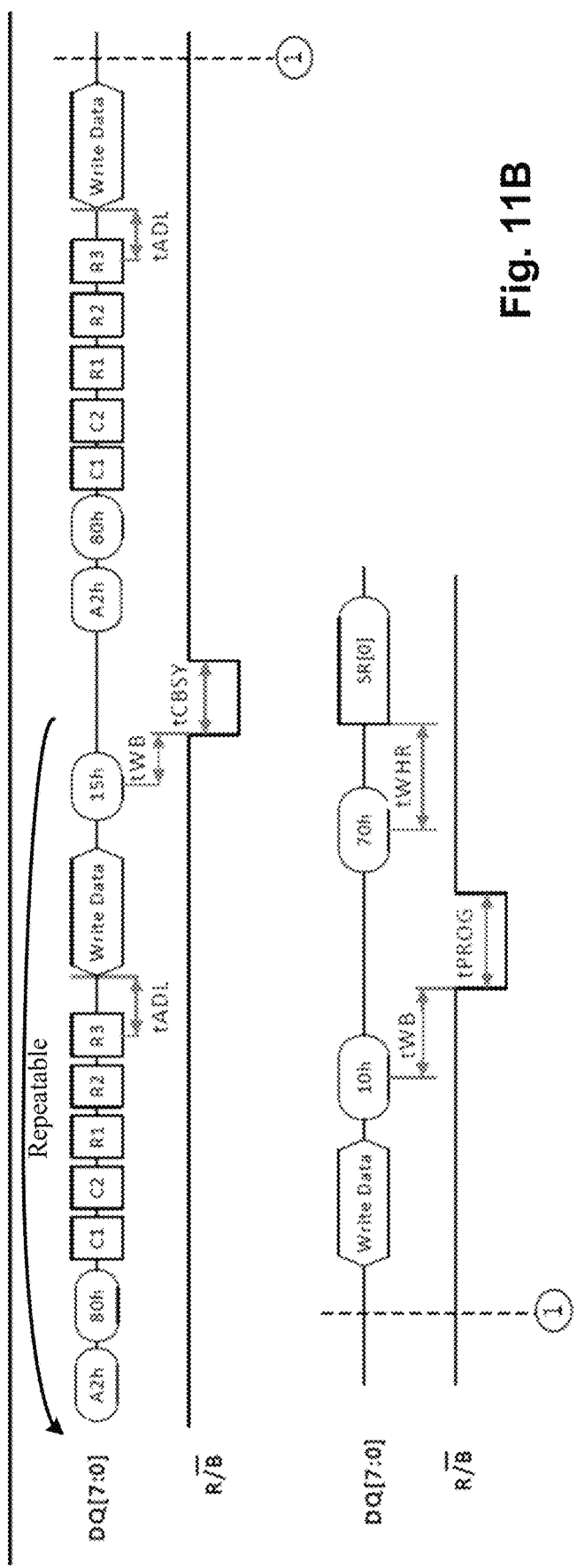
FIGS. 11B and 11C illustrate timing diagram and various steps associated with a cache program operation.
Figure 11C:
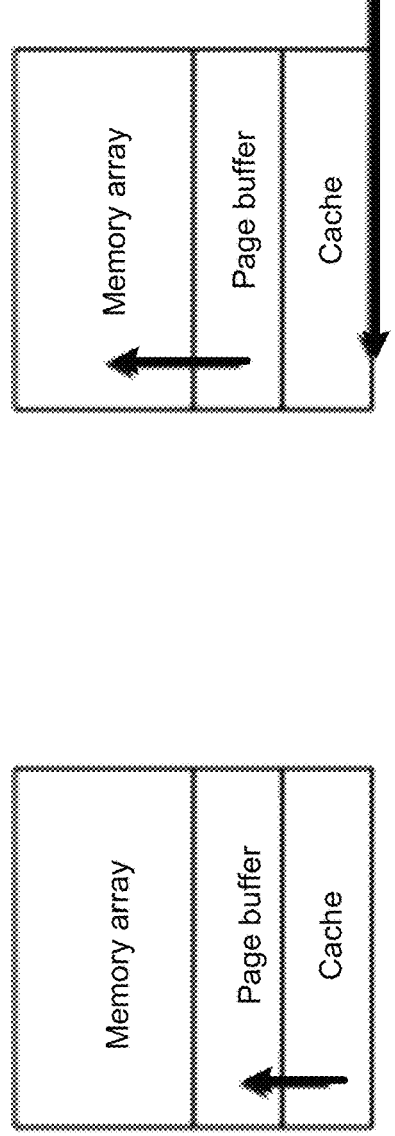

FIGS. 11B and 11C illustrate timing diagram and various steps associated with a cache program operation. In an embodiment, the cache program operation may program one page data. At step 0 (not illustrated in FIG. 11C), after the cache program command (15*h* in the example of FIG. 11B) is issued, the memory 101 waits until the page buffer is free for the data transfer (SCO in current example) to begin the new operation. The memory 101 becomes busy after the cache program command is issued (e.g., all PxRDY transitions from 1 to 0).

At step 1 illustrated in the left side of FIG. 11C, data is transferred from the cache to the page buffer. During this period, the memory remains busy, and all PxRDY=0, for x=a, . . . d.

At step 2 illustrated in the right side of FIG. 11C, after the data transfer from the cache to the page buffer is complete, the plane is ready and can accept the new command (e.g., PxRDY transitions from 0 to 1), and the host 130 can write new data to the cache. While the host 130 is writing data to the cache, data written to the page buffer in step 1 is being programmed from page buffer to the memory array in the background (i.e., PxARDY=0). The host 130 can issue another cache program command (command code is 15*h* in FIG. 11B) or page program command (command code is 10*h* in FIG. 11B) to the chip after the data input to the cache is done, even though the current background array operation is not finished.

Summarizing Memory Plane Ready Status Signal (PxRDY) and Memory Array Ready Status Signal (PxARDY)

In an embodiment, the host 130 may check the plane busy status (PRDY and PARDY) for operation. To simplify the host operation scheme, the host 130 may merely check the plane busy status for operation.

If there is no ongoing operation in any plane of the memory 101 (all PxRDY and PxARDY=1), the host can issue any commands to the chip.

If there is AIPO operation ongoing in the memory 101, the host 130 has to check the PxRDY and PxARDY of the selected plane. If the selected plane is idle (PxRDY and PxARDY=1, where 102*x* is the selected plane), the host can issue any AIPO command to the selected plane. If the selected plane is busy (PxRDY and PxARDY=0, where 102*x* is the selected plane), the host 130 cannot issue any command to the selected plane 102*x*. If the selected plane is ready but there is background array operation (i.e, PxRDY=1 and PxARDY=0, where 102*x* is the selected plane), the host 130 can issue selected AIPO command to the selected plane.

If there is an ongoing SCO operation in the chip, the host 130 has to check the PxRDY and PxARDY of the selected plane. If the selected plane is busy (i.e., PxRDY and PxARDY=0, where 102*x* is the selected plane), the host can't issue any command that will be accepted by the selected plane. If the selected plane is ready but there is background array operation (PxRDY=1 and PxARDY=0, where 102*x* is the selected plane), the host can issue only selected SCO or AIPO command (but not all SCO or AIPO command) to the selected plane.

In an embodiment, the system management command can be issued to the chip any time.

FIG. 11D illustrates a table 1190 that summarizes usage of the PxRDY and PxARDY for various memory operations, some of which are discussed herein above.

As discussed herein earlier, each plane has its own ready status—PxRDY and PxARDY. Thus, the ready status for individual memory planes includes two status bits, one each for PxRDY and PxARDY.

The PxRDY dictates whether the plane can execute the next command input. For a given memory plane, if PxRDY is busy (PxRDY=0), this plane may not accept further commands. On the other hand, if PxRDY is ready (PxRDY=1), this plane may selectively accept a new command (or may not accept new commands), based on the type of command, and other status signals of other planes.

In an example, the memory 101 can accept a SCO operation command when all planes are ready (all PxRDY=1 and PxARDY=1), as discussed herein earlier.

In an example, the memory 101 can accept a AIPO operation command for a specific plane, when the selected specific plane is ready (PxRDY=1) and the planes are not under SCO background array operations (e.g., see FIG. 11, where the AIPO operation command 1104*a* is invalid).

When the planes are undergoing SCO background array operations (e.g., PxRDY=1 and PxARDY=0 for all planes, see FIG. 11), only limited or selected types of new commands may be accepted. AIPO operation commands may not be included in these limited or selected types of commands (e.g., see FIG. 11, where the AIPO operation command 1104*a* is invalid).

As discussed, the PxARDY provides plane ready status for corresponding memory array operations. If PxARDY is busy (PxARDY=0) for a specific plane, memory array operation of this plane is still ongoing that accesses the array in the plane, such as by engaging the bit lines and word lines in the array. If PxARDY is ready (PxARDY=1) for a specific plane, the plane is not undergoing any memory array operation.

Read Plane Busy Status (RPBS) Command

In an example, the host 130 can read out the plane status signals (e.g., PxRDY and/or PxARDY) via one or both of a read plane busy status (RPBS) command and a read status enhanced (RSE) command (the RSE command is discussed in the next section herein).

In an embodiment, the RPBS command reports the plane status signals, such as the PxRDY and PxARDY, for all planes in the memory 101. For example, for a four-plane memory comprising memory planes 102a, 102b, 102c, 102d, the RPBS command reports the plane status signals PxRDY and PxARDY, where x=a, . . . , d.

FIG. 12A illustrates bits of a read plane busy status (RPBS) register for a four-plane memory comprising memory planes 102a, 102b, 102c, 102d. The RPBS register, for example, is one of the status registers 140 of FIG. 1. Thus, FIG. 12A illustrates status bit definitions for the RPBS signal, for a four-plane scenario. FIG. 12B illustrates issuance of the RPBS command by the host 130, and the RPBS output to the host 130 including contents of the corresponding status register SR.

Figure 8:
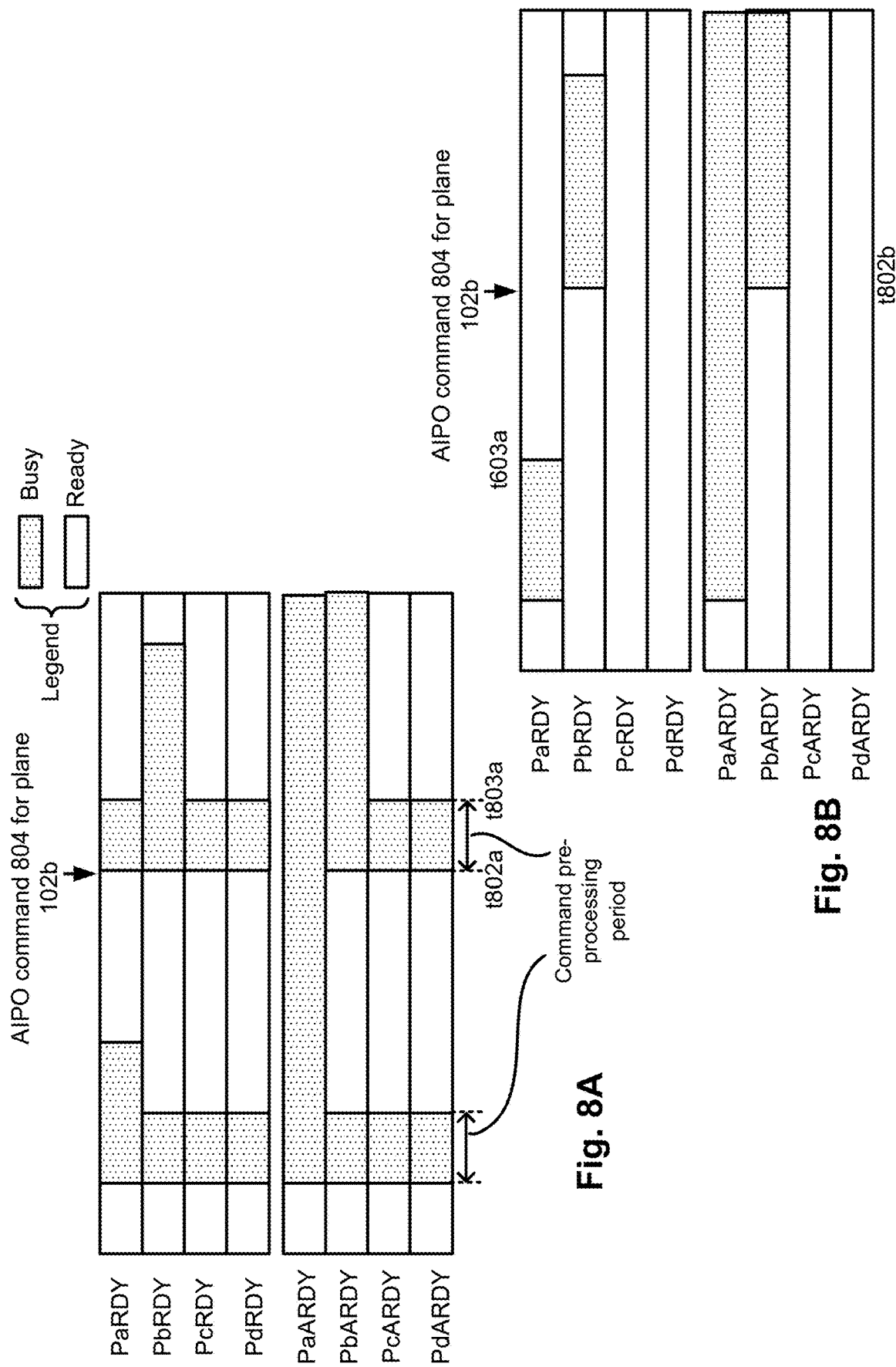
FIG. 8A illustrates an example timing diagram depicting issuance of a AIPO memory command to a non-operating plane, while another operating plane has ongoing background operations, where the AIPO memory command of FIG. 8A causes a command pre-processing period.
FIG. 8B illustrates another example timing diagram depicting issuance of a AIPO memory command to a non-operating plane, while another plane has ongoing background operations, where the AIPO memory command of FIG. 8B does not cause any command pre-processing period.

As seen in FIG. 12A, 8 bits of the RPBS signal are used to convey the PxRDY and PxARDY for x=a, . . . , d. The host 130 receives the RPBS signal, and becomes aware of the various busy/ready status associated with various planes. For example, bit 7 of the RPBS represents PdRDY— if bit 7 is 0, then PdRDY is 0 or busy; and if bit 7 is 1, then PdRDY is 1 or ready.

In some embodiments of a memory device, control signals are provided, including a memory chip enable (CE #) signal, which is an active low signal; a write enable (WE #) signal, which is an active low signal; and a read enable (RE #) signal, which is an active low signal. Also, a data input/output (I/O) port signal can be transmitted between the host 130 and the memory 101. The host 130 transmits a command (CMD) requesting the RPBS (e.g., during which the WE # is low, which enables the host 130 to write or transmit data to the memory 101). In response, the memory 101 outputs data from a status register (SR) including the 7-bit RPBS (e.g., during which the RE # is low, which enables the host 130 to read the SR, including PxRDY and PxARDY status signals from the memory 101 for use in coordination of the memory operations).

Read Status Enhanced (RSE) Command

In contrast to the RPBS command that reports the status of all planes in the memory, the RSE command reports the status of a specific plane.

Figures 13A, 13B:
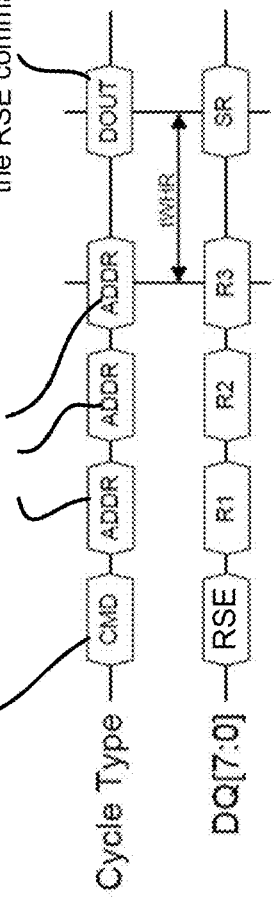
FIG. 13A illustrates bits of a Read status enhanced (RSE) command register for a specific memory plane.
FIG. 13B illustrates issuance of the RSE signal and the RSE command waveform.

FIG. 13A illustrates bits of Read status enhanced (RSE) command register for a specific memory plane (e.g., plane 102x, where x can be any of a, . . . , N). FIG. 13B illustrates issuance of the RSE signal and the RSE command waveform. The RSE command register is one of the status registers 140 of FIG. 1.

The host 130 receives the RSE signal (i.e., contents of the RSE command register), and becomes aware of the various busy/ready statuses associated with the corresponding plane.

Referring to FIG. 13A, bits 0 and 1 of the RSE signal, respectively, indicate PxFAIL and PxFAILC, where PxFAIL is a plane x PASS/FAIL status for the last command issued to plane 102x, and PxFAILC is a Plane x PASS/FAIL status for the command issued prior to the last command to plane 102x. Bits 2, 3, and 4 are reserved for future use. Bits 5 and 6, respectively, are the PxARDY and PxRDY for the plane 102x. Bit 7 is WP #, providing a chip protection status bit (e.g., which is not directly memory plane related).

Referring to FIG. 13B, the DQ bus provides the row address (R1~R3), to indicate the specific plane 102x for which the RSE command is being issued. The RSE status register is output to the host 130 after time period tWHR has elapsed from issuing the row address R1-R3.

The system 100 of FIG. 1 may support either or both the RPBS command and the RSE command, to read the plane busy status. As discussed with respect to FIGS. 12A and 13A, the RPBS command reports the busy/ready status of all planes, while the RSE command reports the busy/ready status and the pass/fail status for a specific plane.

Plane Ready Notice (PRN or PRN #) Pin

The previously discussed RPBS or the RSE registers are used to indicate the PxRDY and PxARDY status for various planes, and contents of these registers can be received by the host 130 upon request from the memory 101. In some embodiments, the memory 101 includes hardware pins to indicate a change in the PxRDY and/or PxARDY status for various memory planes.

Figure 14A:
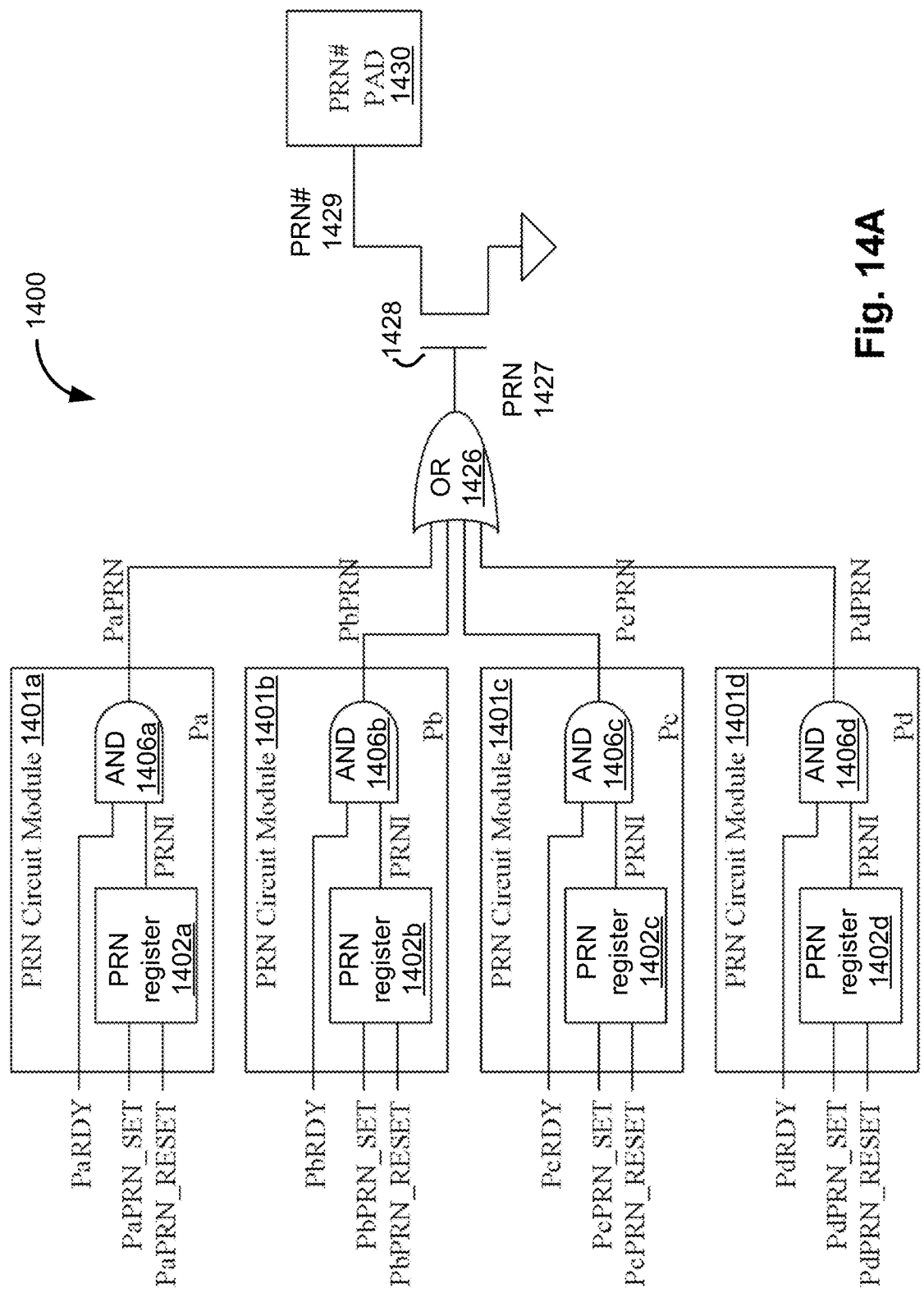
FIG. 14A illustrates a circuit to generate a plane ready notice (PRN or PRN #) pin for the memory of FIG. 1.

FIG. 14A illustrates a circuit 1400 to generate a plane ready notice (PRN or PRN #) pin for the memory 101 of FIG. 1. The circuit 1400 assumes that there are four memory planes 102a, 102b, 102c, 102d, and, accordingly, generates four plane-PRN signals PaPRN, PbPRN, PcPRN, and PdPRN corresponding to the four memory planes 102a, 102b, 102c, 102d. However, as would be readily understood by those skilled in the art, the memory 101 may have any different number of memory planes, and the circuit 1400 can be easily modified to accommodate a different number of memory planes.

In an embodiment, each plane has a corresponding plane specific PRN pin (e.g., also referred to herein as plane-PRN, such as PxPRN), as illustrated in FIG. 14. The PxPRN pins corresponding to the multiple memory planes are then used, in combination, to generate the PRN 1427, which is then inversed to generate the PRN #1429. Although the example implementation of FIG. 14 illustrates the circuit 1400 outputting the PRN #1429, in an example, the circuit 1400 can also output PRN 1427 instead.

In an embodiment, the PRN 1427 and/or PRN #1429 provides an indication to the host 130 to take action, e.g., after at least one plane has returned to ready, and the host 130 can clear the PRN # notice information by RSE or RPBS command. For example, whenever PxRDY of at least one plane transitions from busy to being ready, the host 130 gets notified via the PRN and/or PRN # pin (e.g., the PRN #1429 transitions to a "notice state"). The host 130 can then receive further information regarding which PxRDY has transitioned to ready via the previously discussed RSE and/or RPBS command. Upon issuance of the RSE and/or RPBS command, the PRN # signal clears, and the PRN #1429 transitions to an "idle state".

As illustrated in FIG. 14, there is a PRN circuit module 1401 corresponding to each plane of the memory 101 (e.g., PRN circuit module 1401a corresponding to plane 102a, PRN circuit module 1401b corresponding to plane 102b, and so on). Example PRN circuit module 1401a corresponding to plane 102a is discussed below in further detail, and the same discussion applies to other PRN circuit modules 1401b, 1401c, and 1401d.

The PRN circuit module 1401*a* receives the PaRDY signal. The PRN circuit module 1401*a* further comprises a PRN register 1402 receiving a PaPRN_Set signal, which is a PRN set signal for plane 102*a*. The PRN register 1402 also receives PaPRN_ReSet signal, which is a PRN reset signal for plane 102*a*. An output of the PRN register 1402*a* and the PaRDY signals are input to an AND gate 1406*a*.

In an embodiment, the plane-PRN signal PaPRN for the plane 102*a* is set to "1" (i.e., notice state) if PaRDY=1 (ready) and the PRN register (1402*a*) is set to 1 (PRNI=1). Thus, the PRN register is set (PRNI=1) during the busy period (PaRDY=0) and the PaPRN changes from "0" (i.e., idle state) to "1" (i.e., notice state) after the PaRDY changes from 0 (busy) to 1 (ready), e.g., to notify the host 130 about the transition of the PaRDY to ready status.

The plane-PRN state (i.e., PxPRN) is cleared to "0" (idle state) by the RSE or RPBS command if PxRDY=1 (ready) for the plane. The plane-PRN state is also cleared to "0" (idle state) if PxRDY=0 (busy) to avoid the case that PRN=1 but all PxRDY=0 if the host does not clear the PRN registers. The PaPRN_SET and PaPRN_ReSET signal selectively sets or resets the PRN register 1402*a* for PaPRN for the plane 102*a*. For example, the PRN register 1402*a* for PaPRN is cleared to "0" by the PaPRN_ReSET signal, in response to the host issuing a RSE or RPBS command, to know a current state of the PaRDY.

All the state-PRN pins (e.g., PaPRN, PbPRN, PcPRN, and PdPRN) are OR'ed by the OR gate 1426, to generate the PRN 1427. The PRN 1427 signal is amplified and inversed by the transistor 1428, to generate the PRN # signal at the PRN # pad 1430 (e.g., which can be coupled to a hardware pin 142 of FIG. 1). For example, PRN 1427=(P0PRN OR P1PRN OR P2PRN OR P3PRN). Also, PRN # pin=inverse of PRN. PRN # pin is an open-drain type pin in this example.

Thus, PRN # pin=0 (i.e., in a notice state) if plane-PRN state of any plane (such as PaPRN, PbPRN, PcPRN and/or PdPRN) is 1 (i.e., in a notice state). Note that PxPRN (where x=a, b, c, or d) is in the notice state, when the corresponding PxRDY state transitions from busy to ready.

The PRN # pin is 1 (i.e., in an idle state) if plane-PRN the states of all planes (i.e., PaPRN, PbPRN, PcPRN and PdPRN) are 0 or at an idle state. As discussed, the plane-PRN state of a plane is idle when a corresponding notice of the state has been cleared by the host (e.g., by issuing the RSE or RPBS command).

Figure 14B:
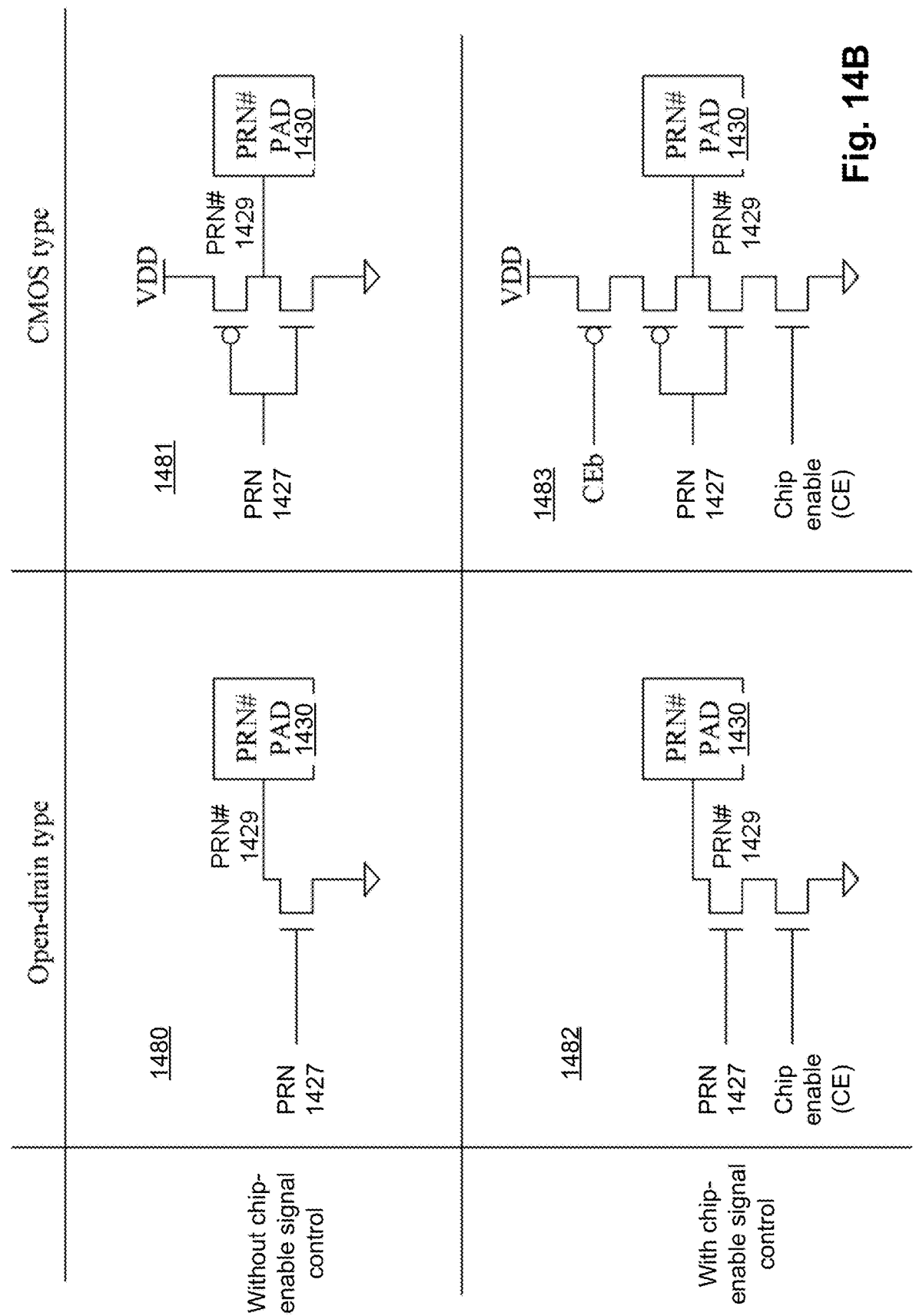
FIG. 14B illustrates various alternate configurations of the circuit of FIG. 14A.

FIG. 14B illustrates various alternate configurations of the circuit 1400 of FIG. 14A. Specifically, FIG. 14B illustrates four different configurations, 1480, 1481, 1482, and 1483, to generate the PRN #1429 from the PRN 1427. The configurations 1480 and 1481 do not have chip-enable signal (CE) control, whereas the configurations 1482 and 1483 have chip-enable signal (CE) control. The configurations 1480 and 1482 are of open-drain type, whereas the configurations 1481 and 1483 are CMOS (Complementary metal-oxide-semiconductor) type. In an example where the CE is used, this can be used to identify the active die in multi-die applications, e.g., where the PRN # pads may be bonded together to one channel.

Figure 15:
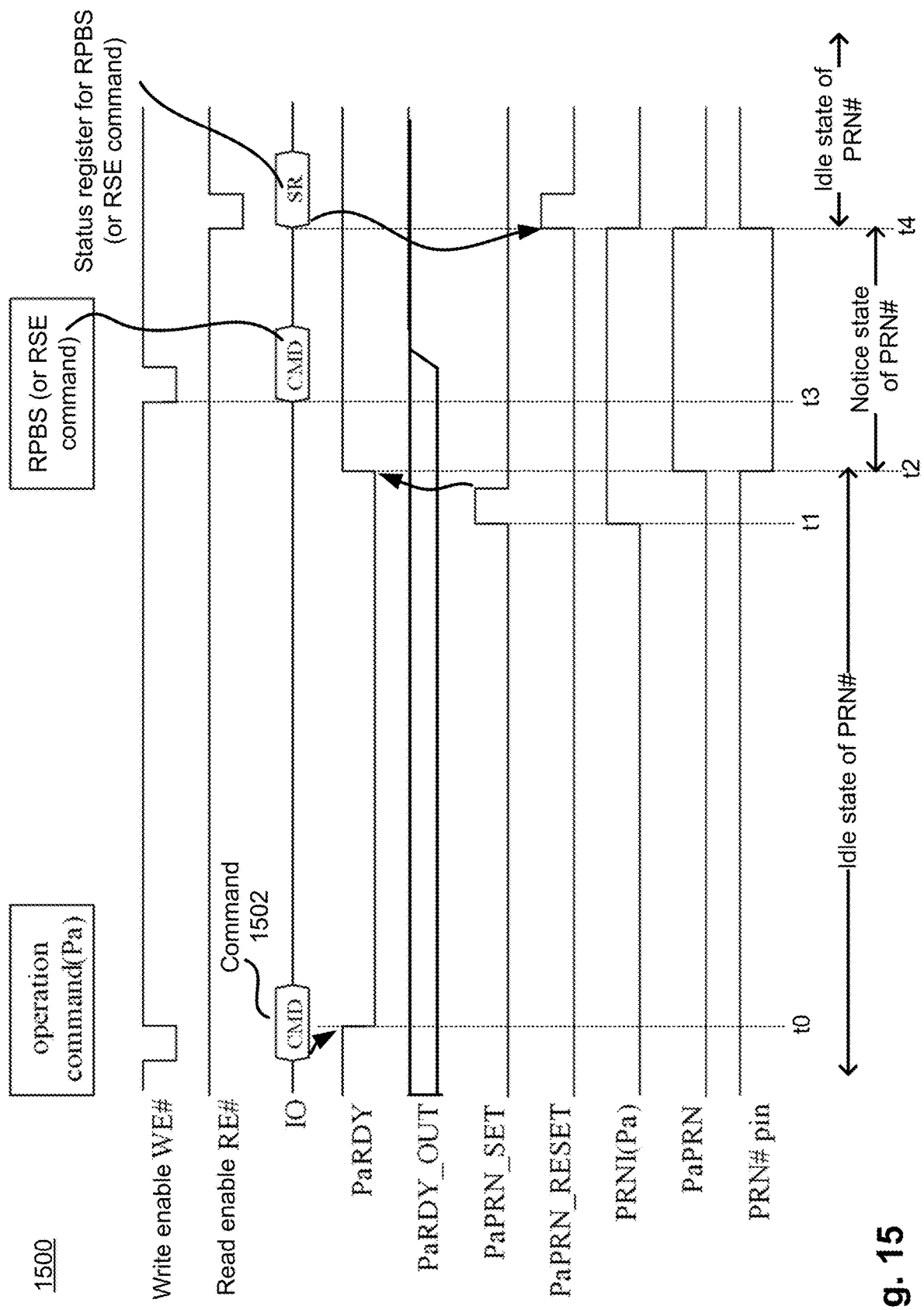
FIG. 15 illustrates a timing diagram depicting generation of the PRN # signal of FIG. 14A.

FIG. 15 illustrates a timing diagram 1500 depicting generation of the PRN #1429 signal of FIG. 14A. At time t0, PaRDY transitions to a low or busy state, e.g., due to the plane 102*a* receiving a memory command 1502 (e.g., see FIG. 6A depicting the PaRDY getting busy). The memory command that causes the PaRDY to transition to busy may be a command 1502.

At time t1, the PaPRN_SET signal outputs a pulse, to indicate that the plane 102*a* is ready, which resets the PaRDY from busy to ready at time t2. A signal PRNI(Pa) transitions to high or notice state, upon receiving the pulse of the PaPRN_SET signal.

Note that between time t0 to t2, the PaPRN (see FIG. 14) and the PRN # does not provide any notice (i.e., are in idle state), as the PaRDY has not transitioned from busy to ready.

At time t2, upon the PaRDY signal transitioning to being ready or 1, the plane-PRN PaPRN (see FIG. 14) transitions to 1 or notice state. Accordingly, PRN 1427 (see FIG. 14, not shown in FIG. 15) also goes high from time t2, e.g., as the OR gate 1426 causes the PRN 1427 to go high, due to the transition of the PaPRN to high. As PRN #1429 is inverse of PRN 1427, at time t2, PRN #1429 goes low or to a notice state. Thus, from time t2, the PRN 1427 and the PRN #1429 issues a notice that at least one PxPRY signal has transitioned to a ready state.

At time t3, the host 130 issues a RPBS (or an RSE) command. The status register SR of the RPBS command is output at time t4 to the host 130. Accordingly, at time t4, the PaPRN_ReSET (see FIG. 14) issues a pulse, indicating that the host has issued a RPBS or an RSE command.

Accordingly, at time t4, the PaPRN signal is reset (e.g., transitions from notice to idle). Accordingly, the PRN 1427 and PRN #1429 also transitions from the notice state to the idle state.

In an embodiment, to make sure the PaPRN is cleared based on the read-out status bit PaRDY, the PaRDY status bit is latched to a PaPRN_OUT signal after RPBS or RSE command. The RPBS or RSE command will output the latched status bit P0PRN_OUT and the PRN register is cleared by P0PRN_OUT and RE (read enable). This can make sure that the user (i.e., the host 130) is noticed and the register is cleared.

Reset Plane Command

As previously discussed with respect to FIGS. 3D1 and 3D2, a "reset plane" command may be supported by the memory 101, where the reset plane command is to abort any AIPO being executed in the selected plane for which the reset plane command is issued. FIG. 16 illustrates a configuration (e.g., a cycle type) of a reset plane command. As illustrated in FIG. 16, the reset plane command includes one command cycle, followed by one or more (e.g., three) address cycles, where the address included in the address cycle indicates one or more addresses (e.g., row addresses) of a memory plane to be reset (also see FIG. 3D2). In an example, after the memory 101 receives this command, the memory 101 aborts any AIPO being executed in the memory plane identified by the addresses in the address cycle.

AIPO Memory Command Issued to a Memory Plane that Doesn't have an Ongoing Background Operation (Other Planes can have AIPO Background Operation)

FIGS. 17A and 17B illustrate timing diagrams 1700*a* and 1700*b*, respectively, depicting scenarios where a AIPO memory command is issued to a memory plane that does not have an ongoing background operation, while one or more other memory planes can have ongoing AIPO background operations.

In the example of FIG. 17A, a AIPO command 1704*a* for plane 102*b* is issued at time t1702*a*. Prior to time t1702*a*, PaRDY and PaARDY are busy, indicating execution of a AIPO in plane 102*a*. The AIPO command 1704*a* is issued to a non-busy plane, such as the plane 102*b*, where PbRDY="ready" at the time of issuance of the AIPO command 1704*a*. In an example, the AIPO command 1704*a* can be any appropriate AIPO command listed in previously discussed Table 2, such as a page read operation.

As previously discussed with respect to FIG. 6A, in the example of FIG. 17A, after issuance of the AIPO command 1704*a*, all planes become busy for a short period of time (e.g., between time t1702*a* and t1703*a*), which is the command pre-processing period. After the command pre-processing period, PxRDY and PxADRY for planes 102*c* and 102*d* become "ready." The memory plane 102*b* starts processing the AIPO command 1704*a* command from time t1703*a*. The plane 102*a* remains busy, due to the ongoing operation that started prior to the time 1702*a*.

In an embodiment, no new commands are allowed to be issued by the host 130 during the command pre-processing period. As discussed, after the command pre-processing period, the plane ready status signals for the non-operating planes (e.g., planes 102*c* and 102*d*) to transition to the ready state again.

FIG. 17B illustrates an alternate embodiment (e.g., which can be an alternative to the embodiment illustrated in FIG. 17A). For example, in FIG. 17A, there is the command pre-processing period, during which all planes become busy (e.g., PxRDY and PxARDY, for x=a, d) immediately after issuance of the AIPO command 1704*a*. In contrast, FIG. 17B lacks this command pre-processing period. For example, in the embodiment of FIG. 17B, only the selected plane, to which a AIPO command 1704*b* is issued at time t1702*b*, becomes busy from time t1702*b*. Other non-selected planes (e.g., planes 102*c*, 102*d*) remain ready—i.e., the PcRDY, PdRDY, PcARDY, and PdARDY status signals are not affected by the AIPO command 1704*b*, and these status signals remain available.

In an example, the embodiment of FIG. 17A is relatively easier for circuit implementation than the embodiment of FIG. 17B (e.g., as the embodiment of FIG. 17A has relatively simpler command interface). However, there may be a slight loss in performance in the embodiment of FIG. 17A, because the host 130 needs to wait during the command pre-processing period, during which the host 130 cannot issue any new commands.

Further Examples of AIPO Memory Commands

If AIPO background array operation is ongoing in a specific plane (such as a first plane, with PxRDY=ready and PxARDY=busy for the first plane), a AIPO command (such as a page read or a cache read command) can be issued to another plane (such as a second plane) that does not have any background operations (PxRDY=PxARDY=ready for the second plane).

If a AIPO background array operation is ongoing in a specific plane (such as a first plane, with PxRDY=ready and PxARDY=busy for the first plane), only selected AIPO commands (such as a cache read command) can be issued to the first plane with the background array operation. For example, referring to the Table 2 herein discussed previously, a cache read random command is a AIPO command that is allowed during background array operations (i.e., category 5 of Table 2). Accordingly, any category 5 AIPO command of Table 2 can be issued to the plane with the background array operation.

There may be other AIPO memory commands, such as page read command, or some category 4 AIPO commands (see Table 2), which cannot be issued to a plane that has ongoing AIPO background array operations. The types of commands which can be issued during AIPO background array operations can depend on particular implementations of the memory device.

No SCO command (for example, block erase command) is allowed if a AIPO background array operation is ongoing.

Figure 18A:
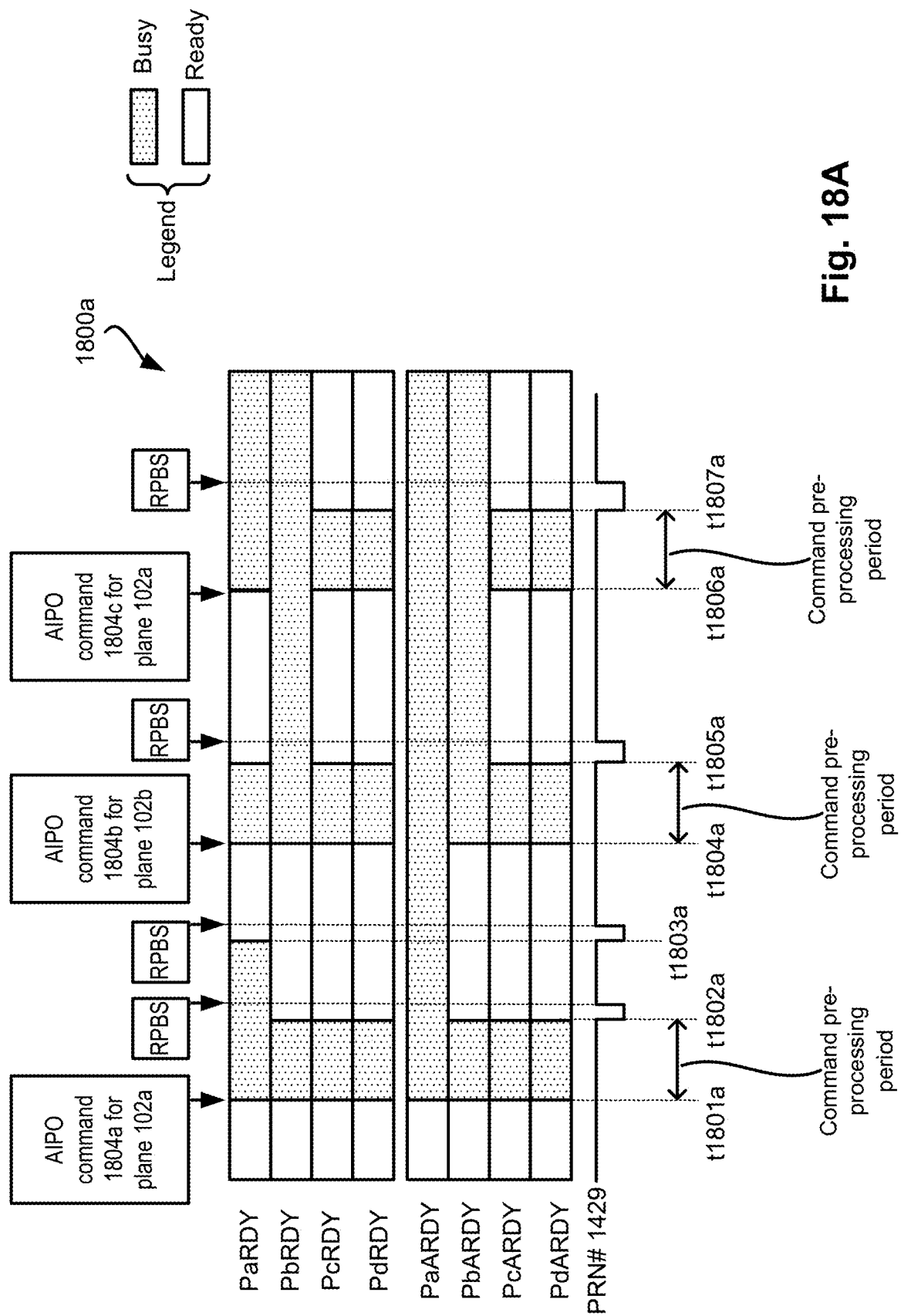
FIGS. 18A and 18B illustrate timing diagrams depicting various example scenarios for issuance of AIPO commands.
Figure 18B:
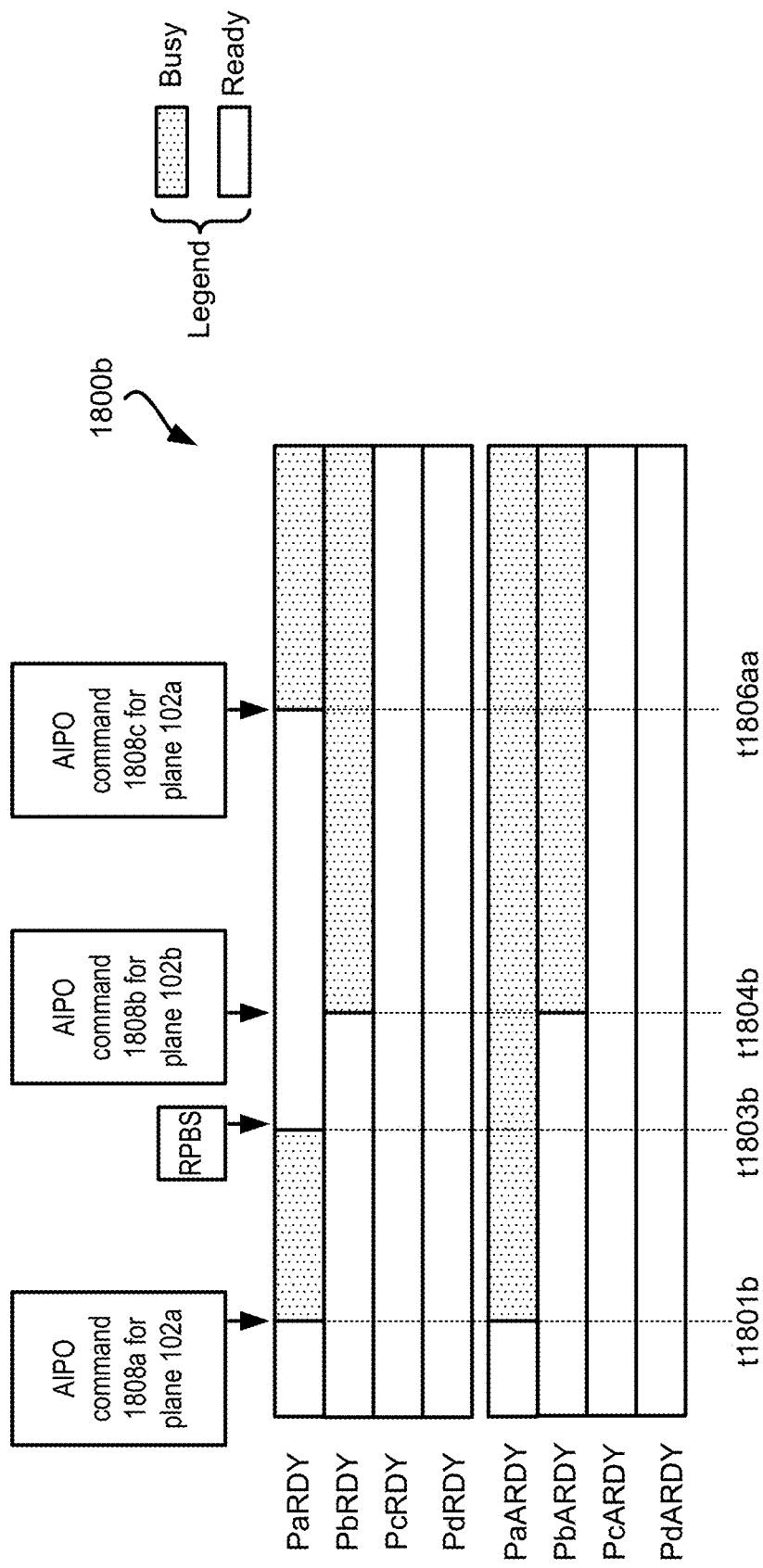

FIGS. 18A and 18B illustrate timing diagrams 1800*a* and 1800*b*, respectively, depicting various example scenarios for issuance of AIPO commands. Note that FIG. 18A illustrates scenarios in which a AIPO command is followed by a command pre-processing period, whereas FIG. 18B lacks the command pre-processing period. Also note that FIG. 18A illustrates the PRN # signal 1429 of FIG. 15, to illustrate operations of the PRN # signal 1429.

Referring to FIG. 18A, prior to time t1801*a*, none of the planes are busy (i.e., PxRDY=PxARDY=ready for all planes). At time t1801*a*, a AIPO command 1804*a* for plane 102*a* is issued. Accordingly, there is a command pre-processing period between time t1801*a* and t1802*a*, during which all planes are busy (i.e., PxRDY=PxARDY=busy for all planes).

At time 1802*a*, planes 102*b*, 102*c*, and 102*d* transition to ready, which the host 130 knows about by issuing a RPBS command, for example. For example, at time t1802*a*, the host 130 receives an indication of one or more planes transitioning to ready, via the PRN 1427 or PRN #1429 (see FIG. 14). Accordingly, after time 1802*a*, the host 130 issues a RPBS (or RSE) command to detect status of the various planes. As illustrated, the PRN #1429 is reset, based on issuance of the RPBS command, as discussed with respect to FIGS. 14 and 15.

At time t1803*a*, the plane 102*a* becomes ready (e.g., as discussed with respect to t603*a* of FIG. 6A). At time t1803*a*, the host 130 receives an indication of one or more planes being available, via the PRN 1427 or PRN #1429 (see FIG. 14). Accordingly, after time 1803*a*, the host 130 issues a RPBS (or RSE) command to detect status of the various planes, and knows that plane 102*a* is ready (i.e., PaRDY=ready). The PRN #1429 is reset to idle state, based on issuance of the RPBS.

At t1804*a*, the host 130 issues another AIPO command 1804*b* for plane 102*b*. Similar to the discussion before, there is a command pre-processing period between time t1804*a* and t1805*a*, during which all planes are busy (i.e., PxRDY=PxARDY=busy for all planes). At time 1805*a*, planes 102*a*, 102*c*, and 102*d* are ready (i.e., PaRDY=PcRDY=PdRDY=ready), although background array operation is still ongoing in plane 102*a* for executing the AIPO command 1804*a*. The host 130 issues a RPBS signal, to detect the status of various planes, as discussed.

At t1806*a*, the host 130 issues another AIPO command 1804*c* for plane 102*a*. Similar to the discussion before, there is a command pre-processing period between time t1806*a* and t1807*a*, during which all planes are busy (i.e., PxRDY=PxARDY=busy for all planes). At time 1807*a*, planes 102*c* and 102*d* are ready (i.e., PcRDY=PdRDY=ready), although operations are still ongoing in planes 102*a* and 102*b* for respectively executing the AIPO commands 1804*c* and 1804*b*.

Thus, as discussed previously, if AIPO background array operation is ongoing in a specific plane (such as a first plane, with PxRDY=ready and PxARDY=busy for the first plane), a AIPO command (such as a page read or a cache read command) can be issued to another plane (such as a second plane) that does not have any background array operations (PxRDY=PxARDY=ready for the second plane). The AIPO command 1804*b* for plane 102*b*, issued at time t1804*a*, is an example of such a AIPO command.

As also discussed previously, if a AIPO background array operation is ongoing in a specific plane (such as a first plane, with PxRDY=ready, and PxARDY=busy for the first plane), only selected AIPO commands (such as a cache read random command or another category 5 command from Table 2 discussed herein previously) can be issued to the first plane with the background array operation. For example, AIPO command 1804c for plane 102a is issued at time t1806a, while the plane 102a is still undergoing AIPO background array operations (i.e., PaRDY=ready, PaARDY=busy). Thus, the AIPO command 1804c can be a cache read random command or another category 5 command from Table 2, but cannot be a page read or another category 4 command of Table 2.

The timing diagram 1800b of FIG. 18B is in part similar to the timing diagram 1800a of FIG. 18A. The difference between these two timing diagrams is that the timing diagram 1800a of FIG. 18A includes the command pre-processing period, which the timing diagram 1800b of FIG. 18B lacks. For example, similar to FIG. 6B, the timing diagram 1800b of FIG. 18B lacks the command pre-processing period. Accordingly, the RPBSs at the end of the various command pre-processing periods, which are present in the timing diagram 1800a of FIG. 18B, are absent in the timing diagram 1800b of FIG. 18B. The timing diagram 1800b of FIG. 18B will be apparent to those skilled in the art, based on the discussion with respect to FIGS. 18A and 6B.

Further Examples of SCO Memory Commands

If no background array operation is ongoing, a SCO command (for example, a page program command or a block erase command) can be issued only when all planes are ready (i.e., PxRDY=PxARDY=ready for all planes). After the SCO command is issued, all planes will become busy (i.e., PxRDY=PxARDY=busy for all planes).

Figure 19A:
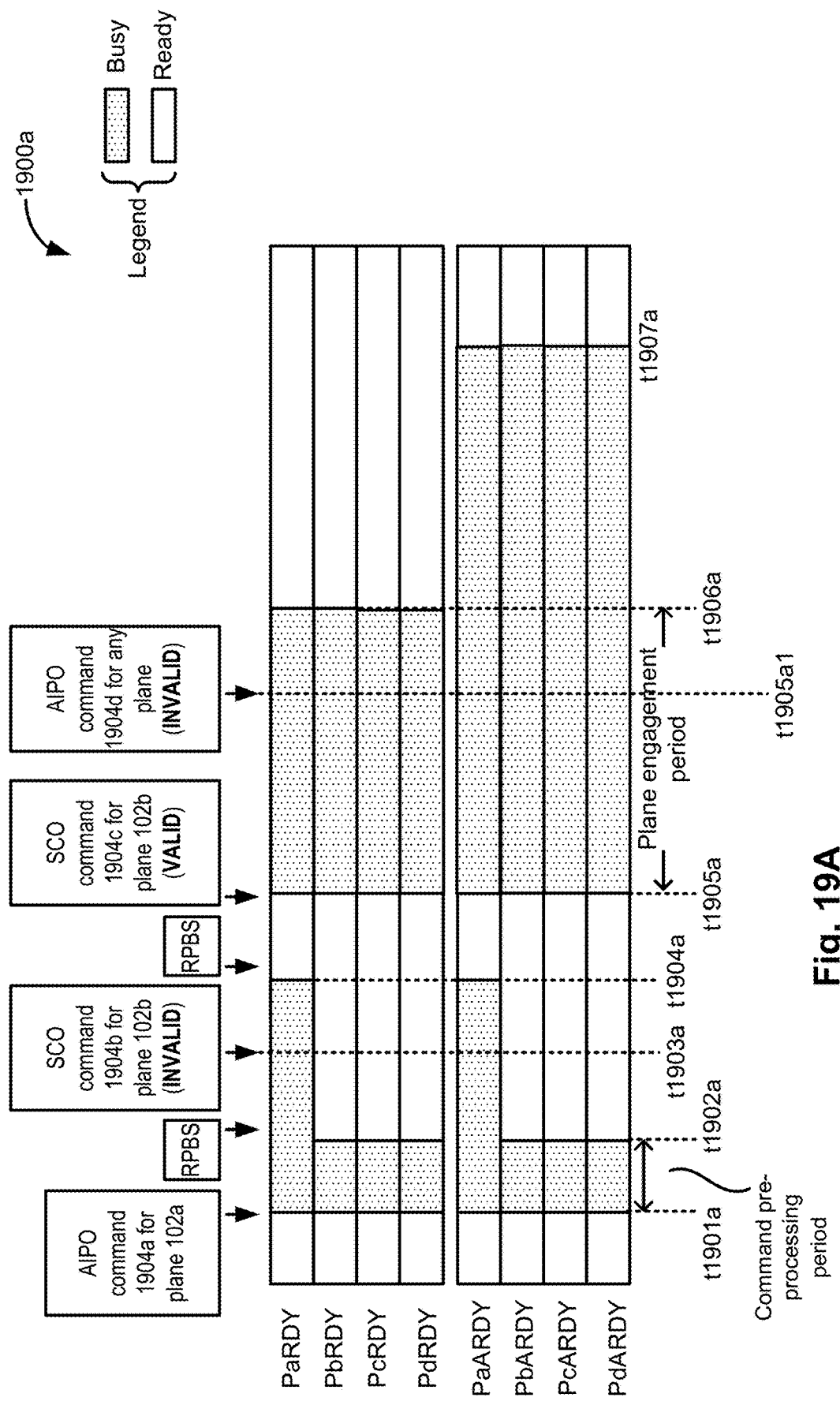
FIG. 19A illustrates a timing diagram depicting examples of SCO commands.

FIG. 19A illustrates a timing diagram 1900a depicting examples of SCO commands. At t1901a, a AIPO command 1904a for plane 102a is issued. This is followed by a command pre-processing period between time t1901a and t1902a (although in another example, such command pre-processing period may be absent, as discussed with respect to FIG. 6B), followed by an issuance of RPBS command by the host 130, as discussed with respect to FIG. 18A. Thus, after time t1902a, PaRDY=PaARDY=busy, and all other status signals are ready. At time t1904a, the execution of the AIPO command 1904a for plane 102a is completed, and both PaRDY and PaARDY become ready at time t1904a. Note that although in this example of FIG. 19A both PaRDY and PaARDY become ready at the same time, the PaARDY can become ready after PaRDY becomes ready, as seen in FIG. 6A.

As also illustrated in FIG. 19A, at time t1903a (e.g., which is between time t1902a and t1904a), a SCO command 1904b for plane 102b is issued. As not all planes are ready at time 1903a (e.g., PaRDY=busy at time t1903a), the SCO command 1904b for plane 102b is invalid, and is not executed by the memory 101.

After all planes are ready from time t1904a, another SCO command 1904c for plane 102b is issued at time t1905a. Note that at this time, all planes are ready. Accordingly, the SCO command 1904c is valid, and the SCO command 1904c is executed from time t1905a.

As discussed with respect to FIG. 7, in FIG. 19A, once the SCO command 1904c is issued, all planes will become busy (i.e., PxRDY=PxARDY=busy, for x=a, . . . , d), e.g., during the plane engagement period between time t1905a and t1906a. At t1906a (i.e., after the end of the plane engagement period), all the planes transition to ready (i.e., PxRDY=ready, for x=a, . . . , d), although SCO background array operations are ongoing in all planes (i.e., PxARDY=busy, for x=a, . . . , d). Finally, at time t1907a, the SCO background array operations are completed, and PxARDY=ready, for x=a, . . . , d.

Note that between time t1905a and t1906a, during the plane engagement period, all planes are shown to be busy (i.e., PxRDY=busy, for x=a, . . . , d), although the SCO command 1904c is for a specific plane 102b. That is, although planes 102a, 102c, 102d may not be actively involved in the SCO command 1904c, the planes 102a, 102c, 102d are still shown to be busy or in operation, to avoid any command input until the memory 101 is ready for next command. Accordingly, the time period between time t1905a and t1906a is also referred to herein as plane engagement period, when the planes are shown to be engaged, to avoid any command input until the memory 101 is ready for the next command.

Note that any AIPO (or SCO) operation issued during the plane engagement period is declared invalid. For example, in FIG. 19A, a AIPO command 1904d for a plane is issued at time t1905a1, which is during the plane engagement period. Accordingly, this command is declared invalid.

Figure 19B:
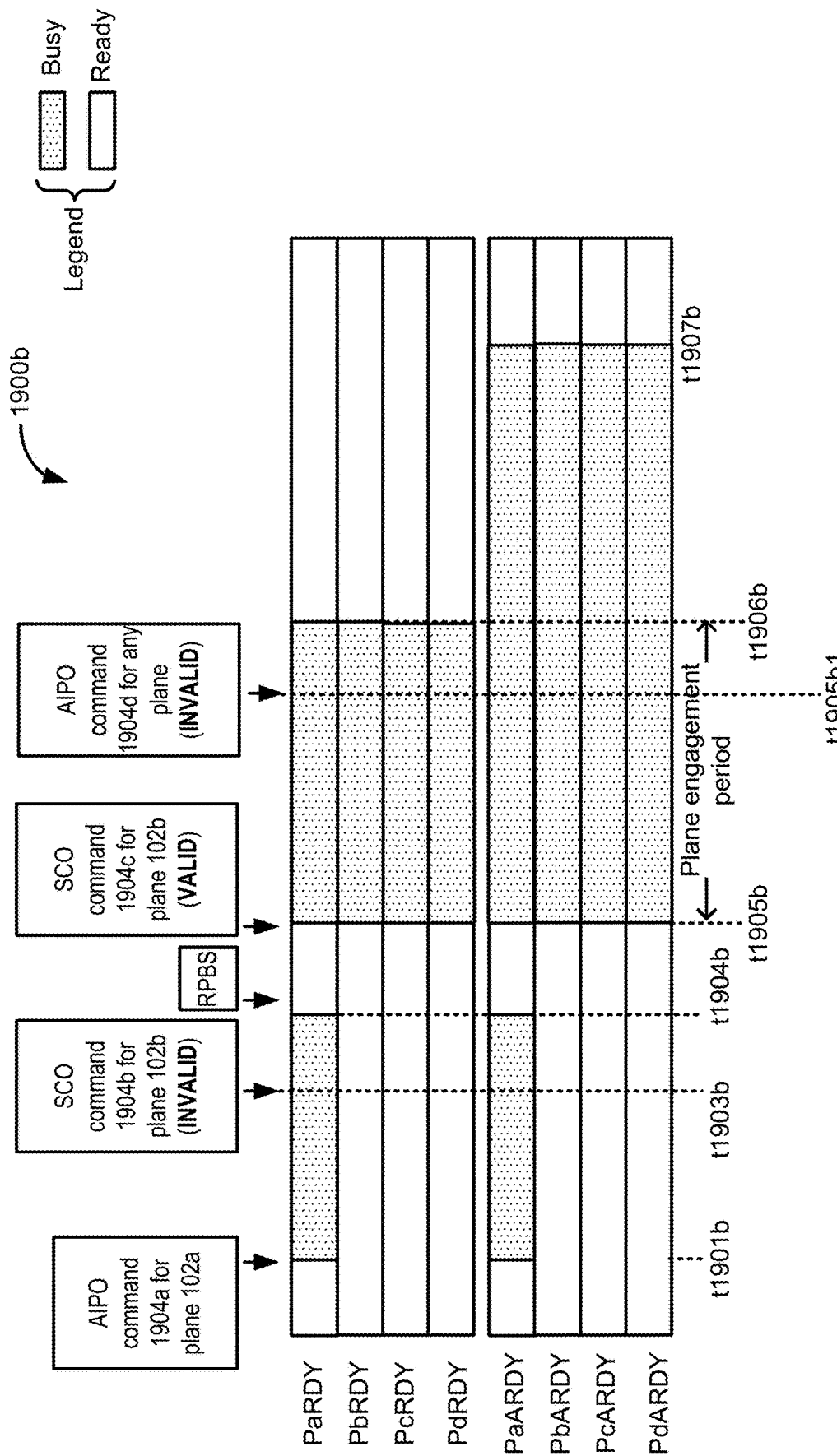
FIG. 19B illustrates another timing diagram depicting examples of SCO commands.

FIG. 19B illustrates another timing diagram 1900b depicting examples of SCO commands.

The timing diagram 1900b of FIG. 19B is in part similar to the timing diagram 1900a of FIG. 19A. The difference between these two timing-diagrams is that the timing diagram 1900a of FIG. 19A includes the command pre-processing period, which the timing diagram 1900b of FIG. 19B lacks. For example, similar to FIG. 6B, the timing diagram 1900b of FIG. 19B lacks the command pre-processing period. Accordingly, the RPBSs at the end of the various command pre-processing periods, which are present in the timing diagram 1900a of FIG. 19B, are also absent in the timing diagram 1900b of FIG. 19B. The timing diagram 1900b of FIG. 19B will be apparent to those skilled in the art, based on the discussion with respect to FIGS. 19A and 6B.

FIG. 20 illustrates a timing diagram 2000 that depicts further examples of SCO commands, and also illustrates that some AIPO memory commands may not be issued when the planes execute SCO background array operations. In the timing diagram 2000, a SCO command 2004a for plane 102a is issued at time t2001, due to which all planes become busy during the previously discussed plane engagement period, which occurs between time t2001 and t2002. At time t2002, PxRDY transitions to ready for x=a, . . . , d, i.e., all planes become ready, and PRN #1429 issues a notice. Accordingly, an RPBS is issued, and PRN #1429 is reset. Note that SCO background array operations are still ongoing after time t2002, and accordingly, PxARDY=busy for x=a, . . . , d.

At time t2003 (e.g., when SCO background array operations are still ongoing), a AIPO command 2004b for plane 102b is issued. It may be noted that if SCO background array operations are ongoing, the memory 101 may not be able to execute a AIPO memory command, such as a page read command. Accordingly, the AIPO command 2004b for plane 102b is invalid.

However, if SCO background array operations are ongoing, the memory 101 may be able to execute selected SCO memory commands, such as a cache program command or another category 2 SCO command of Table 2 discussed herein previously. Note that a category 1 SCO command may not be validly received and executed, if SCO background array operations are ongoing.

For example, at time t2004 (e.g., when SCO background array operations are still ongoing), a SCO command 2004c for plane 102b (such as a cache program command or another category 2 SCO command of Table 2) is issued. This command is valid, and is executed by the memory 101. For example, all planes become busy during a corresponding plane engagement period that commences from time t2004. The portion of the timing diagram after time t2004 is similar to that discussed with respect to FIG. 19B, and hence, is not discussed in further detail.

Figure 21A:
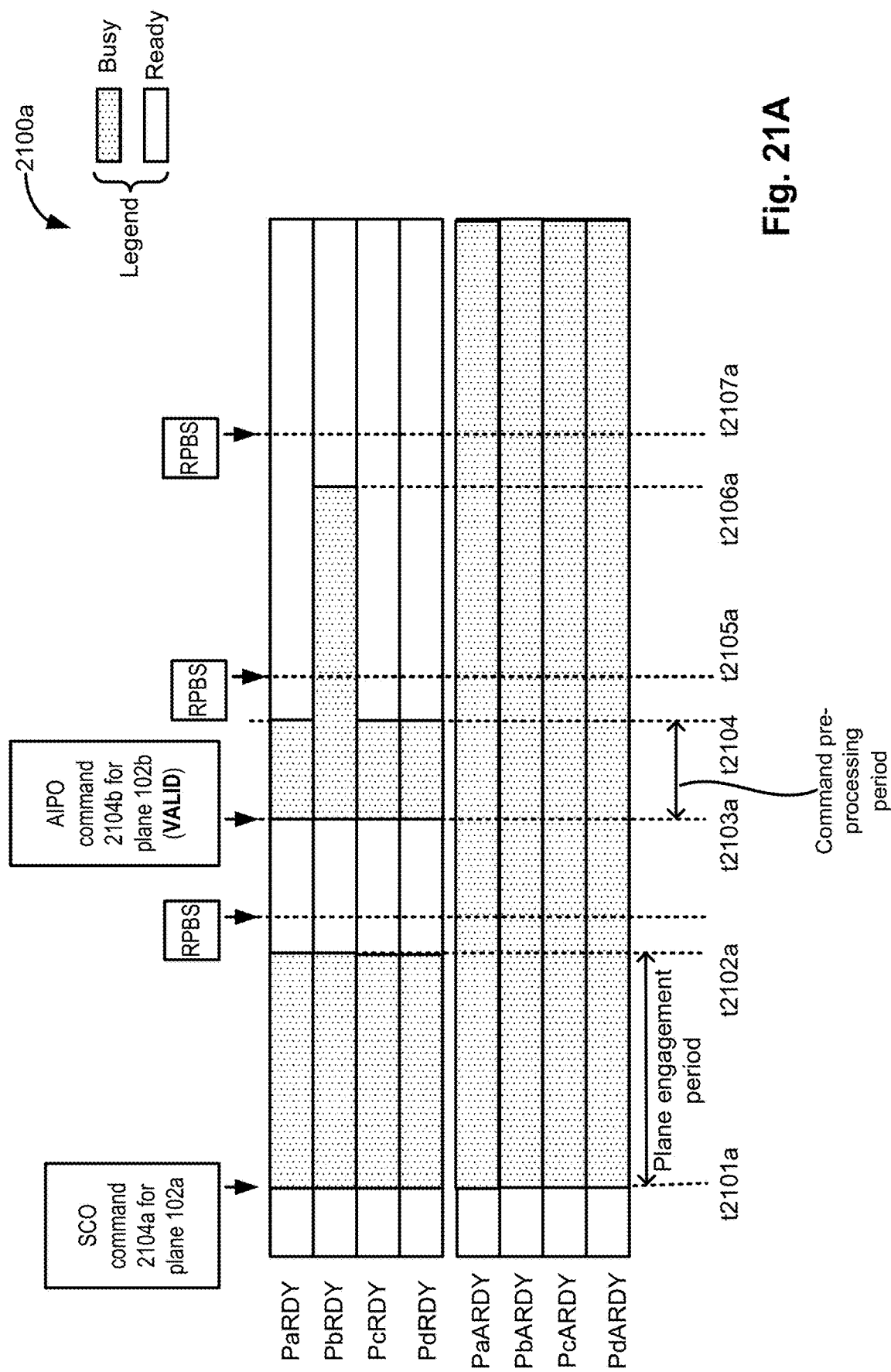
FIGS. 21A and 21B illustrate timing diagrams, which depict further examples of SCO commands, and also depict that some AIPO memory commands may be issued and executed simultaneously with the planes executing SCO background array operations.
Figure 21B:
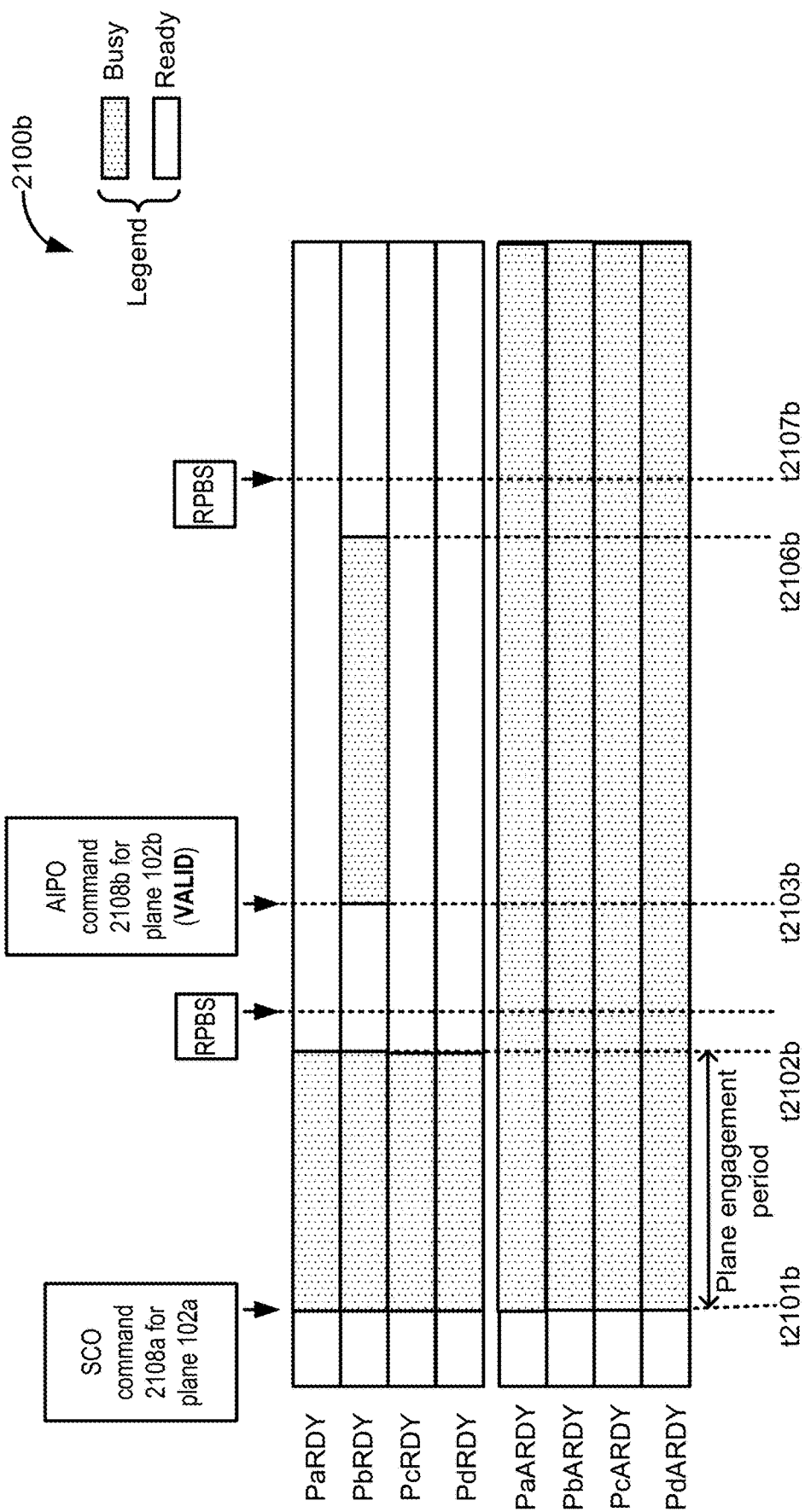

FIGS. 21A and 21B illustrate timing diagrams 2100a and 2100b, which depict further examples of SCO commands, and also depict that some AIPO memory commands which may be issued and executed simultaneously with the planes executing SCO background array operations.

Note that FIGS. 21A and 21B illustrate a scenario that is contrary to that of FIG. 20. For example, in FIG. 20, a AIPO command 2004b is not allowed when the planes are executing SCO background array operations. In contrast, in FIGS. 21A and 21B, a AIPO command 2104b is allowed when the planes are executing SCO background array operations.

For example, a circuit within the memory 101 implementing the scenario of FIG. 20 may be different from a circuit within the memory 101 implementing the scenario of FIGS. 21A and 21B. Thus, whether a AIPO memory command is allowed, when the planes are executing SCO background array operations, is implementation specific—based on the design of the memory 101, the memory 101 may support selective allowance (or denial) of a AIPO memory command, when the planes are executing SCO background array operations.

In another example, the AIPO command 2004b of FIG. 20 is different from the AIPO command 2104 of FIG. 21A. Accordingly, the AIPO command 2104b (e.g., a category 4 command of Table 2) of FIG. 21A is allowed, while the AIPO command 2004b (e.g., a category 5 command of Table 2) of FIG. 20 is denied.

In the timing diagram 2100a, a SCO command 2104a for plane 102a is issued at time t2101a, due to which all planes become busy during the previously discussed plane engagement period, which occurs between time t2101a and t2102a. At time t2102a, PxRDY transitions to ready for x=a, . . . , d, i.e., all planes become ready, and PRN #1429 issues a notice. Accordingly, an RPBS is issued, and PRN #1429 is reset. Note that SCO background array operations are still ongoing after time t2102a, and accordingly, PxARDY=busy for x=a, . . . , d.

At time t2103a (e.g., when SCO background array operations are still ongoing), a AIPO command 2104b for plane 102b is issued. In the example of FIG. 21A (and contrary to the discussion with respect to FIG. 20), if SCO background array operations are ongoing, the memory 101 may be able to execute a AIPO memory command, such as a page read command. Accordingly, the AIPO command 2104b for plane 102b is allowed.

Accordingly, from time 2103a, all planes become busy during the command pre-processing period, till time t2104a, after which the planes 102a, 102c, 102d become available. Note that SCO background array operations are ongoing in all the planes, e.g., to execute the SCO command 2104a for plane 102a. The plane 102b is ready (e.g., PbRDY) at time t2106a, e.g., as discussed with respect to time t603a of FIG. 6A. Note that SCO background array operations may be still ongoing in all the planes after time t2106a.

The timing diagram 2100b of FIG. 21B is in part similar to the timing diagram 2100a of FIG. 21A. The difference between these two timing-diagrams is that the timing diagram 2100a of FIG. 21A includes the command pre-processing period, which the timing diagram 2100b of FIG. 21B lacks. For example, similar to FIG. 6B, the timing diagram 2100b of FIG. 21B lacks the command pre-processing period. Accordingly, the RPBSs at the end of the command pre-processing period, which is present in the timing diagram 2100a of FIG. 21B, is absent in the timing diagram 2100b of FIG. 21B. The timing diagram 2100b of FIG. 21B will be apparent to those skilled in the art, based on the discussion with respect to FIGS. 21A and 6B.

FIGS. 22A to 22H illustrate example timing diagrams of plane ready signals PxRDY for planes P0 to P3, and array ready signals PxARDY for planes P0 to P3, in response to receiving respective categories of commands that can be implemented in various embodiments. Note that in the timing diagrams of FIG. 22A to 22H, as with previous figures, a dotted rectangle corresponds to an associated signal being busy, and a non-shaded rectangle corresponds to an associated signal being ready (i.e., not busy), as illustrated in the "Legend" section of FIG. 6A.

FIG. 22A shows the timing of the status signals for an SCO command without the cache operation, like category 1 in Table 2. At the time the SCO command for plane P0 is received, all of the status signals are in a ready state. During execution of the command, all the status signals are in the busy state until the command is complete. Both the plane ready and array ready signals for all of the planes are in the busy state during an operation period.

FIG. 22B shows the timing of the status signals for an SCO command with a cache operation, like category 2 in Table 2, having two operation periods. At the time the SCO command for plane P0 is received, all the status signals are in a ready state. After receipt of the command, the plane ready signals for all of the planes transition to a busy state during a cache busy period and transition to the ready state at the end of the cache busy period. The array ready signals remain in a busy state during a longer interval beyond the end of the cache busy period, during a background array operation period.

FIG. 22C shows the timing of the status signals for an AIPO command without a cache operation, like category 4 of Table 2, having two operation phases. At the time the AIPO command for plane P0 is received, all the status signals are in a ready state. After receipt of the command, the plane ready signals for all the planes transition to the busy state. Also, after receipt of the command, the array ready signals for all the planes transition to the busy state. At the end of a command processing interval, the plane ready and array ready signals for the unselected planes transition to the ready state. The plane ready and array ready signals for the selected plane P0 remain busy during the operation interval.

FIG. 22D shows the timing of the status signals for an AIPO command with a cache operation, like Category 5 of Table 2, having three operation phases, including command processing phase in which all plane ready and array ready signals are busy, data transfer phase in which for the unselected planes, the plane ready and array ready signals are ready, and the plane ready and array ready signals for the selected plane remain busy, and array read/write phase in which the plane ready signal for the selected plane transitions to ready and the array ready signal for the selected plane remains busy until completion. At the time the AIPO command for plane P0 is received, all the status signals are in a ready state. After receipt of the command, the plane ready signals for all the planes transition to the busy state. Also, after receipt of the command, the array ready signals for all the planes transition to the busy state. At the end of the cache operation interval, the plane ready signal for the selected plane P0 transitions to the ready state. However, the array ready signal for the selected plane remains busy for a longer operation interval. The plane ready signals for the unselected planes and the array ready signals for the unselected planes transition to the ready state at the end of a command processing interval.

The operations sequences for different commands can be different. For example, for an example Page Read command: Phase 1: command processing; Phase 2: Array Read operation; and Phase 3: Data Transfer from page buffer to cache. For an example Cache Read command: Phase 1: command processing; Phase 2: Data Transfer from page buffer to cache; and Phase 3: Array Read operation. However, the operation sequences for an example Page Program command and Cache Program command can be the same: Phase 1: command processing; Phase 2: Data Transfer from cache to page buffer; and Phase 3: Array Write operation.

FIG. 22E shows the timing of the status signals for an AIPO command sequence supporting multiple overlapping plane operations. For example, for a memory device having multiple planes which supports the multi-plane read with a cache operation, a sequence of commands can be received, including a first command for plane P0 and a second command for plane P1 as illustrated. In some embodiments, there can be a sequence of multiplane commands received addressed to all of the planes or any subset of the planes in the memory. For example, multiplane commands can have a form as specified by the Open NAND Flash Interface ONFI standard (Revision 5.0, 25 May 2021, which is incorporated by reference as if fully set forth herein), like the following:

MP command set 1: 00 h—ADDR—32 h
MP command set 2: 00 h—ADDR—30 h/31 h

In the illustrated embodiment, at the time of receipt of the first command, all of the plane ready and array ready signals are in a ready state. Upon receipt of the command, a command processing interval is begun in which all of the plane ready and array ready signals transition to a busy state. At the end of the command processing interval, the array ready and plane ready signals for the unselected planes transition to the ready state, while the selected plane array ready and plane ready signals remain in a busy state. At the time of receipt of the second command addressed to plane P1, the array ready and plane ready signals for planes P1 through P3 are in a ready state, and for plane P0 are in a busy state. At the time of receipt of the second command, the plane ready and array ready signals for planes P1 through P3 transition to a busy state for a command processing interval. At the end of the command processing interval, the array ready and plane ready signals for planes P2 and P3 transition to a ready state, while the array ready and plane ready signals for plane P1 remain in the busy state during operation. At the end of the operation in plane P0, the plane ready and array ready signals for plane P0 transition to a ready state. At the end of the operation for plane P1, the plane ready and array ready signals for plane P1 transition to a ready state.

FIG. 22F illustrates the case of an AIPO command sequence for multiple planes which can be issued during a background array operation phase of other planes. Thus, FIG. 22F is like FIG. 22E, except that at the time of receipt of the first command for plane P0 and at the time of receipt of the second command for plane P1, the array ready signal for plane P2 is in the busy state.

FIG. 22G illustrates the case of an AIPO command sequence for multiple planes in which the multiple plane operations are initiated concurrently. After receipt of the first command for plane P0, all of the array ready and plane ready signals transition to the busy state for a command processing interval, and all array ready and plane ready signals, including for plane P0, then transition to the ready state. At the time of receipt of the second command for plane P1, all of the array ready and plane ready signals are in the ready state, and transition to the busy state during the command processing interval. At the end of the command processing interval, the read operations in planes P0 and P1 begin execution and are executed concurrently. Thus, the plane ready and array ready signals for plane P0 return to the ready state at completion of the operation and plane P0, and the plane ready and array ready signals for plane P1 return to the ready state at the end of the operation in claim P1.

FIG. 22H illustrates the case of concurrent operations of in AIPO command sequence for multiple planes which can be issued during a background array operation phase of other planes. Thus, FIG. 22H is like FIG. 22G, except that at the time of receipt of the first command for plane P0 and at the time of receipt of the second command for plane P1, the array ready signal for plane P2 is in a busy state.

FIG. 23 illustrates an example in which a second SCO command is issued during operation of a first SCO command. After the cache SCO command 1 is issued, the chip becomes busy (all PxRDY=0) only for the phase 1, then it returns to ready (all PxRDY=1) after the phase 1 is done. The new SCO command 2 can be issued even though the phase 2 for previous command is still progressing. However, the 2nd SCO operation is not started unless the 1st command operation finishes, therefore, it still meets the SCO criterion.

FIG. 24 illustrates another example, in which an AIPO command can be issued that suspends an operation of a previous SCO command. After the cache SCO command 1 is issued, the chip becomes busy (all PxRDY=0) only for the phase 1, then it returns to ready (all PxRDY=1) after the phase 1 is done. The new AIPO command 2 can be issued even though the phase 2 for previous command is still progressing. In this case, the previous operation is suspended to execute the new command and automatically resume the old operation after the new operation is finished. This can be special case applied when one command has higher priority than another command.

A variety of example configurations are described herein that can be supported by embodiments of plane ready/array ready signals. One example can be characterized as follows:

1. If there are no background operations (PxRDY=PxARDY=1).
   i. If the selected plane is ready (PxRDY=PxARDY=1), a AIPO command (including cache & non-cache AIPO commands) can be issued for the selected plane.
   ii. If all planes are ready (PxRDY=PxARDY=1), a SCO command (including cache & non-cache SCO commands) can be issued.
2. If there are background array operation (PxRDY=1 & PxARDY=0).
   i. If the background array operation is cache AIPO operation for the selected plane, a selected AIPO command can be issued for the selected plane.
   ii. If the background array operation is cache AIPO operation for the non-selected plane, a AIPO command (including cache & non-cache AIPO commands) can be issued for the selected plane.
   iii. If the background array operation is cache SCO operation, a selected SCO and AIPO command can be issued.

iv. Please note that the selected commands mentioned here is not just cache (SCO/AIPO) commands, it may also include the non-cache (SCO/AIPO) commands.

3. If the selected plane is busy (PxRDY=PxARDY=0), no AIPO or SCO command can be issued to the selected plane.

Thus, in some configurations, cache and non-cache commands can be issued when no background operation is on-going (PxRDY=PxARDY=1).

Also, selected commands can be issued during background array operations (PxRDY=1 & PxARDY=0), including commands that are not cache commands.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
a plurality of memory planes, each memory plane including (i) at least one corresponding memory array and (ii) one or more peripheral circuits dedicated to read and write operations associated with the at least one corresponding memory array and the corresponding memory plane;
an input/output (I/O) interface to receive memory commands and data from a host, and to output data to the host; and
one or more storage units configured to store, for each memory plane of the plurality of memory planes, (i) a corresponding plane ready (PRDY) signal indicating a busy or a ready state of the corresponding memory plane, and (ii) a corresponding plane array ready (PARDY) signal indicating a busy or a ready state of the corresponding memory array of the corresponding memory plane, such that a plurality of PRDY signals and a plurality of PARDY signals are stored corresponding to the plurality of memory planes,
wherein the memory is configured to execute (i) a first type of operation that engages multiple memory planes of the memory during at least a part of execution of the first type of operation, and (ii) a second type of operation that engages one memory plane, and not all of the plurality of memory planes, during at least a part of execution of the second type of operation, and
wherein
the first type of operation engages the memory arrays of the plurality of memory planes during at least the part of execution, such that the plurality of PARDY signals for the plurality of memory planes are simultaneously in the busy state, and
the second type of operation engages a memory array of one memory plane, and not all of the plurality of memory planes, during at least a part of execution, such that a PARDY signal of the one memory plane is in the busy state simultaneously with PARDY signals corresponding to memory planes without an ongoing operation in progress not being in the busy state.

2. The memory of claim 1, further comprising:
a ready notice pin; and
a circuit to transition the ready notice pin from an idle state to a notice state, to provide an indication of a change from the busy state to the ready state as indicated by at least one PRDY signal of the plurality of PRDY signals.

3. The memory of claim 2, wherein:
the circuit is to further transition the ready notice pin from the notice state to the idle state, in response to the memory providing at least some of the contents of the one or more storage units to the host, the at least some of the contents of the one or more storage units identifying the at least one PRDY signal that changed from indicating the busy state to indicating the ready state.

4. The memory of claim 3, wherein:
the memory can receive a status read command from the host after a transition of the ready notice pin from the idle state to the notice state;
the memory is configured to provide the at least some of the contents of the one or more storage units to the host, in response to receiving the status read command; and
the circuit is configured to transition the ready notice pin from the notice state to the idle state, in response to providing the at least some of the contents of the one or more storage units to the host.

5. The memory of claim 1, wherein:
the memory is configured to execute an operation that engages multiple memory planes of the memory during at least a part of execution of the operation;
during a first phase of execution of the operation, the plurality of PRDY signals and the plurality of PARDY signals corresponding to the plurality of memory planes are set to indicate the busy state; and
during a second background array operation phase of execution of the operation, the plurality of PARDY signals are set to indicate the busy state and the plurality of PRDY signals to indicate the ready state.

6. The memory of claim 1, wherein:
the memory is configured to execute an operation directed to a first memory plane that engages the first memory plane, and not all of the plurality of memory planes, during at least a part of execution of the operation, and
during a first phase of execution of the operation, the plurality of PRDY signals and the plurality of PARDY signals corresponding to the plurality of memory planes are set to indicate the busy state; and
during a second phase of execution of the operation, a first of the plurality of PRDY signals and a first of the plurality of PARDY signals corresponding to the first memory plane are set to indicate the busy state, and other PRDY signals of the plurality of PRDY signals and other PARDY signals of the plurality of PARDY signals corresponding to memory planes without an ongoing operation in progress are set to indicate the ready state.

7. A method of operating a memory comprising a plurality of memory planes, each memory plane comprising (i) at least one corresponding memory array and (ii) one or more peripheral circuits configured to support operations of the corresponding memory array and the corresponding memory plane, the method comprising:
generating, for each memory plane of the plurality of memory planes, (i) a corresponding plane ready (PRDY) signal indicating a busy or a ready state of the corresponding memory plane, and (ii) a corresponding plane array ready (PARDY) signal indicating a busy or a ready state of the corresponding memory array of the corresponding memory plane, such that a plurality of PRDY signals and a plurality of PARDY signals are generated corresponding to the plurality of memory planes;

executing, in the memory, a first type of operation that engages multiple memory arrays of the plurality of memory planes during at least a part of execution of the first type of operation, and a second type of operation that engages a memory array of one memory plane, and not all of the plurality of memory planes, during at least a part of execution of the second type of operation; and wherein the first type of operation engages the memory arrays of the plurality of memory planes during at least the part of execution, such that the plurality of PARDY signals for the plurality of memory planes are simultaneously in the busy state, and the second type of operation engages a memory array of one memory plane, and not all of the plurality of memory planes, during at least a part of execution, such that a PARDY signal of the one memory plane is in the busy state simultaneously with PARDY signals corresponding to memory planes without an ongoing operation in progress not being in the busy state.

8. The method of claim 7, further comprising:
selectively allowing or denying execution of a memory command for a memory plane of the plurality of memory planes, based on one or more of the plurality of PRDY signals and the plurality of PARDY signals.

9. The memory of claim 1, wherein the execution of the first type of operation is dependent on status of the multiple memory planes.

10. The method of claim 7, further comprising:
(i) during a plane engagement phase of execution of the first type of operation, generating the plurality of PRDY signals and the plurality of PARDY signals corresponding to the plurality of memory planes to indicate the busy state; and
(ii) during a background array operation phase of execution of the first type of operation, generating the plurality of PARDY signals to indicate the busy state and the plurality of PRDY signals to indicate the ready state.

11. The method of claim 10, wherein a first PRDY signal and a first PARDY signal are associated with a first memory plane of the plurality of memory planes, and wherein executing a second type of operation that engages the memory array of one memory plane, and not all of the plurality of memory planes, during at least a part of execution, comprises:

during a first phase of execution of the second type of operation, generating the plurality of PRDY signals and the plurality of PARDY signals corresponding to the plurality of memory planes to indicate the busy state; and during a second phase of execution of the second type of operation, generating (i) the first PRDY signal and the first PARDY signal to indicate the busy state, (ii) other PRDY signals of the plurality of PRDY signals and other PARDY signals of the plurality of PARDY signals corresponding to memory planes without an ongoing operation in progress to indicate the ready state.

12. The method of claim 10, wherein a first PRDY signal and a first PARDY signal are associated with a first memory plane of the plurality of memory planes, and wherein executing a second type of operation directed to the first memory plane comprises:

during execution of the second type of operation, simultaneously generating (i) the first PRDY signal and the first PARDY signal to indicate the busy state, (ii) at least a second PRDY signal and a third PRDY signal respectively corresponding to a second memory plane and a third memory plane to indicate the ready state, and (iii) at least a second PARDY signal and a third PARDY signal respectively corresponding to the second memory plane and the third memory plane to indicate the ready state.

13. The method of claim 7, further comprising:
while the memory is executing a first type of memory command to engage multiple planes simultaneously, receiving, by the memory, a second type of memory command; and
denying execution of the second type of memory command, in response to receiving the second type of memory command during execution of the first type of memory command.

14. The method of claim 7, further comprising:
generating a plane ready notice signal; and
transitioning the plane ready notice signal to a notice state, in response to a transition of one or more PRDY signals of the plurality of PRDY signals from indicating the busy state to indicating the ready state.

15. The method of claim 14, further comprising:
resetting the plane ready notice signal to an idle state, in response to notifying, by the memory to a host, about the transition of the one or more PRDY signals from indicating the busy state to indicating the ready state; and
supplying the plane ready notice signal to a dedicated hardware pin that is accessible to the host.

16. The method of claim 7, wherein the executing of the first type of operation is dependent on status of the multiple memory arrays.

17. The method of claim 7, wherein each of a Triple Level Cell (TLC) read operation and a Single Level Cell (SLC) read operation are performable at least partially overlapping in time in respective planes of the plurality of memory planes.

18. A method of operating a memory comprising a plurality of memory planes, each memory plane comprising at least one corresponding memory array, the method comprising:

generating, for each memory plane of the plurality of memory planes, (i) a corresponding plane ready (PRDY) signal, and (ii) a corresponding plane array ready (PARDY) signal; and executing, in the memory, (i) a Synchronous chip operation (SCO) memory command that sets a plurality of PARDY signals associated with the plurality of memory planes to indicate a busy status, during a SCO background array operation phase of execution of the SCO memory command, and (ii) an asynchronous independent plane operation (AIPO) memory command that sets at most one PARDY signal associated with a corresponding memory plane of the plurality of memory planes to a busy status, during a AIPO background array operation phase of execution of the AIPO memory command.

19. The method of claim 18, further comprising:
denying execution of a new memory command directed to a first memory plane of the plurality of memory planes, when a corresponding PRDY signal of the first memory plane is in a busy state.

20. The method of claim 18, further comprising:
- generating a read plane status signal that includes (i) a ready or busy state status of each of a plurality of PRDY signals corresponding to the plurality of memory planes, and (ii) a ready or busy state status of each of the plurality of PARDY signals corresponding to the plurality of memory planes; and
- generating a plane ready notice signal, such that:
  - the plane ready notice signal transitions to a notice state, in response to a transition of one or more PRDY signals of the plurality of PRDY signals from indicating the busy state to indicating the ready state; and
  - the plane ready notice signal transitions to an idle state, in response to generation of the read plane status signal.

\* \* \* \* \*